(12) United States Patent
Jeon et al.

(10) Patent No.: US 10,930,832 B2
(45) Date of Patent: Feb. 23, 2021

(54) METHOD FOR MANUFACTURING SEMICONDUCTOR LIGHT EMITTING DEVICE

(71) Applicant: SEMICON LIGHT CO., LTD., Gyeonggi-do (KR)

(72) Inventors: Soo Kun Jeon, Gyeonggi-do (KR); Seung Ho Baek, Gyeonggi-do (KR); Da Rae Lee, Gyeonggi-do (KR); Bong Hwan Kim, Gyeonggi-do (KR); Dong So Jung, Gyeonggi-do (KR)

(73) Assignee: SEMICON LIGHT CO., LTD., Gyeonggi-do (KR)

( * ) Notice: Subject to any disclaimer, the term of this patent is extended or adjusted under 35 U.S.C. 154(b) by 0 days.

(21) Appl. No.: 16/519,546

(22) Filed: Jul. 23, 2019

(65) Prior Publication Data
US 2019/0378965 A1   Dec. 12, 2019

Related U.S. Application Data

(62) Division of application No. 15/510,585, filed as application No. PCT/KR2015/009619 on Sep. 14, 2015, now Pat. No. 10,411,176.

(30) Foreign Application Priority Data

Sep. 12, 2014  (KR) .................. 10-2014-0121190
Sep. 12, 2014  (KR) .................. 10-2014-0121191
(Continued)

(51) Int. Cl.
*H01L 33/62*   (2010.01)
*H01L 33/00*   (2010.01)
(Continued)

(52) U.S. Cl.
CPC ........ *H01L 33/62* (2013.01); *H01L 21/67144* (2013.01); *H01L 21/67271* (2013.01);
(Continued)

(58) Field of Classification Search
CPC ... H01L 33/62; H01L 33/52; H01L 21/67144; H01L 21/67271; H01L 21/682;
(Continued)

(56) References Cited

U.S. PATENT DOCUMENTS 6,599,768 B1 *   7/2003   Chen ...................... H01L 24/97
                                                        362/249.01
7,859,002 B2   12/2010   Nagai et al.
(Continued)

FOREIGN PATENT DOCUMENTS

JP   2012-119673 A   6/2012
JP   2012-256769 A   12/2012
(Continued)

OTHER PUBLICATIONS

International Search Report (ISR) from corresponding PCT Application No. PCT/KR2015/009619, dated Dec. 23, 2015.
(Continued)

*Primary Examiner* — Marcos D. Pizarro
*Assistant Examiner* — Antonio B Crite
(74) *Attorney, Agent, or Firm* — Harness, Dickey & Pierce, P.L.C.

(57) ABSTRACT

Disclosed is a method for manufacturing a semiconductor light emitting device, the method including: providing a mask having a plurality of openings on a base; placing semiconductor light emitting chips on exposed portions of the base through the openings, respectively, by a device carrier which recognizes a shape of the mask and calibrates
(Continued)

US 10,930,832 B2
Page 2 position for a semiconductor light emitting chip to be seated; and supplying an encapsulant to each of the openings, with the mask serving as a dam.

9 Claims, 53 Drawing Sheets

(30) Foreign Application Priority Data

| Sep. 12, 2014 | (KR) | 10-2014-0121193 |
| Sep. 25, 2014 | (KR) | 10-2014-0128478 |
| Sep. 25, 2014 | (KR) | 10-2014-0128481 |
| Oct. 23, 2014 | (KR) | 10-2014-0144087 |
| Oct. 23, 2014 | (KR) | 10-2014-0144088 |

(51) Int. Cl.
| H01L 33/50 | (2010.01) |
| H01L 33/48 | (2010.01) |
| H01L 33/52 | (2010.01) |
| H01L 23/00 | (2006.01) |
| H01L 21/66 | (2006.01) |
| H01L 21/67 | (2006.01) |
| H01L 21/68 | (2006.01) |
| H01L 33/54 | (2010.01) |
| H01L 33/60 | (2010.01) |
| H01L 33/20 | (2010.01) |

(52) U.S. Cl.
CPC ............ *H01L 22/12* (2013.01); *H01L 24/19* (2013.01); *H01L 24/96* (2013.01); *H01L 33/0095* (2013.01); *H01L 33/505* (2013.01); *H01L 33/54* (2013.01); *H01L 33/60* (2013.01); *H01L 33/20* (2013.01); *H01L 2933/005* (2013.01); *H01L 2933/0041* (2013.01); *H01L 2933/0066* (2013.01)

(58) Field of Classification Search
CPC . H01L 2933/0066; H01L 24/19; H01L 24/96; H01L 25/0753; H01L 33/60; H01L 33/58; H01L 33/505; H01L 33/54
See application file for complete search history.

(56) References Cited

U.S. PATENT DOCUMENTS

| 10,411,176 | B2* | 9/2019 | Jeon | H01L 22/12 |
| 2009/0091048 | A1 | 4/2009 | Kawakubo | |
| 2011/0053295 | A1 | 3/2011 | Yoon et al. | |
| 2011/0140590 | A1* | 6/2011 | Nakamura | H01L 33/60 |
| | | | | 313/113 |
| 2012/0062809 | A1 | 3/2012 | Kokubo et al. | |
| 2012/0142124 | A1 | 6/2012 | Yoo et al. | |
| 2012/0302124 | A1 | 11/2012 | Imazu | |
| 2014/0084188 | A1 | 3/2014 | Huang et al. | |
| 2014/0212995 | A1 | 7/2014 | Yoon et al. | |
| 2014/0239331 | A1* | 8/2014 | Oyu | H01L 24/75 |
| | | | | 257/98 |
| 2015/0332938 | A1* | 11/2015 | Palm | H01L 21/561 |
| | | | | 257/723 |
| 2016/0013373 | A1* | 1/2016 | Bhat | H01L 33/60 |
| | | | | 257/98 |

FOREIGN PATENT DOCUMENTS

| KR | 10-2009-0122611 A | 12/2009 |
| KR | 10-2010-0080423 A | 7/2010 |
| KR | 10-2011-0070517 A | 6/2011 |
| KR | 10-2011-0084294 A | 7/2011 |
| KR | 10-2011-0084695 A | 7/2011 |
| KR | 10-2012-0038723 A | 4/2012 |
| KR | 10-2012-0102352 A | 9/2012 |
| KR | 10-2012-0109201 A | 10/2012 |
| KR | 10-2013-0088371 A | 8/2013 |
| KR | 10-2013-0100528 A | 9/2013 |
| KR | 10-2014-0016516 A | 2/2014 |
| KR | 10-1364247 B1 | 2/2014 |
| WO | WO-2011/093454 A1 | 8/2011 |

OTHER PUBLICATIONS

Office Action (Non-Final) from corresponding U.S. Appl. No. 15/510,585, dated Nov. 1, 2018.

* cited by examiner

METHOD FOR MANUFACTURING SEMICONDUCTOR LIGHT EMITTING DEVICE

CROSS-REFERENCE TO RELATED APPLICATIONS

This application is a divisional application based from U.S. application Ser. No. 15/510,585, filed on 10 Mar. 2017, which is a National Phase entry of PCT Application No. PCT/KR2015/009619, filed on Sep. 14, 2015, which claims the benefit and priority to Korean Patent Application Nos. 10-2014-0144087 and 10-2014-0144088, both filed on 23 Oct. 2014, Korean Patent Application Nos. 10-2014-0128481 and 10-2014-0128478, both filed on 25 Sep. 2014, Korean Patent Application Nos. 10-2014-0121193, 10-2014-0121191 and 10-2014-0121190, all filed 12 Sep. 2014. The entire disclosures of the applications identified in this paragraph are incorporated herein by references.

FIELD

The present disclosure relates generally to a semiconductor light emitting device and a method for manufacturing the same, and more particularly, to a semiconductor light emitting device having reduced defects and an improved process efficiency and a method for manufacturing the same.

Examples of semiconductor light emitting devices include Group III-nitride semiconductor light emitting devices (e.g., LEDs). The Group III-nitride semiconductor is made of a compound containing $Al(x)Ga(y)In(1-x-y)N$ ($0 \leq x \leq 1$, $0 \leq y \leq 1$, $0 \leq x+y \leq 1$). Other examples thereof include GaAs-based semiconductor light emitting devices used for emitting red light.

BACKGROUND

This section provides background information related to the present disclosure which is not necessarily prior art.

A semiconductor light emitting device is manufactured by an EPI process, a chip fabrication process and a package process. However, there can be unexpected events in each manufacturing process, causing the occurrence of defects in a product. If these defects found in the respective manufacturing processes are not eliminated properly in time, it means that a potentially defective product will eventually have to go through post-processing, thereby lowering the overall production yield.

FIG. 1 is a schematic illustration showing an exemplary process of fabricating a semiconductor light emitting chip from a wafer. A disk-shaped wafer is prepared with a raw material such as silicon or sapphire, and this disk-shaped wafer is then subjected to an epitaxial growth process to grow multiple semiconductor layers having a PN junction. Next, the processes of electrode formation, etching and protective film formation are performed to obtain an epi wafer 1 with semiconductor light emitting chips (see FIG. 1a). Then, the epi wafer 1 is attached on a dicing tape 3 as illustrated in FIG. 1b and FIG. 1c, and divided into individual semiconductor light emitting chips 101 by a scribing process as illustrated in FIG. 1d. This is followed by testing, classification, and sorting. For sorting, a sorter 5 as shown in FIG. 1e is used such that semiconductor light emitting chips 101 may be sorted on a fixing layer 13 (e.g., a tape) as shown in FIG. 1f in compliance with regulations required for post-processing such as a packaging process. After that, a visual inspection is carried out.

FIG. 2 is a schematic illustration showing an exemplary process of manufacturing a semiconductor light emitting device package with semiconductor light emitting chips. In a packaging process, semiconductor light emitting chips 101 are die-bonded on a lead frame 4 with a die bonder 501 as shown in FIG. 2a. Then processes including wire-bonding, phosphor encapsulation, property testing, trimming, taping and the like are carried out to produce a semiconductor light emitting device package as shown in FIG. 2b. Optionally, a semiconductor light emitting device package can be produced by mounting semiconductor light emitting chips 101 on a submount with an external electrode formed thereon, such as a PCB. Die bonding indicates a process of bonding semiconductor light emitting chips 101 on a lead frame (for example, 4), PCB or circuit tape, and a die bonder (for example, 501) is a tool used therefor. To keep abreast with an increased trend of smaller semiconductor light emitting chips 101, bonding positions and precise angular positioning of the semiconductor light emitting chips 101 are now more required than ever.

FIG. 3 is a schematic illustration showing an example of semiconductor light emitting chips arrayed on a tape using a sorter. As described with reference to FIG. 1f, semiconductor light emitting chips 101 are sorted and prepared such that they are in compliance with regulations required for post-processing such as a packaging process. The sorter 5 arranges semiconductor light emitting chips 101 on a flat tape 13 in an array of designated rows and columns, maintaining a certain spaced interval from an initially placed semiconductor light emitting chips 101 on the tape 13. In the course of arranging the semiconductor light emitting chips 101, it is possible that any one of them may slightly be turned at an angle (see 15), or the sorter 5 running at high speeds may cause some chips to get thrown off of the tape 13, thereby creating a vacancies 14. A vacancy may also be created by a defective semiconductor light emitting chip 16 that has been taken out based on test results. It could be an option to run the sorter 5 to reduce these problems, but the processing time will be increased by doing so.

If chips in the rows and columns are not arranged in a completely precise manner by the sorter 5, the quality of a product will largely be influenced by the type of a post-process that follows. For example, in the case of bonding the semiconductor light emitting chips 101 on a lead frame 4 with a die bonder 501, the die bonder 501 will recognize a shape of electrodes in a semiconductor light emitting chip 101 bonded onto the tape 13 as well as a shape of the lead frame 4, so as to calibrate position, angle and so on of the chip to be bonded. Therefore, a packaging process is not greatly affected as long as the semiconductor light emitting chips 101 are not arrayed in an abnormally severe condition by the sorter 5. Meanwhile, if the semiconductor light emitting chips 101 arrayed on the tape 13 are to be used directly for a post-process, or rearranged by the sorter 5 to be in compliance with regulations required, any semiconductor light emitting chip 101 that has been skewed or tilted by degrees greater than a given tolerance level will have to be corrected again, and any vacancy will have to be filled with a semiconductor light emitting chip 101. These additional processes lower the process efficiency.

FIG. 4 is a schematic illustration showing an exemplary embodiment of a semiconductor light emitting device depicted in U.S. Pat. No. 6,650,044, in which the semiconductor light emitting device includes a substrate 1200, LEDs and an encapsulant 1000. The LEDs are in the form of flip chips, and include a growth substrate 100 and a stack of layers sequentially deposited on the growth substrate 100, including a first semiconductor layer 300 having a first conductivity type, an active layer 400 for generating light by electron-hole recombination, and a second semiconductor layer 500 having a second conductivity type different from the first conductivity type. A metal reflective film 950 is formed on the second semiconductor layer 500, for reflecting light towards the growth substrate 100, and an electrode 800 is formed on an etched exposed portion of the first semiconductor layer 300. The encapsulant 1000 contains a phosphor, and is formed such that it surrounds the growth substrate 100 and the semiconductor layers 300, 400, 500. A conductive adhesive 830, 970 is used to bond the LEDs to the substrate 1200 having electrical contacts 820, 960.

FIG. 5 is a schematic illustration showing an exemplary embodiment of a method for manufacturing the semiconductor light emitting device depicted in U.S. Pat. No. 6,650,044. Firstly, a plurality of LEDs 2A-2F is placed on the substrate 1200. The substrate 1200 is made of silicon, and a growth substrate 100 (see FIG. 4) of each LED is made of sapphire or silicon carbide. Electrical contact 820, 960 (see FIG. 4) are formed on the substrate 1200, and each LED is bonded to the electrical contacts 820, 960. Next, a stencil 6 having openings 8A-8F corresponding to the LEDs is prepared at the substrate 1200, and an encapsulant 1000 (see FIG. 4) is formed such that the electrical contacts 820, 960 are partially exposed. Later, the stencil 6 is removed, a curing process is carried out, and the substrate 1200 is subjected to sawing or scribing, so as to obtain individual, separated semiconductor light emitting devices.

FIG. 6 is a schematic illustration for describing the problems that can occur while forming an encapsulant collectively for a plurality of semiconductor light emitting chips. Here, after placing guides 21 on the edges of a tape 13 or a substrate, the plurality of semiconductor light emitting chips 101 is covered with an encapsulant 17 which is then pressed flat. However, as described above, there can be vacancies 14 without any semiconductor light emitting chip 101 on the tape 13. In these vacant locations without semiconductor light emitting chips, the encapsulant 17 can sag down slightly, which in turn has an adverse effect on the encapsulant 17 around the neighboring semiconductor light emitting chips 101. As a result, those adversely affected semiconductor light emitting chips (a combination of the encapsulant 17 and the semiconductor light emitting chips 101) may have color coordinates or optical properties different from the intended values.

Because of the aforementioned problems, an additional process may be carried out to rearrange a semiconductor light emitting chip 101 at any vacancy 14 on the tape 13, but this leads to an increase in the number of processes and a decrease in the process efficiency. Meanwhile, instead of taking out a defective semiconductor light emitting chip 16, a process of forming an encapsulant 17 may be performed to prevent the presence of a vacancy from affecting the state of the encapsulant 17. But still, this case also requires an additional process of taking out a defective semiconductor light emitting chip through a visual inspection, and materials are wasted accordingly.

Optionally, after an encapsulant 17 is formed, the encapsulant 17 may be cut with a cutter 31 to obtain individual, separated semiconductor light emitting chips. In this case, however, those cut faces of the encapsulant 17 have a lower light extraction efficiency as they were cut and sectioned with the cutter 31. Moreover, if semiconductor light emitting chips 101 are out of alignment even slightly on the tape 13, a number of defective semiconductor light emitting chips may occur during the cutting process with the cutter 31.

SUMMARY

The problems to be solved by the present disclosure will be described in the latter part of the best mode for carrying out the invention.

This section provides a general summary of the present disclosure and is not a comprehensive disclosure of its full scope or all of its features.

According to one aspect of the present disclosure, there is provided a method for manufacturing a semiconductor light emitting device, the method including the steps of: providing a mask having a plurality of openings on a base; placing semiconductor light emitting chips on exposed portions of the base through the openings, respectively, by a device carrier which recognizes a shape of the mask and calibrates position for a semiconductor light emitting chip to be seated; and supplying an encapsulant to each of the openings, with the mask serving as a dam.

According to another aspect of the present disclosure, there is provided a method for manufacturing a semiconductor light emitting device, the method including the steps of: providing a mask having a plurality of openings on a base, and placing semiconductor light emitting chips on exposed portions of the base through the openings, respectively, wherein the mask has a bonding strength control film on the surface to allow a semiconductor light emitting chip to be taken out from the mask without damage; supplying an encapsulant to each of the openings in such a manner that the semiconductor light emitting chips are covered and the encapsulant abuts the bonding strength control film; and taking out an assembly of the encapsulant and the semiconductor light emitting chip from the mask.

According to another aspect of the present disclosure, there is provided a method for testing a semiconductor light emitting device, the method including the steps of: preparing an assembly of a mask having a plurality of openings, semiconductor light emitting chips, each chip having an electrode and being placed in a corresponding opening, and an encapsulant supplied to each of the openings and arranged to encompass the semiconductor light emitting chip in such a manner to expose the electrode; placing optical measuring equipment on the opposite side of the electrode, where the optical measuring equipment receives light from the semiconductor light emitting chip; and measuring the light from a semiconductor light emitting chip using the optical measuring equipment, wherein the mask around the semiconductor light emitting chip reflects a portion of the light from a semiconductor light emitting chip towards the optical measuring equipment, and blocks the light from entering a neighboring encapsulant, thereby measuring the light from a semiconductor light emitting chip.

According to another aspect of the present disclosure, there is provided a semiconductor light emitting device, including: a plurality of semiconductor layers; an encapsulant encompassing a semiconductor light emitting chip in such a manner that electrodes of the semiconductor light emitting chip is exposed, the electrodes being adapted to supply a current to the plurality of semiconductor layers; and a metal bonded part fixed to the encapsulant, at a certain distance from the semiconductor light emitting chip, the metal bonded part having a bottom face exposed in a direction where the electrode is exposed, wherein the exposed faces of the electrodes, the faces of the encapsulant around the electrodes, and the bottom faces of the metal bonded parts are all designed to form one surface together in line.

According to another aspect of the present disclosure, there is provided a semiconductor light emitting device including a semiconductor light emitting chip including: a plurality of semiconductor layers composed of a first semiconductor layer having a first conductivity type, a second semiconductor layer having a second conductivity type different from the first conductivity type, and an active layer interpositioned between the first semiconductor layer and the second semiconductor layer for generating light by electron-hole recombination, and an electrode for supplying a current to the plurality of semiconductor layers; an encapsulant encompassing a semiconductor light emitting chip in such a manner that electrodes of the semiconductor light emitting chip are exposed; and a metal bonded part fixed to the encapsulant, at a certain distance from the semiconductor light emitting chip, the metal bonded part having a bottom face exposed in a direction where the electrode is exposed, wherein the exposed faces of the electrodes, the faces of the encapsulant around the electrodes, and the bottom faces of the metal bonded parts are all designed to form one surface together in line.

According to another aspect of the present disclosure, there is provided a method for manufacturing a semiconductor light emitting chip, the method including the steps of: providing a dam having openings on a base and placing a semiconductor light emitting chip on an exposed portion of the base through the opening, the dam around the opening having a cutting groove; supplying an encapsulant to the opening, thereby covering the semiconductor light emitting chip; and cutting the dam along the cutting groove to obtain a separated semiconductor light emitting device including the semiconductor light emitting chip, the encapsulant and the cut dams.

According to another aspect of the present disclosure, there is provided a method for manufacturing a semiconductor light emitting device, the method including the steps of: providing a dam having openings on a base and placing a first encapsulant on an exposed portion of the base through the opening; and placing a semiconductor light emitting chip on the first encapsulant in such a manner that at least one electrode of the semiconductor light emitting chip faces upwards, and a plurality of semiconductor layers of the semiconductor light emitting chip on the opposite side of the at least one electrode comes in contact with the first encapsulant, with the semiconductor light emitting chip including: a plurality of semiconductor layers composed of a first semiconductor layer having a first conductivity type, a second semiconductor layer having a second conductivity type different from the first conductivity type, and an active layer interpositioned between the first semiconductor layer and the second semiconductor layer, for generating light by electron-hole recombination; and at least one electrode supplying a current to the plurality of semiconductor layers.

According to another aspect of the present disclosure, there is provided a semiconductor light emitting device, characterized by including: a plurality of semiconductor layers composed of a first semiconductor layer having a first conductivity type, a second semiconductor layer having a second conductivity type different from the first conductivity type, and an active layer interpositioned between the first semiconductor layer and the second semiconductor layer, for generating light by electron-hole recombination; at least one electrode arranged on one side of the plurality of semiconductor layers, for supplying a current to the plurality of semiconductor layers; and a first encapsulant covering the plurality of semiconductor layers on the opposite side of the at least one electrode, so as to partially expose the side faces of the plurality of semiconductor layers between the side of the at least one electrode and the opposite side of the at least one electrode with respect to the plurality of semiconductor layers.

According to another aspect of the present disclosure, there is provided a method for manufacturing a semiconductor light emitting device, the method including the steps of: providing a first dam having an opening on a first base; placing a semiconductor light emitting part on an exposed portion of the first base through the opening, the semiconductor light emitting part including a plurality of semiconductor layers composed of: a first semiconductor layer having a first conductivity type, a second semiconductor layer having a second conductivity type different from the first conductivity type, and an active layer interpositioned between the first semiconductor layer and the second semiconductor layer, for generating light by electron-hole recombination; at least one electrode arranged on one side of the plurality of semiconductor layers, for supplying a current to the plurality of semiconductor layers; and a first encapsulant covering the plurality of semiconductor layers on the opposite side of the at least one electrode, in such a manner that the first encapsulant and the first base face each other, and the at least one electrode faces upwards; forming a second encapsulant between the first dam and the semiconductor light emitting part; and forming at least one conductive part covering the at least one electrode and a part of the second encapsulant.

According to another aspect of the present disclosure, there is provided a semiconductor light emitting device, characterized by including: a plurality of semiconductor layers composed of: a first semiconductor layer having a first conductivity type, a second semiconductor layer having a second conductivity type different from the first conductivity type, and an active layer interpositioned between the first semiconductor layer and the second semiconductor layer, for generating light by electron-hole recombination; and at least one electrode arranged on one side of the plurality of semiconductor layers, for supplying a current to the plurality of semiconductor layers; a first encapsulant encompassing the plurality of semiconductor layers in such a manner that the at least one electrode is exposed; a second encapsulant encompassing the first encapsulant in such a manner that the at least one electrode is exposed, and the first encapsulant is exposed towards the opposite side of the at least one electrode; and at least one conductive part formed on the at least one electrode, and on a part of the second encapsulant exposed towards the at least one electrode.

The advantageous effects of the present disclosure will be described in the latter part of the best mode for carrying out the invention.

DETAILED DESCRIPTION

The present disclosure will now be described in detail with reference to the accompanying drawings. It should be noted that the steps recited in any of the method or process descriptions may be executed in any order and are not necessarily limited to the order presented. In addition, any reference to singular includes plural embodiments, and any reference to more than one component or step may include a singular embodiment or step.

Figure 7:
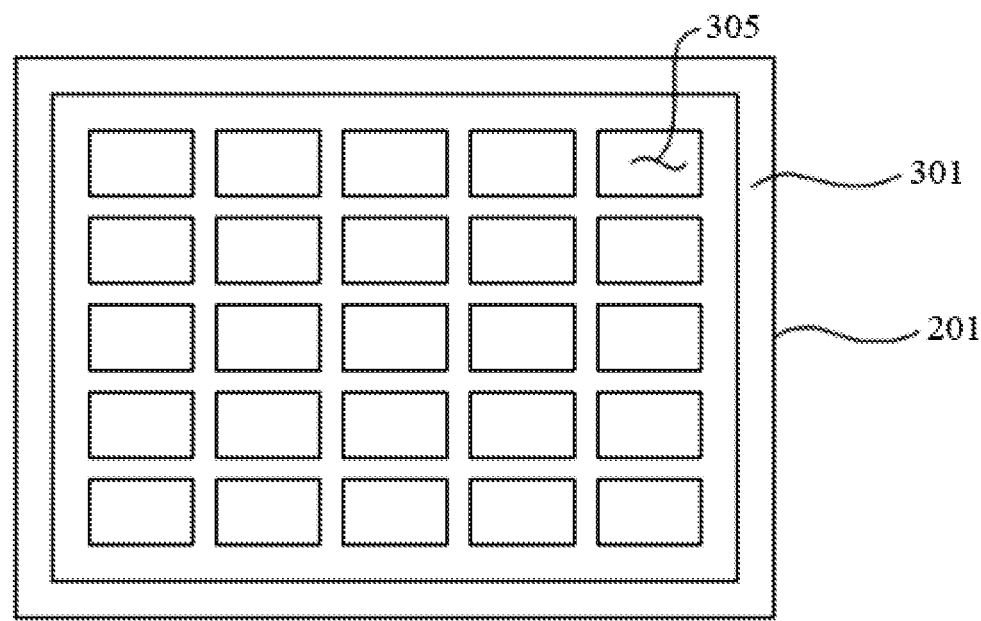
FIG. 7 to FIG. 12 are schematic illustrations for describing exemplary embodiments of a method for manufacturing a semiconductor light emitting device according to the present disclosure.
Figure 10:
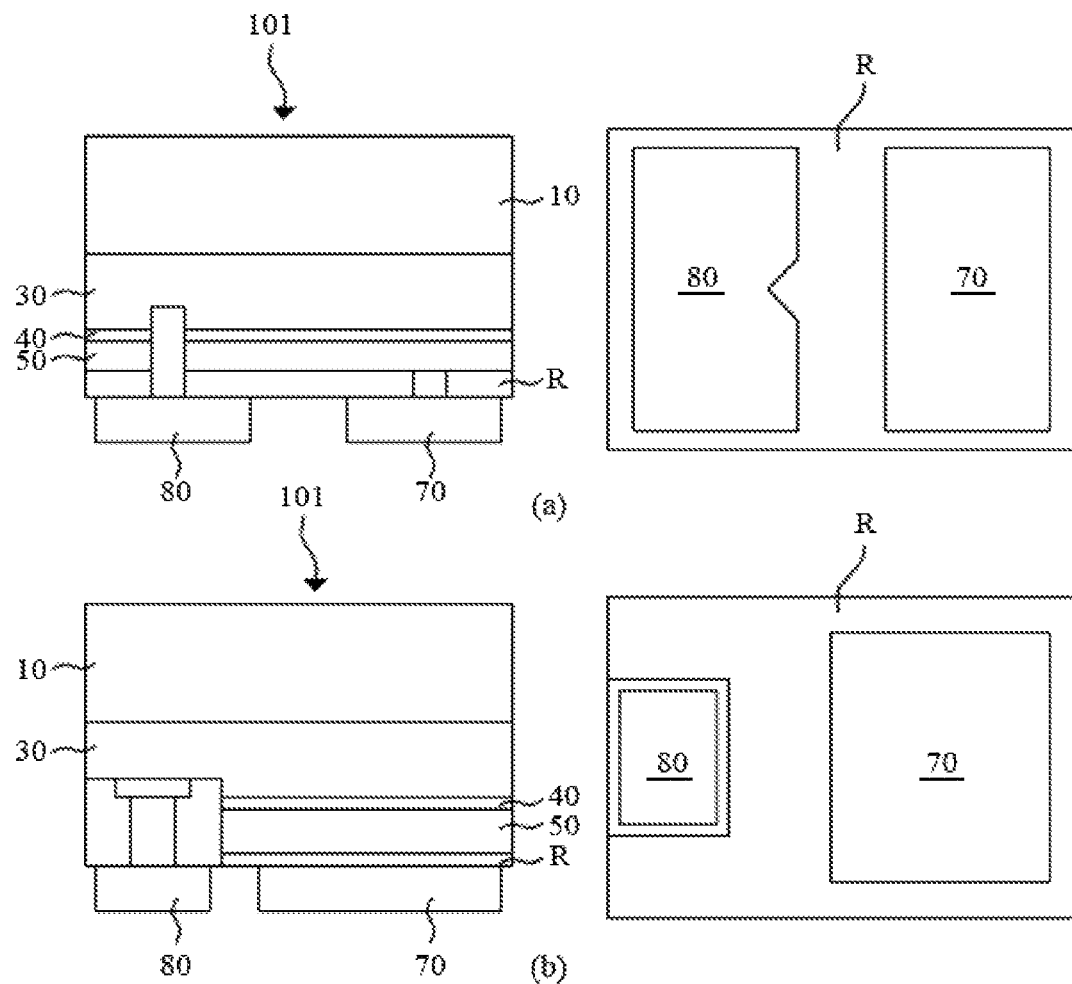
Figure 11:
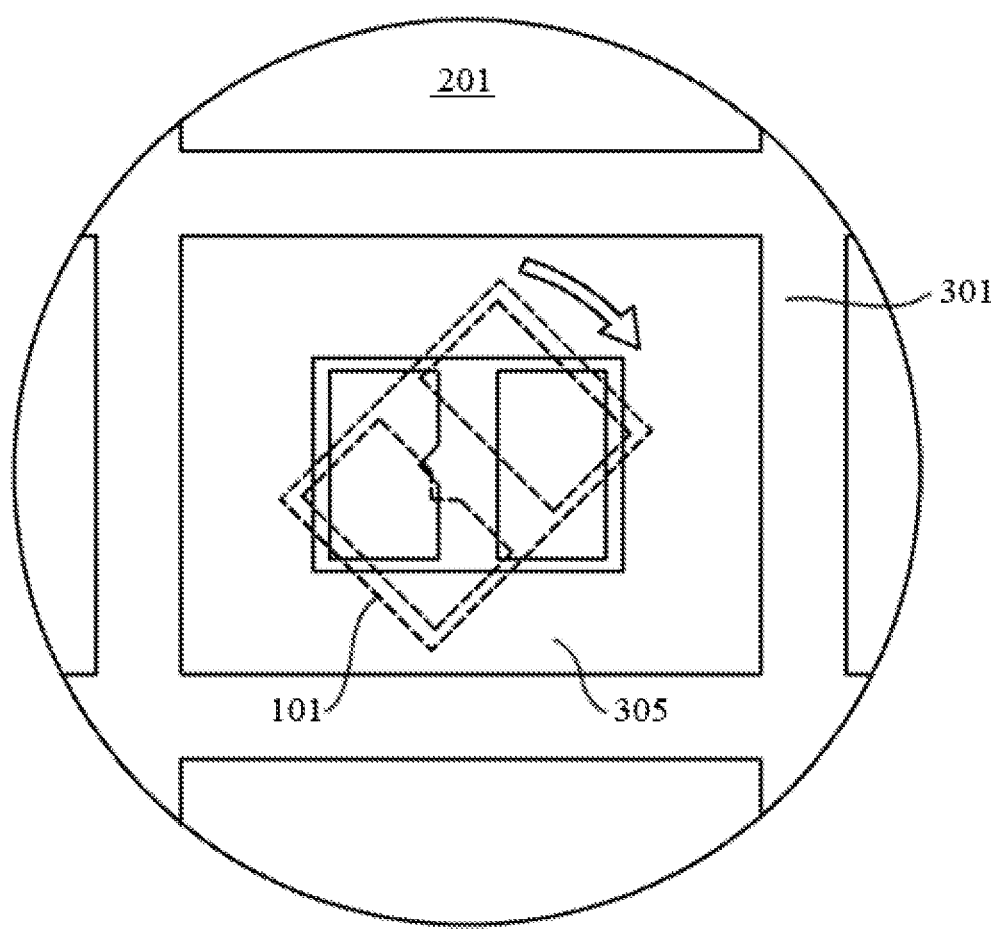
Figure 12:
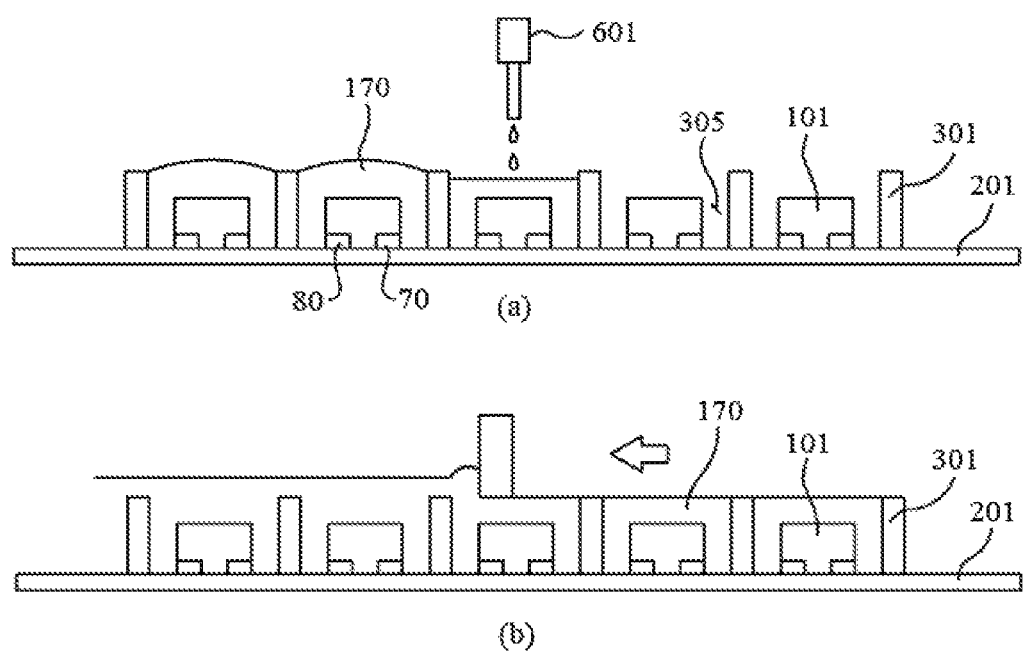

FIG. 7 to FIG. 12 are schematic illustrations for describing an exemplary embodiment of a method for manufacturing a semiconductor light emitting device according to the present disclosure. Referring first to FIG. 7, according to this method for manufacturing a semiconductor light emitting device, a mask 301 having a plurality of openings 305 is provided over a base 201. Next, as shown in FIG. 9(b), semiconductor light emitting chips 101 are placed on exposed portions of the base 201 through the openings 305, respectively, with a device carrier 501 adapted to recognize the shape, pattern or boundaries of the mask 301 so as to calibrate the position and angle of a device to be placed. An encapsulant 170 is then supplied to each of the openings 305, as shown in FIG. 12, with the mask 301 serving as a dam.

Figure 1:
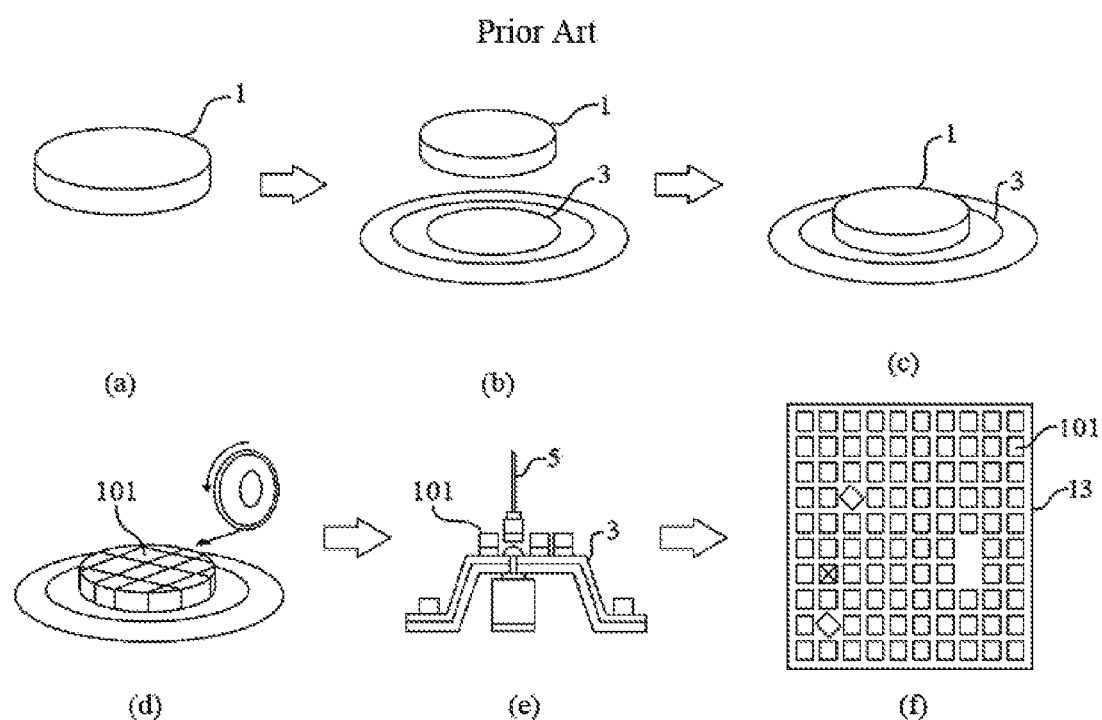
FIG. 1 is a schematic illustration showing an exemplary process of fabricating a semiconductor light emitting chip from a wafer.
Figure 2:
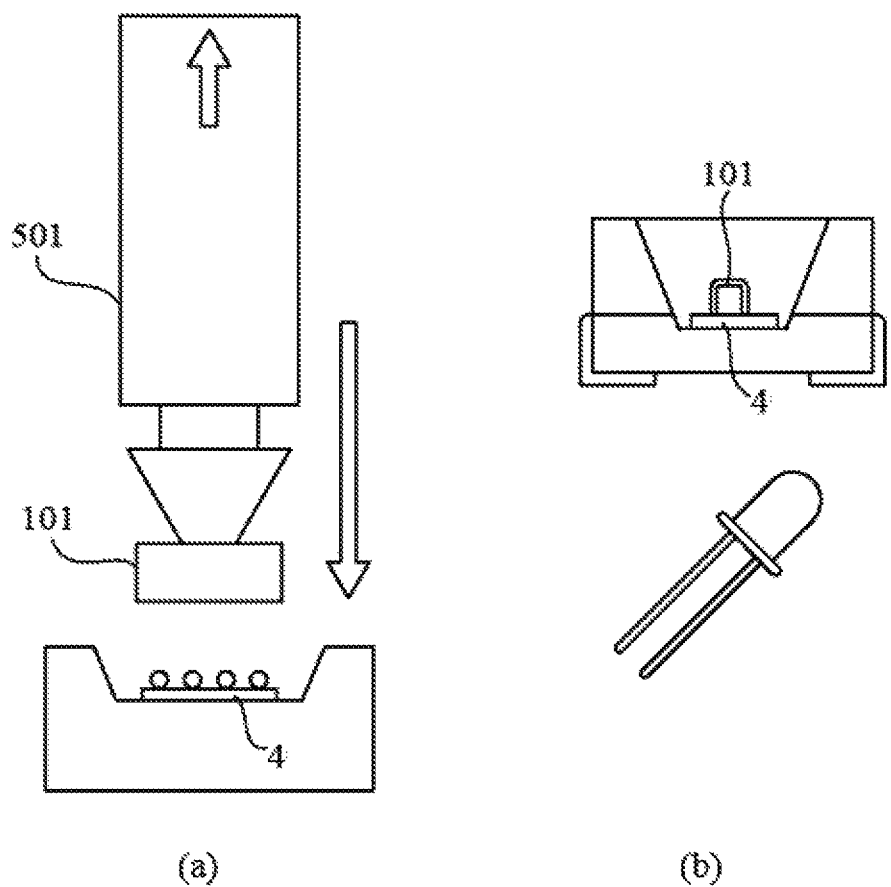
FIG. 2 is a schematic illustration showing an exemplary process of manufacturing a semiconductor light emitting device package with semiconductor light emitting chips.
Figure 3:
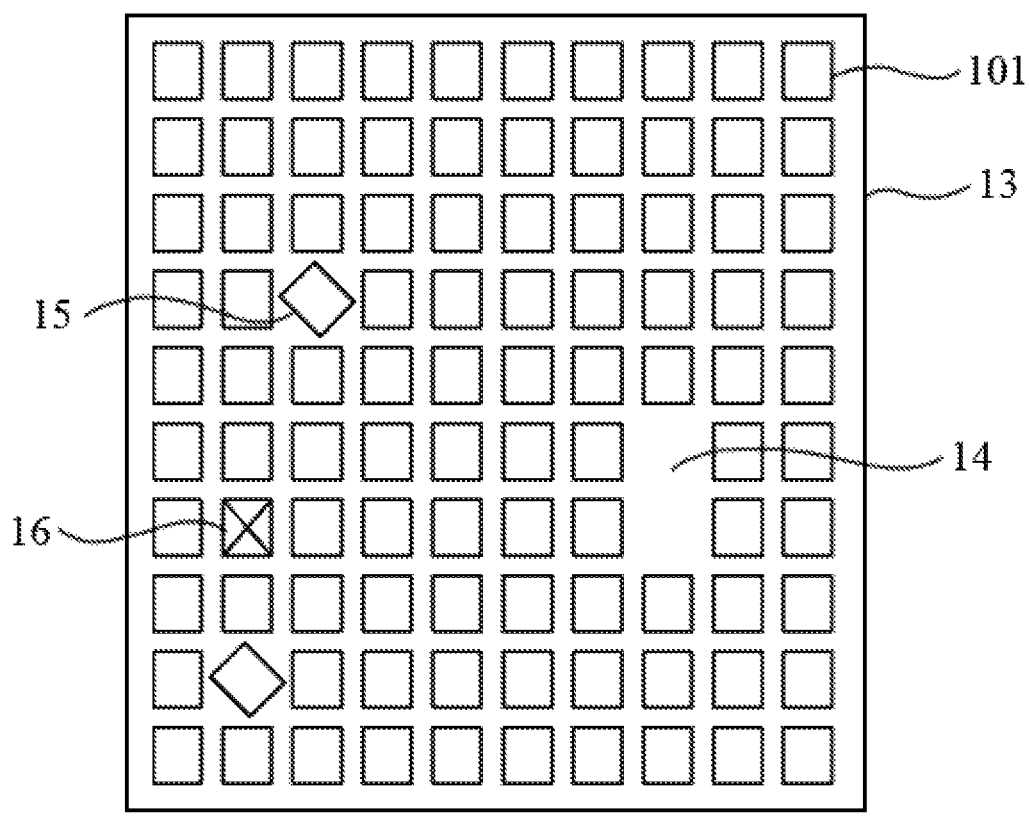
FIG. 3 is a schematic illustration showing an example of semiconductor light emitting chips arrayed on a tape by means of a sorter.
Figure 4:
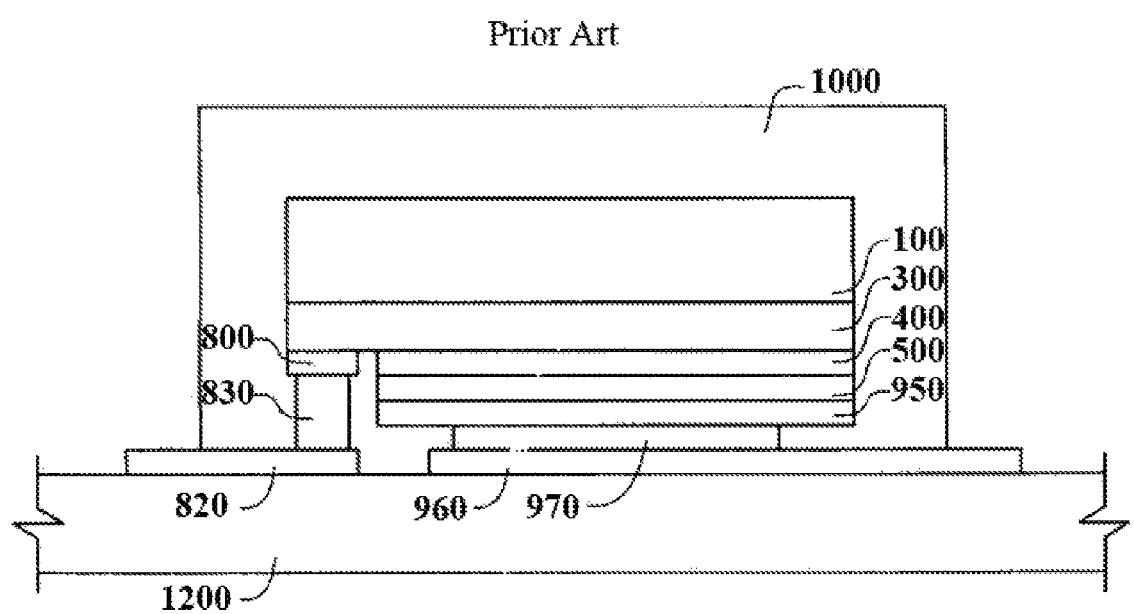
FIG. 4 is a schematic illustration showing an exemplary embodiment of a semiconductor light emitting device depicted in U.S. Pat. No. 6,650,044.
Figure 5:
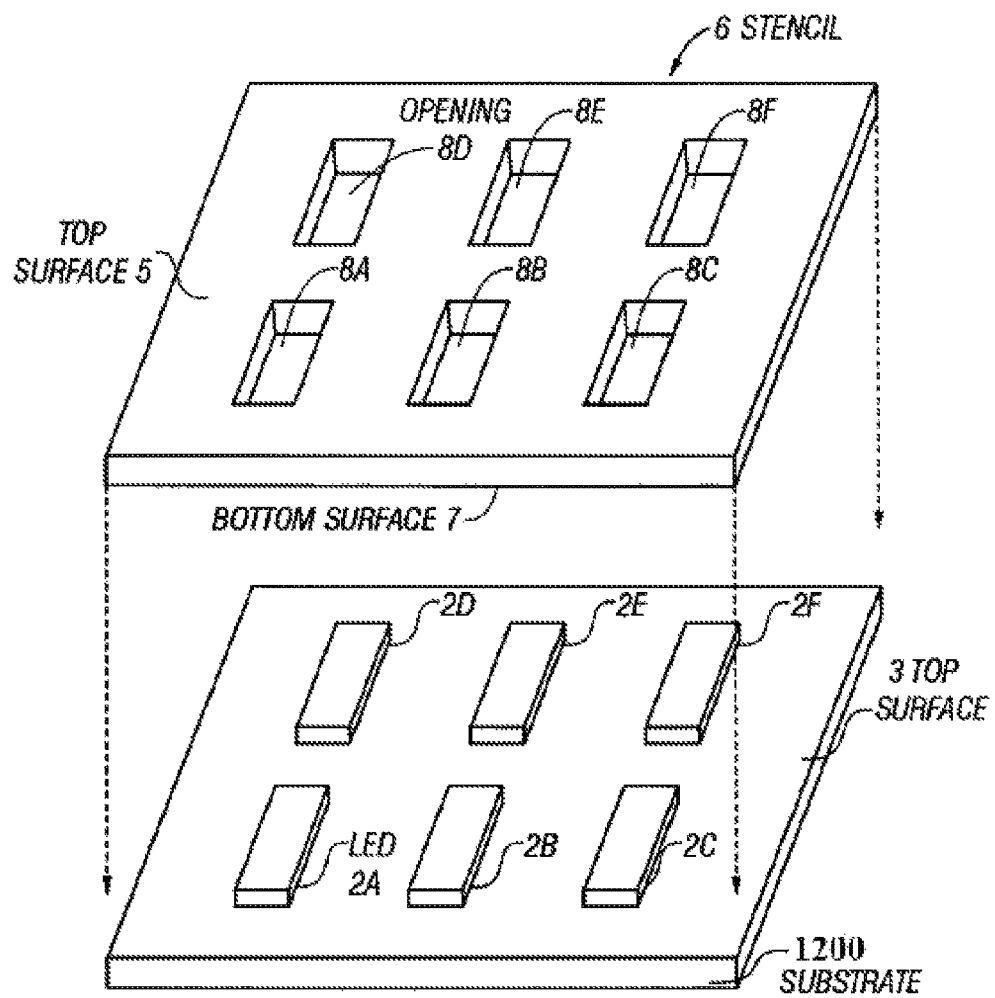
FIG. 5 is a schematic illustration showing an exemplary embodiment of a method for manufacturing the semiconductor light emitting device depicted in U.S. Pat. No. 6,650,044.

In this embodiment, the mask 301 is provided on the base 201 before the semiconductor light emitting chips 101 are placed on the base 201. The mask 301 may be seen as a pattern for the device carrier 501 to calibrate the position or angle of a semiconductor light emitting chip 101 to be placed, and it may also serve as a dam of the encapsulant 170. Since the mask 301 and the openings 305 constitute a frame designed to be very accurate and exact in manner, they provide high-precision alignment of semiconductor light emitting chips 101, as compared with the case where devices are arranged on a mask 301—free base 201 or flat tape 13 (see FIG. 3) by means of a sorter (e.g.., 5 in FIG. 2) according to a given instruction on each occasion. Therefore, defects due to inaccurate alignment are reduced. Moreover, when a semiconductor light emitting chip 101 being adhered to the tape 13 is provided to the device carrier 501 (see FIG. 9a), the semiconductor light emitting chip may not necessarily be made to perfectly fit in the required dimensions as the device carrier 501 itself can recognize a vacancy 14 (see FIG. 9a) without a semiconductor light emitting chip 101 to carry another semiconductor light emitting chip 101, and correct any skew angle of the semiconductor light emitting chip 101 before placing it on the base 201. Accordingly, this reduces the burden of providing semiconductor light emitting chips 101 to the device carrier 501 in a perfectly precise manner.

While flip chips are suitable for those semiconductor light emitting chips 101 in this embodiment, lateral chips or vertical chips may also be used. As for a flip chip light emitting device, the semiconductor light emitting chip 101 has two electrodes 80, 70 (see FIG. 12) that are exposed from the encapsulant.

Each process will now be elaborated as follows.

Figure 8:
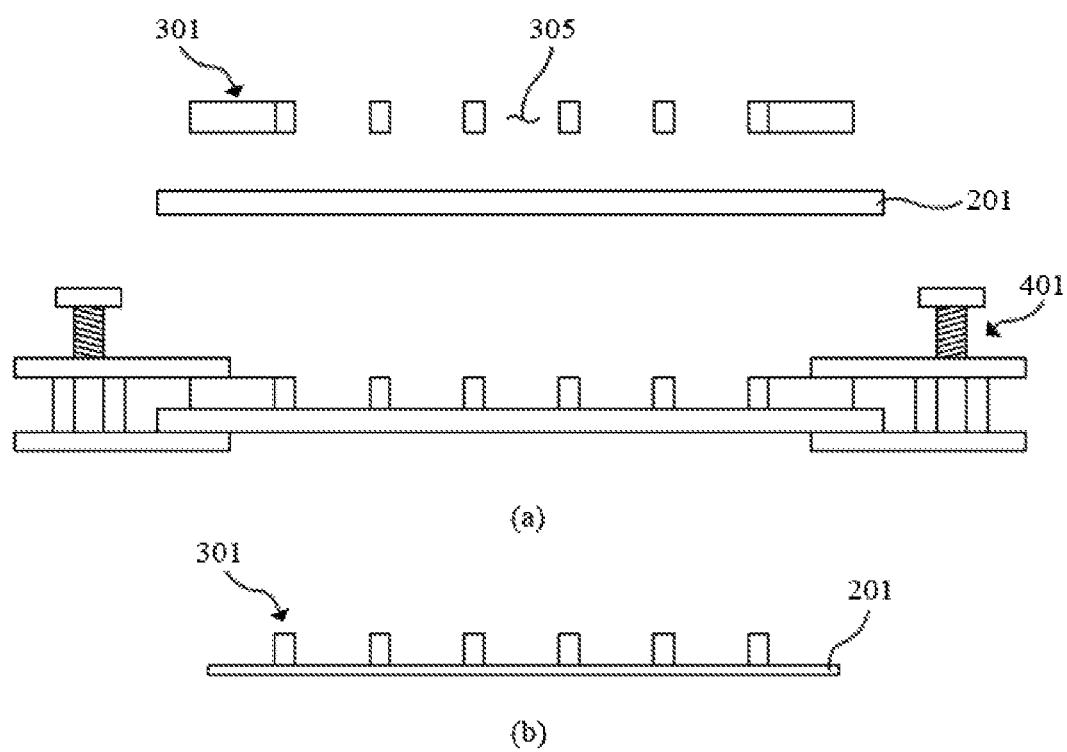

As shown in FIG. 8, a mask 301 is provided on a base 201. The base 201 may be either a rigid metallic plate or non-metallic plate as shown in FIG. 8, or a flexible film or tape as shown in FIG. 8b. The present disclosure is not particularly restricted to certain metallic plates, and Al, Cu, Ag, Cu—Al alloys, Cu—Ag alloys, Cu—Au alloys, SUS (stainless steel) or the like may be used as the metallic plate. A plated metallic plate can also be used. The non-metallic plate may be made of plastics in a wide range of colors or light reflectances. In addition, the present disclosure is not particularly restricted to certain films or tapes, and any sticky or adhesive film or tape having heat resistant properties is desired. For example, a heat-resistant tape or a blue tape in a wide range of colors or light reflectances may be used.

Therefore, the embodiment described above is advantageous in that the base 201 on which semiconductor light emitting chips 101 are aligned does not have to be a semiconductor substrate or other more expensive substrates. Further, the base 201 does not need to go through an additional patterning process because the mask 301 serves as a guide for alignment of the semiconductor light emitting chips 101. Additionally, the electrodes 80, 70 in one semiconductor light emitting chip 101 may serve as electrodes in direct contact with external electrodes, or the base itself may be used for electrical conduction. This means that it is no longer necessary to deposit or plate a conductive layer on the base 201 for electrical connection, or to additionally form an electrical contact to be connected with the electrodes 80, 70 in the semiconductor light emitting chip 101 after the base 201 is removed. Eliminating these extra/additional processes calibrates for the overall cost and processing.

The mask 301 may be a plastic, metallic or surface-plated component, and has a plurality of openings 305. While the mask 301 may be made of the same material as the base selected from those mentioned above, it is preferentially made of a material that is sufficiently firm or hard to maintain the shape of the mask 301 or openings 305 and that is effective for avoiding cracks or splits. In particular, as will be described later, the mask 301 and the base 201 are preferentially different from each other in terms of at least one of material, color and light reflectance, thereby assisting the device carrier in its recognizing a pattern of the mask 301.

In this embodiment, the base 201 and the mask 301 abut each other by an externally applied force. For example, as shown in FIG. 8a, a clamp 401 may be used to make the base 201 and the mask 301 abut each other. As such, this embodiment presents a simple and convenient way of bringing the base 201 and the mask 301 into contact with each other and of separating the mask 301 from the mask 201 by tightening or loosening the clamp 401. Optionally, an adhesive material may be inserted between the base 201 and the mask 301. The adhesive material can be selected from a wide range of materials including a conductive paste, an insulating paste, a polymeric adhesive or the like, and is not particularly limited thereto. However, those materials which lose their adhesion at a certain temperature range are avoided because the base 201 and the mask 301 could be easily separated from each other at the temperature range.

The plurality of openings 305 formed in the mask 301 is arrayed in columns and rows, for example. The top face of the base 201 is exposed through the openings 305. The number of openings 305 and their array format can vary according to needs. The openings 305 may have a matching shape with the semiconductor light emitting chip 101 or a different shape from the semiconductor light emitting chips 101.

Figure 9:
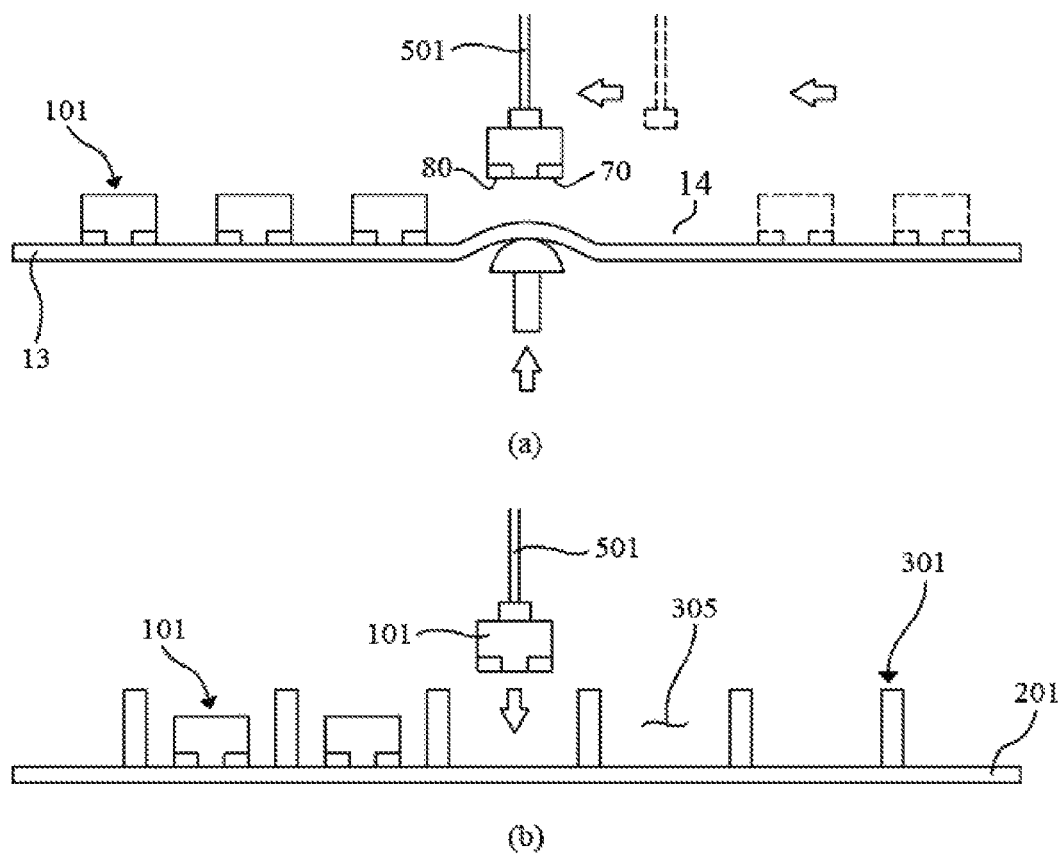

FIG. 9 is a schematic illustration for describing an exemplary process of placing semiconductor light emitting chips 101 in exposed portions of the base 201 through the openings 305, in which a device carrier 501 picks up each semiconductor light emitting chip 101 on a fixing component 13 (e.g., a tape) and then places it on an exposed portion of the base 201 through a corresponding opening 305. Prior to this process, a device aligner (e.g., a sorter) may put a plurality of semiconductor light emitting chips 101 on the tape 13, as in the embodiment shown in FIG. 3. Referring to FIG. 9a, when a pin or rod (bar) strikes a semiconductor light emitting chip 101 from the bottom of the tape 13, the semiconductor light emitting chip 101 comes off the tape 13, and at this moment, the device carrier 501 can catch the semiconductor light emitting chip 101 by electric suction or vacuum suction. Referring to FIG. 9b, the device carrier 501 hovers above the base 201 to place semiconductor light emitting chips 101 into their corresponding openings 305. The semiconductor light emitting chip 101 is placed in such a manner that its two electrodes 80, 70 face the top face of the base 201. Therefore, those two electrodes 80, 70 are not covered with an encapsulant 170, which will be described later. Similar to a die bonder for example, the device carrier 501 recognizes patterns or shapes. Regardless of the name of an instrument used, any instrument capable of calibrating a target position or angle of an object can be employed.

FIG. 10 is a schematic illustrating for describing different embodiments of a semiconductor light emitting chip. In these embodiments, the semiconductor light emitting chip 101 is a flip chip device, including a growth substrate 10, a plurality of semiconductor layers 30, 40, 50, a light reflective layer R, and two electrodes 80, 70. In the case of Group III-nitride semiconductor light emitting devices, for example, the growth substrate 10, which may be eventually removed, is made primarily of sapphire, SiC, Si, GaN or the like. The plurality of semiconductor layers 30, 40, 50 includes a buffer layer (not shown) formed on the growth substrate 10, a first semiconductor layer 30 (e.g., Si-doped GaN) having a first conductivity type, a second semiconductor layer 50 (e.g., Mg-doped GaN) having a second conductivity type different from the first conductivity type, and an active layer 40 (e.g., InGaN/(In)/GaN multiple quantum well structure) which is interpositioned between the first semiconductor layer 30 and the second semiconductor layer 50 and generates light by electron-hole recombination. Each of the semiconductor layers 30, 40, 50 may have a multi-layered structure, and the buffer layer may be omitted. The positions of the first semiconductor layer 30 and second semiconductor layer 50 may be exchanged, and these semiconductor layers are made primarily of GaN in the case of Group III-nitride semiconductor light emitting devices. The first electrode 80 is in electrical communication with the first semiconductor layer 30 and supplies electrons thereto. The second electrode 70 is in electrical communication with the second semiconductor layer 50 and supplies holes thereto.

As shown in FIG. 10a, a light reflective layer R is interpositioned between the second semiconductor layer 80 and the electrodes 70, 80. The light reflective layer R may have a multilayered structure including an insulation layer, a DBR (Distributed Bragg Reflector) or ODR (Omni-Directional Reflector). Optionally, as shown in FIG. 10b, a metallic reflective layer R may be provided on the second semiconductor layer the electrode 70 may be provided on the metallic reflective layer R, and an exposed portion of the first semiconductor layer 50 by mesa-etching may communicate with the other electrode 80. The device carrier 501 described above can recognize the shape or pattern of these electrodes 70, 80.

FIG. 11 is a schematic illustrating of an example showing how the device carrier recognizes a shape or pattern of a mask to calibrate angle and position of a semiconductor light emitting chip to be placed. When the sorter 5 (see FIG. 2) is running at a high speed, it might leave out a semiconductor light emitting chip 101 on the tape, thereby creating a vacancy (see 14 in FIG. 3), and it might also skew a semiconductor light emitting chip slightly (see 16 in FIG. 3). As shown in FIG. 9a, the device carrier 501 is capable of recognizing any vacancy 14 and picking up the semiconductor light emitting chip 101 at the next position. When the device carrier 501 picks up the semiconductor light emitting chip 101, it can recognize a pattern (e.g., electrode separating line) of the electrodes 80, 70 in the semiconductor light emitting chip 101 to calibrate an angle of the chip. In addition, as shown in FIG. 11, the device carrier 501 recognizes a shape of the mask 301 and calibrates position or angle of the semiconductor light emitting chip 101 such that the chip is placed with precision and accuracy on an exposed portion of the base 201 through a corresponding opening 305. To accomplish this, the device carrier 501 may use a camera or optical sensor. For example, the base 201 and the mask 301 may have different materials or colors or be subjected to surface treatment to exhibit a different light reflectance from each other. In turn, the device carrier 501 can sense a difference in brightness, light reflectance or reflected light between the mask 301 and the base 201, or recognize a shape or form of the opening 305 of interest. It does not necessarily have to recognize the entire shape or form opening 305, but may recognize only a part thereof. Thus, the device carrier 501 can place a semiconductor light emitting chip 101 at a position on the base 201, which corresponds to a designated distance away from or coordinates with respect to at least one of the face, edge and point of the mask 301, in an opening 305. Besides, other approaches may also be applied to recognize a pattern of the mask 301 or opening 305, and to obtain the coordinates of a target semiconductor light emitting chip 101 based on the pattern. In this embodiment, the base 201 does not have a specific pattern on it, and the mask 301 or opening 305 is used as a reference for obtaining the coordinates of a semiconductor light emitting chip 101 of interest.

In short, the positional and angular alignment of semiconductor light emitting chips 101 is done with higher precision and accuracy, as compared with the case where semiconductor light emitting chips are simply arranged on a flat base 201 by means of a sorter 5 at predetermined spaced intervals with respect to an initially placed semiconductor light emitting chip 101.

FIG. 12 is a schematic illustration for describing an exemplary way for supplying an encapsulant to each opening, with the mask serving as a dam, in the method for manufacturing a semiconductor light emitting device according to the present disclosure. A dispenser 601 may supply an encapsulant 170 to each opening 305 as shown in FIG. 12a. In another option, the encapsulant 170 may be pressed down flat as shown in FIG. 12b.

Figure 13:
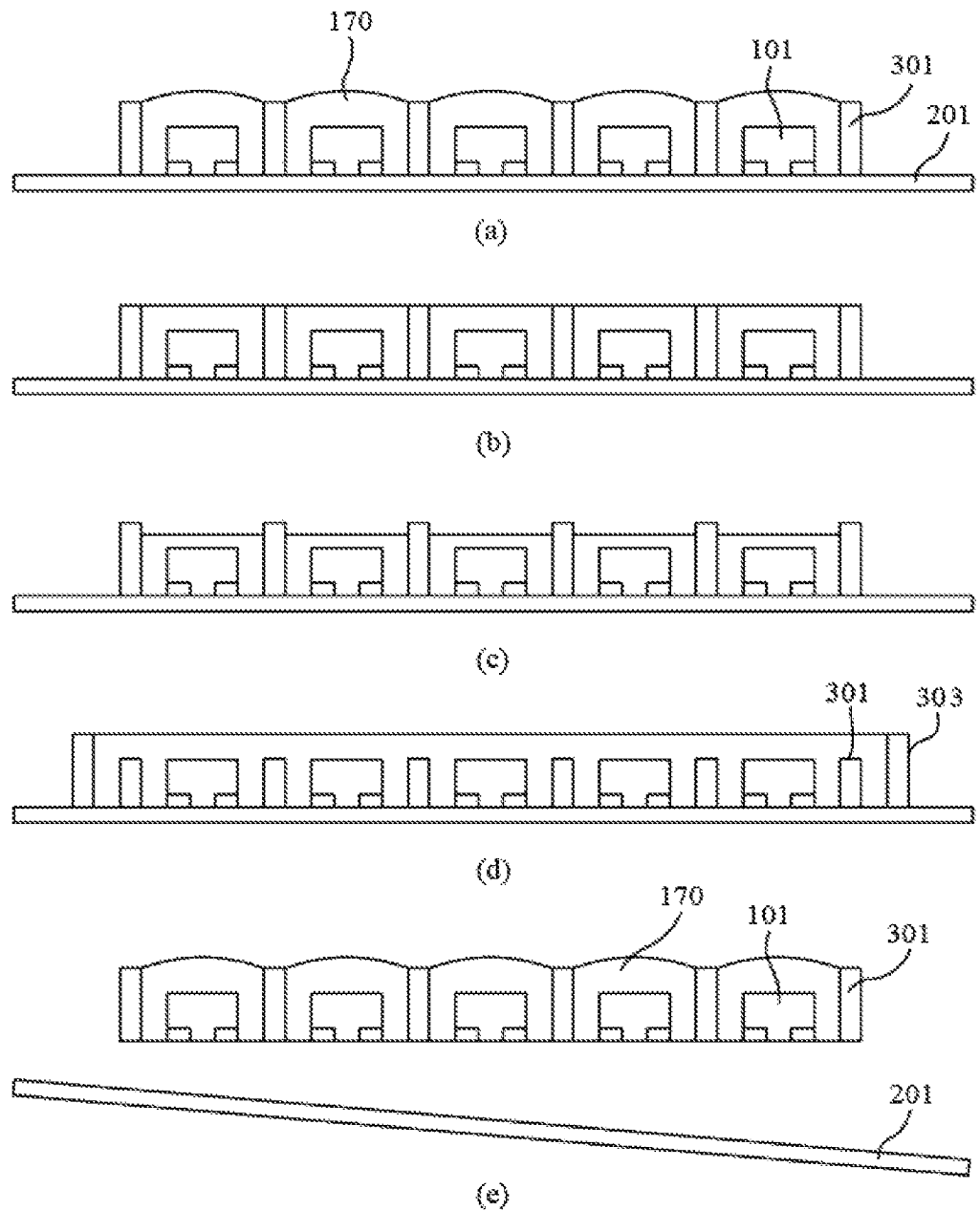
FIG. 13 is a schematic illustration for describing examples of an encapsulant that is supplied and cured in an opening in methods for manufacturing a semiconductor light emitting device according to the present disclosure.

FIG. 13 is a schematic illustration for describing examples of an encapsulant that is supplied and cured in an opening in methods for manufacturing a semiconductor light emitting device according to the present disclosure. By controlling the encapsulant 170 feeding speed, amount or the like of the dispenser 601, the top face of the encapsulant 170 may be slightly mounded on top. When the encapsulant 170 is formed into this shape, it can be useful for directing lights from the semiconductor light emitting chips 101 in a desired spectral distribution pattern. Optionally, when needed, the encapsulant 170 may be made flat on the top as shown in FIG. 13b, or the encapsulant 170 may be formed such that its height is lower than the top of the mask 301 as shown in FIG. 13c. Further optionally, walls 303 taller than the mask 301 may be arranged on the outer edges, thereby placing the encapsulant 170 formed on top of the wall in a higher level than the mask 301 as shown in FIG. 13d.

Referring next to FIG. 13e, the mask 301, the encapsulant 170 and the semiconductor light emitting chip 101 are all separated in a body from the base 201 once the clamp 401 (see FIG. 8) is loosened. It can then be envisaged that this assembly of the mask 301, the encapsulant 170 and the semiconductor light emitting chip 101 could be directly used as a semiconductor device. Meanwhile, if the mask 301 has been bonded to the base 201 using an adhesive or any other means, the mask 301, the encapsulant 170, the semiconductor light emitting chip 101 and the base 201 may form an integrated body for use as a semiconductor device. Still optionally, separated individual devices may be obtained by removing the mask 301, cutting the mask 301, or cutting the mask 301 together with the base 201.

In the method for manufacturing a semiconductor light emitting device according to this embodiment, the mask 301 may be used as a guide pattern for arrays of semiconductor light emitting chips 101 such that the semiconductor light emitting chips 101 are arranged at corresponding positions and angles with higher accuracy and precision. Therefore, the occurrence of possible defects due to misalignment of the semiconductor light emitting chips 101 will be reduced during post-processing, for example, a division process (e.g., sawing or the like) into individual devices.

Unlike conventional approaches of filling in any vacancy on a tape where semiconductor light emitting chips 101 are arrayed or compensating a skew angle of a semiconductor light emitting chip 101 before arranging the mask 301 on the tape and supplying an encapsulant, the method according to this embodiment is efficient because the aforementioned additional process is not required.

Figure 14:
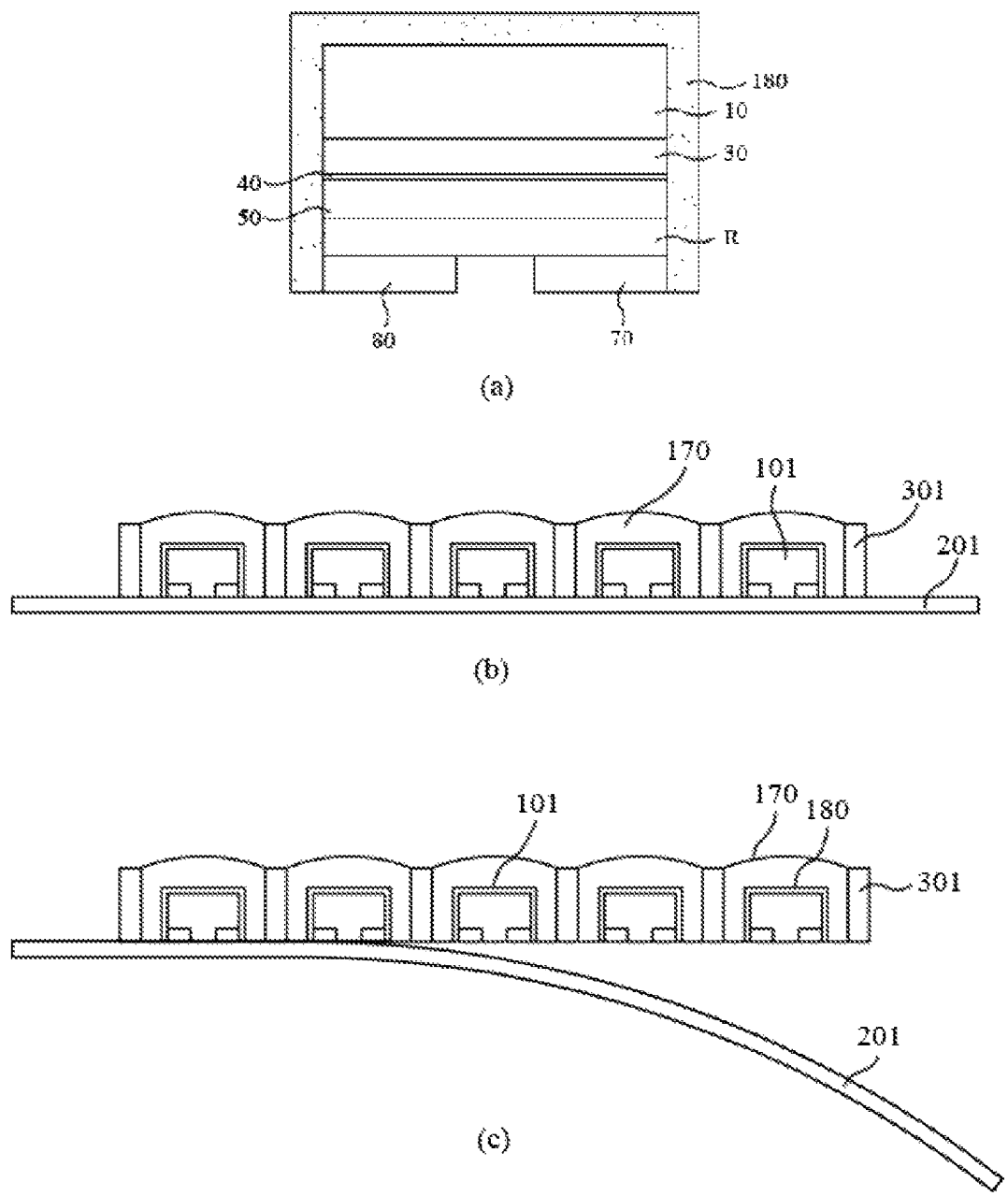
FIG. 14 is a schematic illustration for describing another exemplary embodiment of a method for manufacturing a semiconductor light emitting device according to the present disclosure.

FIG. 14 is a schematic illustration for describing another exemplary embodiment of a method for manufacturing a semiconductor light emitting device according to the present disclosure. In this embodiment, before semiconductor light emitting chips 101 are placed on the base 201, a phosphor is conformally coated (e.g., by spray coating) on the surface of the semiconductor light emitting chip 101 as shown in FIG. 14a. Although a phosphor layer 180 is substantially much thinner and smaller than an encapsulant 170, it can be evenly coated on the semiconductor light emitting chip 101 such that a reduced amount of phosphor may be used. By way of example, the phosphor layer 180 has a thickness of approximately 30 μm, while the encapsulant 170 has a thickness between 100 μm and 200 μm.

Next, a mask 301 is arranged on the base 201, and the semiconductor light emitting chips 101, each having a phosphor layer, are placed in each opening 305 of the mask 301 by means of a device carrier 501 capable of recognizing a pattern of the mask and compensating the position and angle of a target chip. Then, as shown in FIG. 14b, the encapsulant 170 is supplied to the openings 305 and cured. Here, the encapsulant 170 may be made of a transparent material (e.g., silicon) which is phosphor-free and serves for protection only as an encapsulating material. Referring next to FIG. 14c, the base 201 is separated from the mask 301, the encapsulant 170 and the semiconductor light emitting chips 101. If the base 201 is a hard plate, its separation can be accomplished by loosening the clamp 401. If the base 201 is a film or tape, it can be simply detached.

Figure 15:
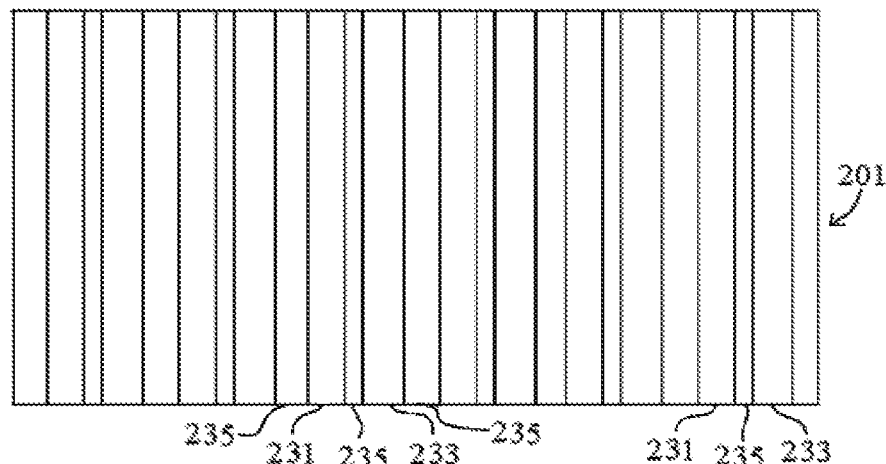
FIG. 15 is a schematic illustration for describing another exemplary embodiment of a method for manufacturing a semiconductor light emitting device according to the present disclosure.
Figure 15:
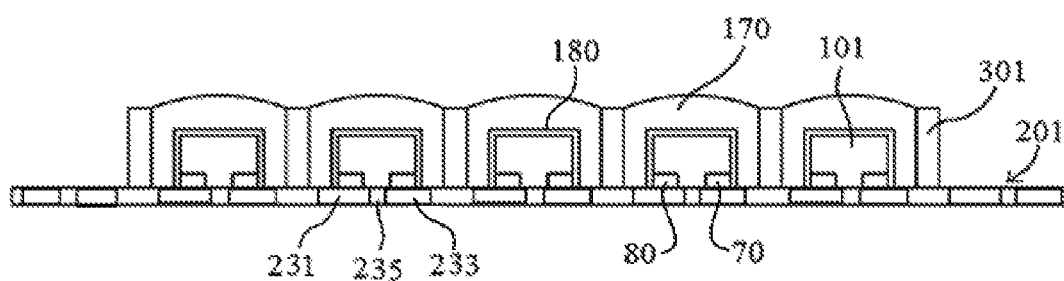

FIG. 15 is a schematic illustration for describing another exemplary embodiment of a method for manufacturing a semiconductor light emitting device according to the present disclosure. In this embodiment, a plate having a plurality of conductive parts is used as a base 201 as shown in FIG. 15a. The base 201 includes a plurality of conductive parts 231, 233, and an insulating part 235 between the plurality of conductive parts 231, 233. Each of the conductive parts 231, 233 has exposed top and bottom faces, and is flat. The conductive parts 231, 233 are passages for electrical conduction, and may be heat protection passages. The base 201 is formed of a stack including a number of alternate, repeating conductive plates (e.g., Al/Cu/Al) bonded to each other with an insulating material such as an insulating adhesive (e.g., epoxy). This stack is then cut (e.g., by wire cutting) to obtain a plate-like base 201 as shown in FIG. 15. The base 201 may form an elongated strip-shaped or wide plate-shaped body, depending on a cutting method applied. The widths of the conductive parts 231, 233 and insulating part 235 may be adjusted by modifying the thicknesses of the conductive parts and insulating adhesive.

The phosphor layer 180 is formed on the surface of each semiconductor light emitting chip 101 before the semiconductor light emitting chips 101 are placed on the base 201. Once a mask 301 is arranged on the base 201, a device carrier 501 places a semiconductor light emitting chip 101 at a certain position on the base 201, which corresponds to a designated distance away from the edge of a mask 301, in an opening 305 recognized by the device carrier 501. Although recognizing an opening 305 of interest in the mask 301 would be sufficient as a guide for determining coordinates of a semiconductor light emitting chip 101, the conductive parts 231, 233 together with the mask 301 can also provide extra help in determining the coordinates. For instance, the device carrier 501 can perform angular and positional calibration such that electrodes 80, 70 of a semiconductor light emitting chip 101 are placed between the edges of a mask 301 and between the edges of conductive parts 231, 233. In this manner, it becomes possible to prevent the electrodes 80, 70 of the semiconductor light emitting chip 101 from being at the insulating part 235, and to facilitate placing the electrodes 80, 70 at different conductive parts 231, 233 from each other.

As aforementioned, a semiconductor light emitting chip 101 is arranged in each opening 305 of a mask 301, using recognition results of the opening 305, the conductive parts 231, 233 and the electrodes 80, 70 of a semiconductor light emitting chip 101 of interest. This is followed by supplying and curing an encapsulant 170 in an opening 305 as shown in FIG. 15b. In this embodiment, the base 201 may be used as one body with the encapsulant 170 and the semiconductor light emitting chip 101, instead of being separated from them. Optionally, the base 201 may be cut in such a manner that a plurality of semiconductor light emitting chips 101 and the encapsulant 170 form an array. Further optionally, the base 201 may be cut in such a manner that one semiconductor light emitting chip 101, the encapsulant 170 and the base 201 may form a single semiconductor light emitting device.

Figure 16:
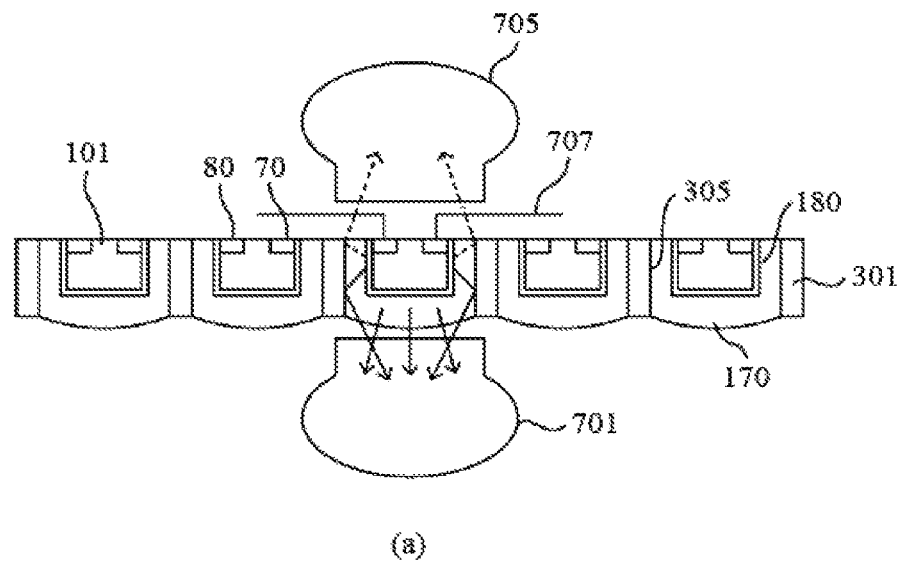
FIG. 16 and FIG. 17 are schematic illustrations showing exemplary embodiments of a method for testing a semiconductor light emitting device according to the present disclosure.
Figure 16:
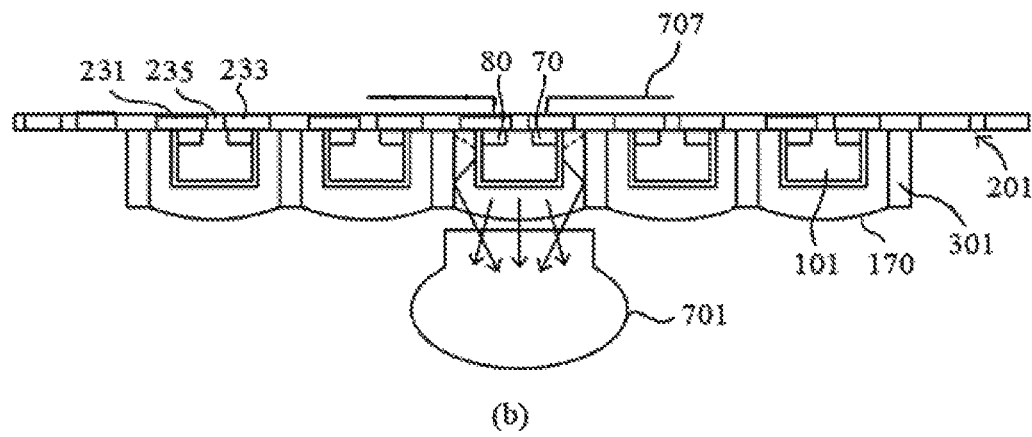
Figure 17:
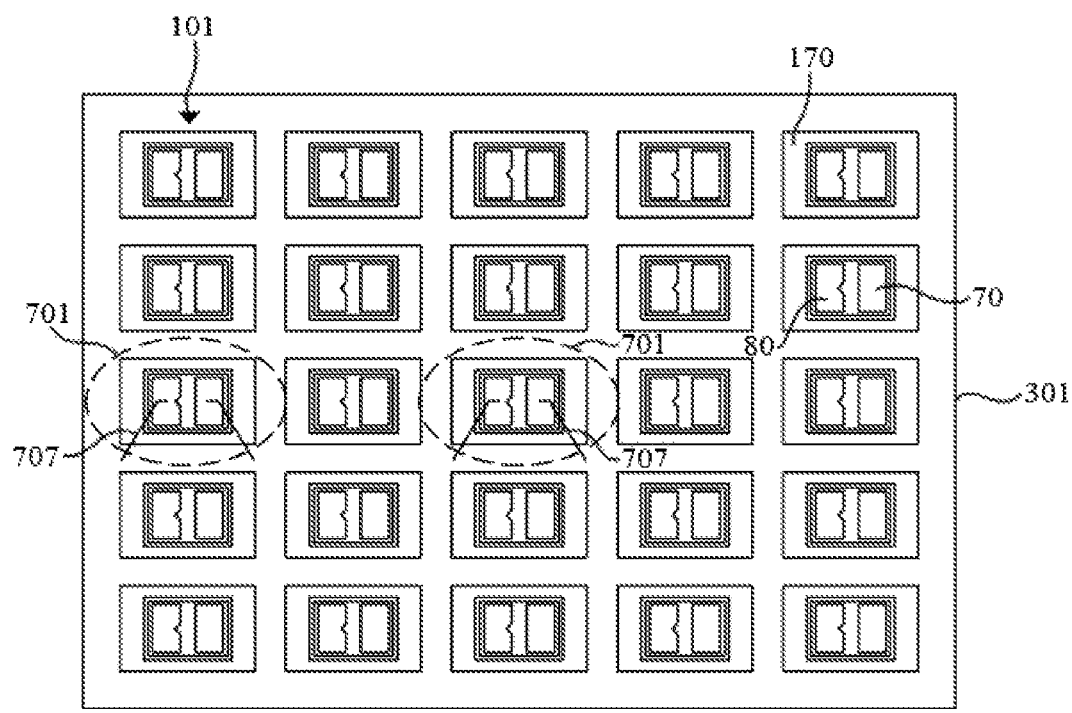

FIG. 16 and FIG. 17 are schematic illustrations showing exemplary embodiments of a method for testing a semiconductor light emitting device according to the present disclosure. In this semiconductor light emitting device testing method, an assembly of a mask 301 having a plurality of openings 305, a semiconductor light emitting chip 101 with electrodes 80, 70 and being placed in each of the openings 305, and an encapsulant 170 which is formed over each opening 305 and encompasses a semiconductor light emitting chip 101 in such a manner to expose the electrodes 80, 70 is prepared, as shown in FIG. 16a. Next, optical measuring equipment 701 is placed on the opposite side of the electrodes 80, 70, where the optical measuring equipment receives light from the semiconductor light emitting chip 101. A current is then applied to the electrodes 80, 70 of a selected semiconductor light emitting chip 101, and properties of light from the semiconductor light emitting chip 101 are measured by the optical measuring equipment 701.

FIG. 16b shows an embodiment where a base 201, a mask 301, an encapsulant 170 and a semiconductor light emitting chip 101 form an assembly together, and for testing, a current is applied to conductive parts 231, 233 of the base, which are electrically conductive with electrodes 80, 70 of the semiconductor light emitting chip 101.

When a semiconductor light emitting device is an assembly of a semiconductor light emitting chip 101 and an encapsulant 170, it is preferable that highly accurate optical measurements of the semiconductor light emitting device be carried out by receiving as much light as possible from the semiconductor light emitting device, and by measuring properties of the received light in absence of interference from the surroundings thereof. Therefore, it is desirable that the optical measuring equipment 701 adapted to measure the intensity of light receives not only light emitted towards the opposite side of the electrodes 80, 70, but also light emitted towards in a lateral direction of the semiconductor light emitting device.

In this embodiment, when the optical measurement is carried out, the mask 301 around the encapsulant 170 reflects a portion of light from the semiconductor light emitting chip 101 towards the optical measuring equipment 701, and the mask 301 blocks the light from entering the encapsulant 170 adjacent to it. An additional optical measuring equipment 705 may be placed on the side of the electrodes 80, 70 as shown in FIG. 16a, because, although not much, a small portion of the light could leak towards the electrodes 80, 70. In the case shown in FIG. 16b, there is a probe 707 being in contact with the conductive parts 231, 233 of the base 201, and the base 201 keeps light from leaking towards the electrodes 80, 70, meaning that no additional optical measuring equipment 705 is required. Therefore, it is not even necessary to put a semiconductor light emitting device to the test inside the optical measuring equipment 701, to confirm a substantially reduced light leakage. Moreover, the optical measuring equipment is capable of making optical measurements not only in absence of phosphorus interference from the surroundings thereof, but also with high precision nearly comparable to that of the optical measuring equipment 701 performing optical measurement on an individual semiconductor light emitting device that is put completely within the optical measuring equipment. In addition, to facilitate faster testing, either the optical measuring equipment 701 may be shifted, or an assembly of the mask 301, the encapsulant 170 and the semiconductor light emitting chip 101 may be shifted.

The aforementioned assembly of the mask 301, the encapsulant 170 and the semiconductor light emitting chip 101 may correspond to the assembly of the mask 301, the encapsulant 170 and the semiconductor light emitting chip 101 described in FIG. 7 to FIG. 15. An example of the optical measuring equipment 701 may include an integrating sphere. For instance, the integrating sphere 701, 705 is a spherical device having a hollow space inside, which measures properties of light having entered the hollow space. The integrating sphere 701, 705 has a projected neck portion through which light of a semiconductor light emitting device enters, and the inner peripheral surface of the integrating sphere 701, 705, including the neck portion, is coated with a material which evenly reflects light. The type or specific configuration of the integrating sphere may vary depending on the need. By way of example, an optical property measuring equipment may be installed on one side of the outer peripheral face of the integrating sphere 701, 705 in such a manner that the optical property measuring equipment is connected to the hollow space of the integrating sphere to be able to measure the properties of light collected inside the hollow space. The optical property measuring equipment is capable of measuring the luminance, wavelength, intensity, illuminance, spectral distribution, color temperature, color coordinates and so on of light from a semiconductor light emitting device, and the measurement(s) of at least one of these can be used as a basis for obtaining optical properties of the semiconductor light emitting device. Examples of the optical property measuring equipment include a spectrometer and a photo detector.

As another option, a diced wafer is attached to the top face of an elastic, adhesive blue or white tape, and the tape is expanded by a vacuum suction process, for example, to divide the wafer into a plurality of semiconductor light emitting chips which constitutes one unit for testing. A conventional testing method is then performed on the plurality of semiconductor light emitting chips arranged on the tape. Unlike this conventional testing method, the testing method according to the embodiment is performed on an assembly of the mask 301, the encapsulant 170 and the semiconductor light emitting chip 101 formed as one body, and is done in a convenient way as the assembly can be held or shifted or the optical measuring equipment 701 may be shifted during the test.

Referring to FIG. 17, according to another method for testing a semiconductor light emitting device of this exemplary embodiment, an optical measurement test can resolve conventional errors that are generally made while testing a semiconductor light emitting device inside the mask 301 and a semiconductor light emitting device on the corner thereof. For example, a test may be performed on each of a plurality of semiconductor light emitting devices being attached to a tape without a mask 301 and collectively enclosed by an encapsulant 170. Here, in an array of a plurality of semiconductor light emitting devices, lightly is generally uniformly scattered around those semiconductor light emitting devices located at the inner side of the tape. Meanwhile, light is scattered differently around those semiconductor light emitting devices on the corners of the tape, depending on whether there is a neighboring semiconductor light emitting device, and therefore, light measurements obtained from the inner side of the tape are different from light measurements obtained from the corners of the tape. However, if the semiconductor light emitting devices from the inner side of the tape as well as the semiconductor light emitting devices from the corners of the tape are placed individually in an integrating sphere and tested, substantially equal light measurements are obtained.

According to the semiconductor light emitting device testing method in this embodiment, a mask 301 surrounding each semiconductor light emitting device can serve as a reflector. As such, conditions stay the same at the inner side and on the corners, thereby allowing the optical measurements to be performed with higher accuracy and precision. Optionally, the mask 301 may be made of a metallic material or coated with a high-reflectance material, so as to get a reflector with better performance.

Figure 18:
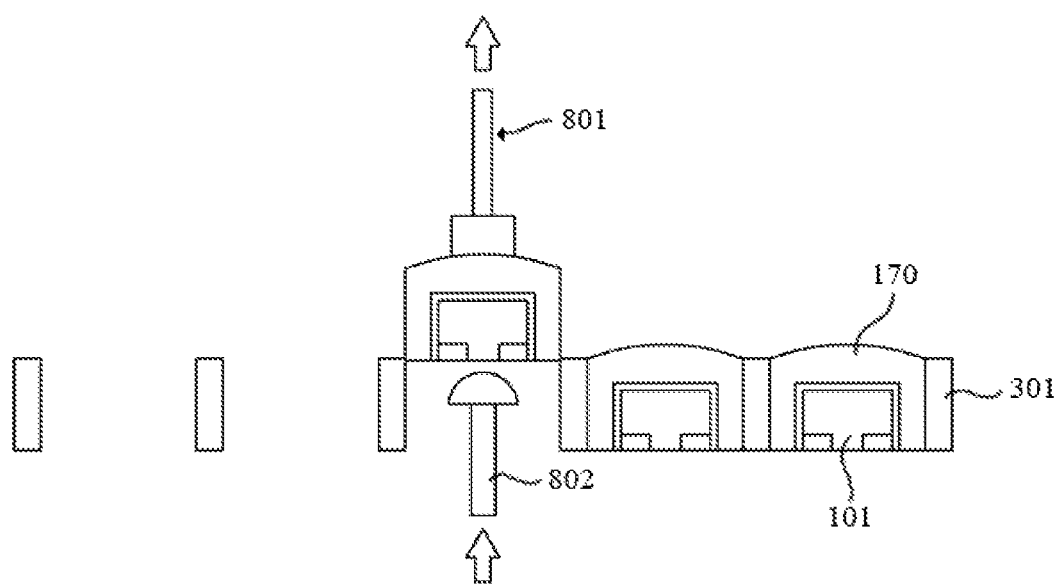
FIG. 18 is a schematic illustration for describing another exemplary embodiment of a method for manufacturing a semiconductor light emitting device according to the present disclosure.

FIG. 18 is a schematic illustration for describing another exemplary embodiment of a method for manufacturing a semiconductor light emitting device according to the present disclosure. The method in this embodiment includes a series of processes of supplying and curing an encapsulant 170, separating from a base 201 an assembly of a mask 301, the encapsulant 170 and a semiconductor light emitting chip 101, and separating each semiconductor light emitting device from the mask 301. The separation process can be accomplished by taking out a semiconductor light emitting device from the mask 301.

For example, in order to take out a semiconductor light emitting device from the mask 301, a sorter or other similar equipment may be used. Optionally, a pin 802 or rod (bar) strikes a semiconductor light emitting device (including 101, 170, 180) from the bottom, causing the semiconductor light emitting device to be pushed off the mask 301. This semiconductor light emitting device is then picked up using vacuum suction techniques or by electric clamping means 801, and carried. If a testing process is performed first as described in FIG. 16 and FIG. 17, semiconductor light emitting devices can be picked up and then sorted at the same time, based on the testing results. Due to a certain level of adhesion present between the mask 301 and the encapsulant 170, if an excessively strong force is applied for taking out the device, a semiconductor light emitting device thus obtained would have been damaged. Therefore, it can be envisaged to incorporate a structure for controlling an adhesive force between the mask 301 and the encapsulant 170 such that a semiconductor light emitting device of interest can easily be taken out from the mask 301.

Figure 19:
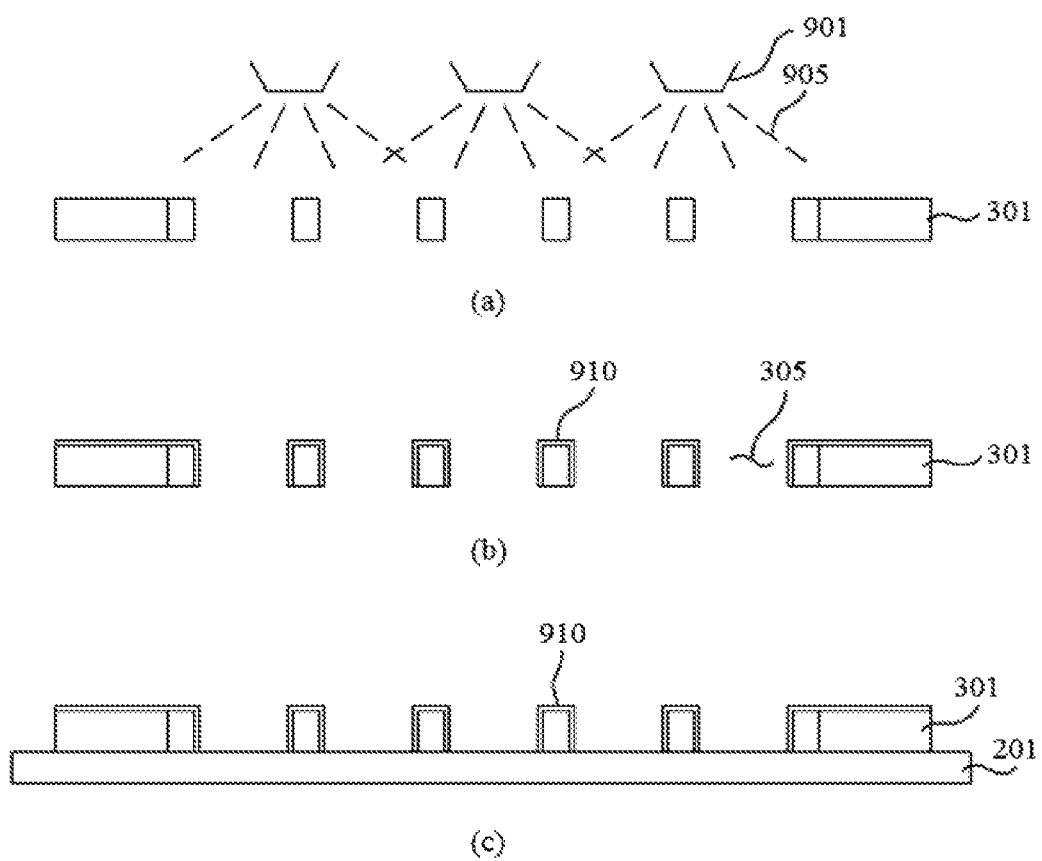
FIG. 19 to FIG. 21 are schematic illustrations for describing another exemplary embodiment of a method for manufacturing a semiconductor light emitting device according to the present disclosure.
Figure 20:
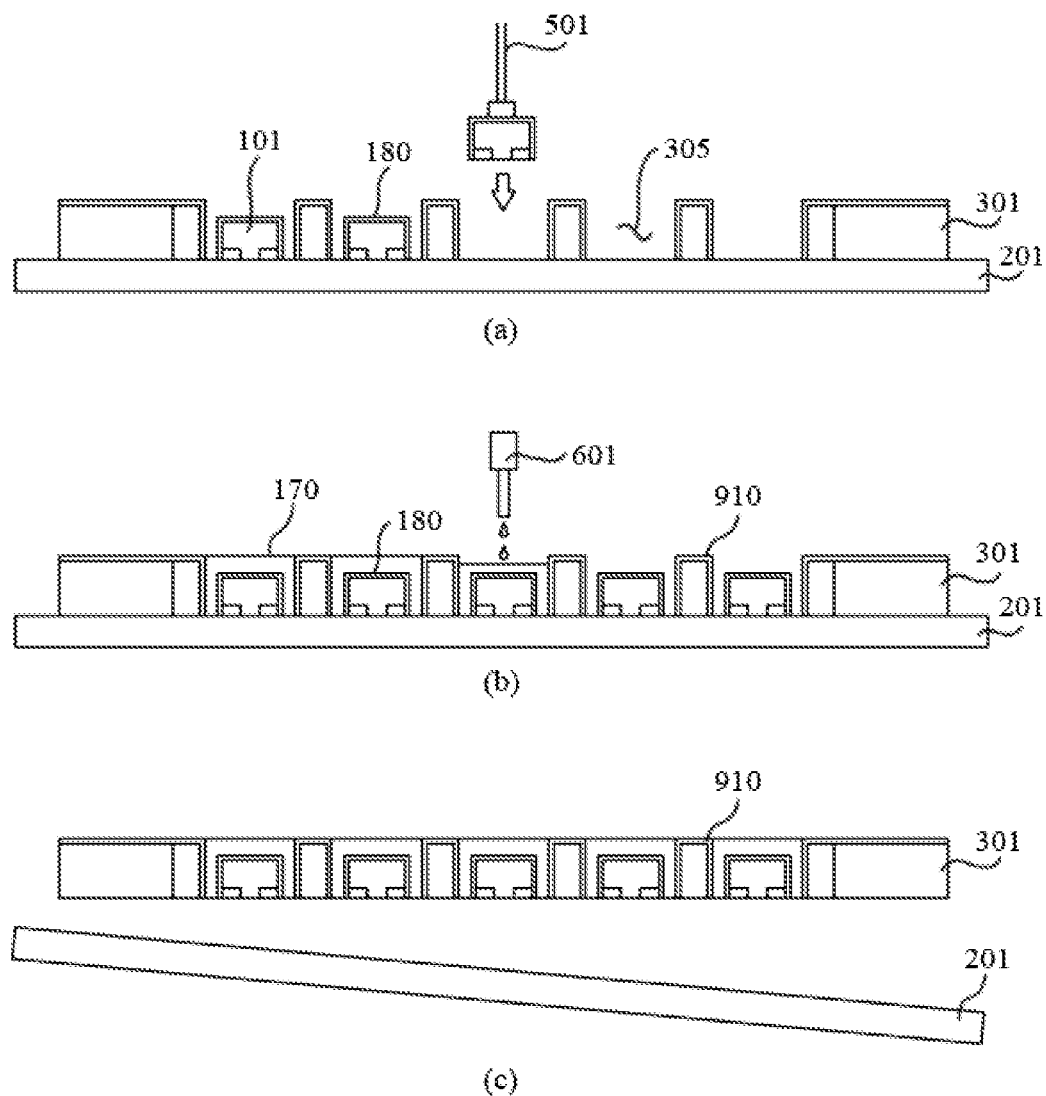
Figure 21:
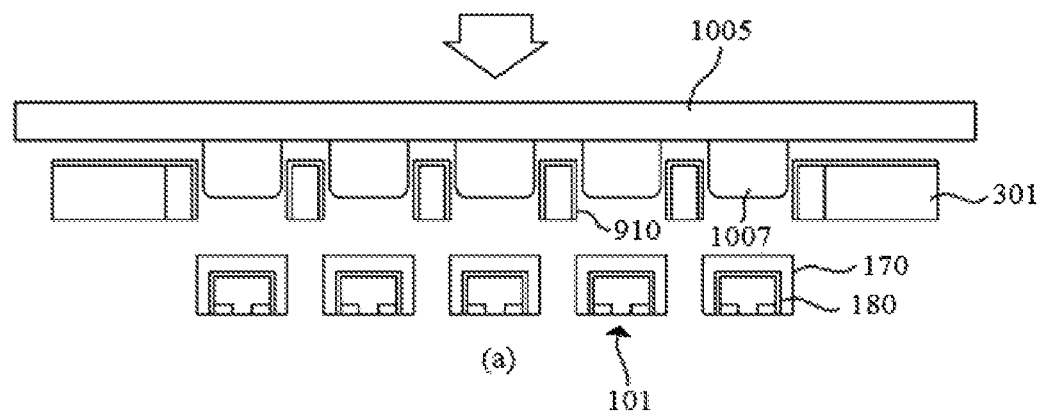
Figure 21:
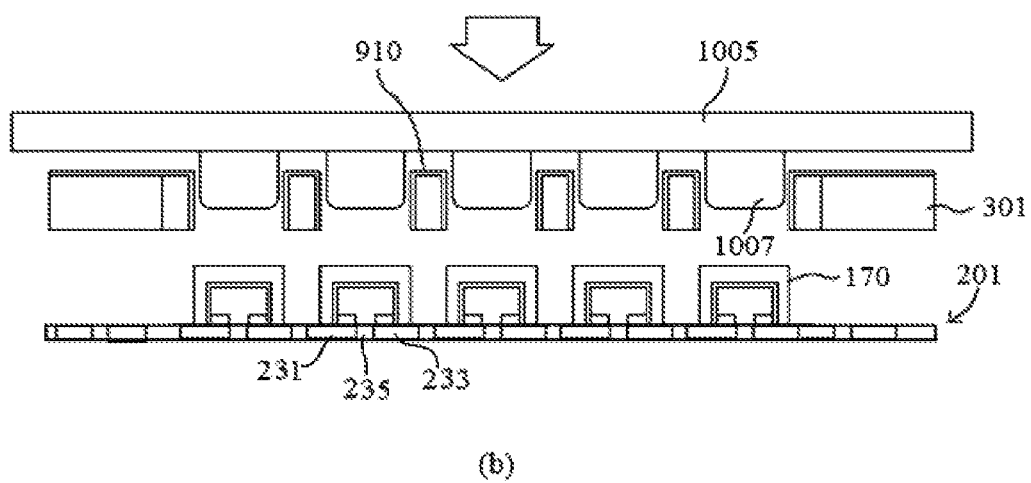

FIG. 19 to FIG. 21 are schematic illustrations for describing another exemplary embodiment of a method for manufacturing a semiconductor light emitting device according to the present disclosure. In this method for manufacturing a semiconductor light emitting device, a mask 301 having a plurality of openings 305 is placed on a base 201, and semiconductor light emitting chips 101 are placed on exposed portions of the base 201 through the openings 305, respectively. The mask 301 used herein has a bonding strength control film on the surface to allow a semiconductor light emitting chip 101 to be taken out from the mask without damage. Examples of the bonding strength control film includes a layer formed across the surface of the mask 301, layers formed on the surface at (ir)regular intervals, or simply bonding strength control material particles adhered on the surface of the mask 301. Next, an encapsulant 170 for covering the semiconductor light emitting chips 101 is supplied to the openings 305, respectively, making contact with the bonding strength control film. A semiconductor light emitting chip 101 combined with the encapsulant 170 is then taken out from the mask 301.

The following will now explain each process in detail.

For example, the bonding strength control film 910 is a release coating layer 910 formed on the surface of the mask 301. The release coating layer 910 can be obtained by spraying as shown in FIG. 19a, or by painting. This release coating layer may be applied onto the mask 301 before the mask is placed on the base 201. Optionally, the mask 301 is first placed on the base 201 and then a release coating layer can be formed on the mask 301. In this case, the release coating layer is applied onto the top face of the mask 301 as well as the top face of the base 201. The mask 301 can be made of a material such as plastic, a metal or the like, and the encapsulant 170 can be made of a material such as a resin, silicon or the like. Therefore, the release coating layer is preferably made of a material which exhibits releasing or lubricant properties as a resin or silicon is bonded to a metal or plastic, and which has heat resistance and electrical insulating properties. A suitable releasing material can be selected from commercially available products. The releasing material is applied by spraying for example, and may be available in aerosol form.

In a process of providing a mask 301 and semiconductor light emitting chips 101 to the base 201, it does not matter which one is first placed, that is, the mask 301 may be first placed on the base 201, followed by the semiconductor light emitting chips 101, or vice versa. However, as in this embodiment, it is preferable that the mask 301 be first provided on the base 201, and the semiconductor light emitting chips 101 be placed later, by means of a device carrier 501, respectively on exposed portions of the mask 301 through openings 305 in the mask 301, such that those benefits described in the embodiments of FIG. 7 to FIG. 15 can be offered. Optionally, a semiconductor light emitting chip 101 having a phosphor layer 180 on the surface may be available for use as a device. Next, the encapsulant 170 is supplied to each opening 305 using a dispenser 601 as shown in FIG. 20b, or by pressing down the encapsulant 170 over the chips. The base 201 is then separated out as shown in FIG. 20c.

In the following step, each semiconductor light emitting device is taken out from the mask 301. This can be accomplished using the same method as in FIG. 18. Optionally, referring to FIG. 21, an embossed plate 1005 having bumps 1007 in positions corresponding to the openings 305, respectively, can be used for taking out many semiconductor light emitting devices. A plurality of semiconductor light emitting devices can be pushed out at once by these bumps 1007 as shown in FIG. 21a, or a tape may be applied to the opposite side of the embossed plate 1005 beforehand to do the same. The bump 1007 has suitable faces adapted to protect a semiconductor light emitting device from damage, and the presence of a release coating layer allows that the semiconductor light emitting chip is taken out with an adequate amount of force, instead of a great amount of force. Meanwhile, a testing process may be performed before the semiconductor light emitting devices are taken out, as shown in FIG. 16 and FIG. 17. Although the bonding strength between the release coating layer 910 and the encapsulant 170 is weaker than the bonding strength between the mask 301 and the encapsulant 170, the bonding strength between the release coating layer 910 and the encapsulant 170 is sufficiently strong to keep them bonded to each other during the testing process.

When the base 201 described in FIG. 16 is applied, the mask 301 and the base 201 may be adhered or bonded, without using the clamp 401 to bring them in contact with each other, as shown in FIG. 21b. Here, the base 201 includes a plurality of conductive parts 231, 233, and an insulating part 235 235 interpositioned between the plurality of conductive parts 231, 233. The plurality of conductive parts 231, 233 have exposed top and bottom faces, and two electrodes 80, 70 of each semiconductor light emitting chip 101 are bonded to different conductive parts 231, 233, respectively. In this case, a process of taking out a semiconductor light emitting device from the mask 301 is equivalent to taking out an assembly of the encapsulant 170, the semiconductor light emitting chip 101 and the base 201 from the mask 301.

Figure 6:
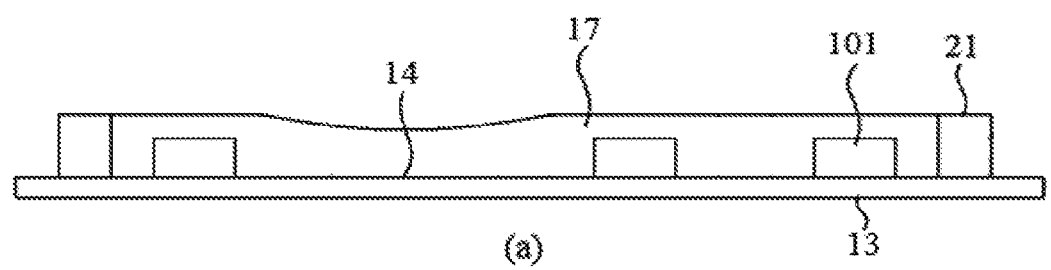
FIG. 6 is a schematic illustration for describing the problems that can occur while forming an encapsulant collectively for a plurality of semiconductor light emitting chips.
Figure 6:
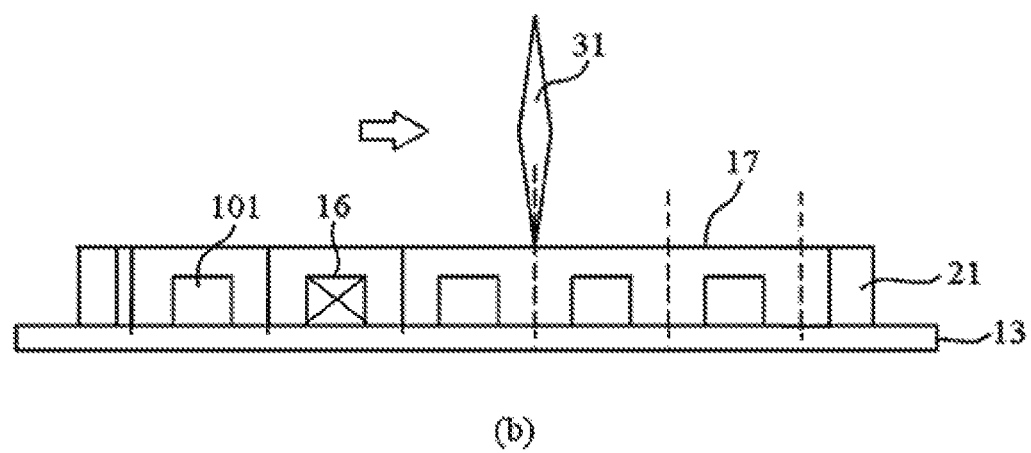

Referring again to FIG. 6, in the case of sawing the encapsulant 17, those cut faces of the encapsulant 170 cut with a cutter 31 have a lower light extraction efficiency as they were cut and sectioned with the cutter 31. Moreover, if semiconductor light emitting chips 101 are out of alignment even slightly on a tape (see 13 in FIG. 3), the cutting process using the cutter 31 may cause a number of defects in a semiconductor light emitting device obtained.

In the embodiment shown in FIG. 19 and FIG. 21, however, the presence of the bonding strength control film or release coating layer 910 allows the encapsulant 170 to be easily taken out from the mask 301 without damage. This is because the surface of the encapsulant 170 is not cut or sectioned with a cutter during the sawing process, and therefore, it does not experience a decrease in the light extraction efficiency. In addition, with the mask 301 serving as a guide for aligning semiconductor light emitting chips 101, the alignment accuracy is increased, which is led to reduced detects caused by inaccurate alignment.

Figure 22:
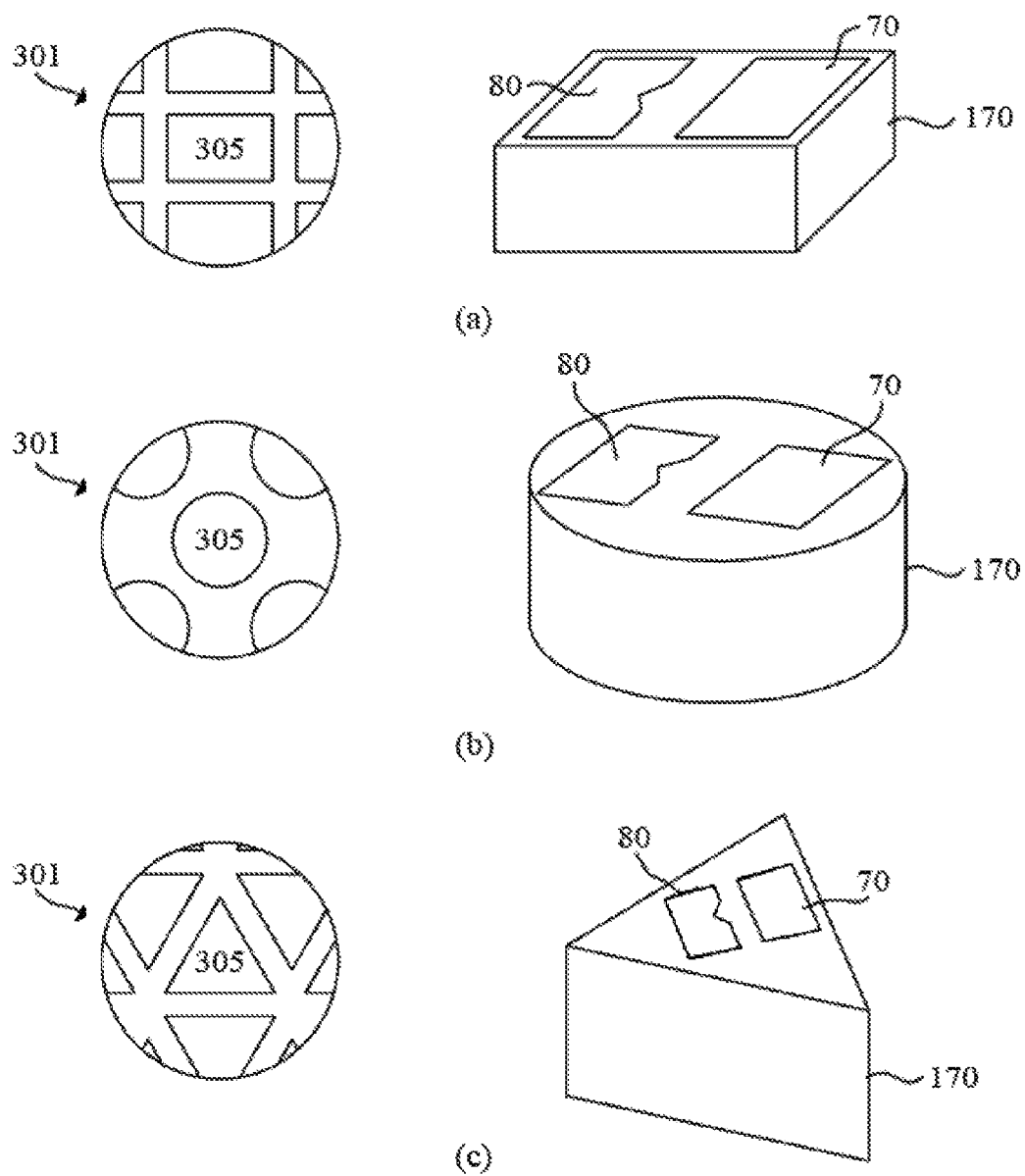
FIG. 22 is a schematic illustration for describing another exemplary embodiment of a method for manufacturing a semiconductor light emitting device according to the present disclosure.

FIG. 22 is a schematic illustration for describing another exemplary embodiment of a method for manufacturing a semiconductor light emitting device according to the present disclosure. A semiconductor light emitting device obtained has a matching shape with an opening 305 formed in a mask 301. The opening 305 in the mask 301, if seen in a plan view, may have a polygonal shape, such as, a quadrangular shape (see FIG. 22a) or a triangular shape (see FIG. 22c), or may be transformed into a circular shape (see FIG. 22b) or an oval shape. Also, the encapsulant 170 if seen in a plan view may have a polygonal shape, such as a quadrangular shape or a triangular shape, or may have a non-polygonal shape, such as, a circular shape or an oval shape. The shape of the encapsulant 170 can affect an amount and direction of light emitted from a semiconductor light emitting device.

Figure 23:
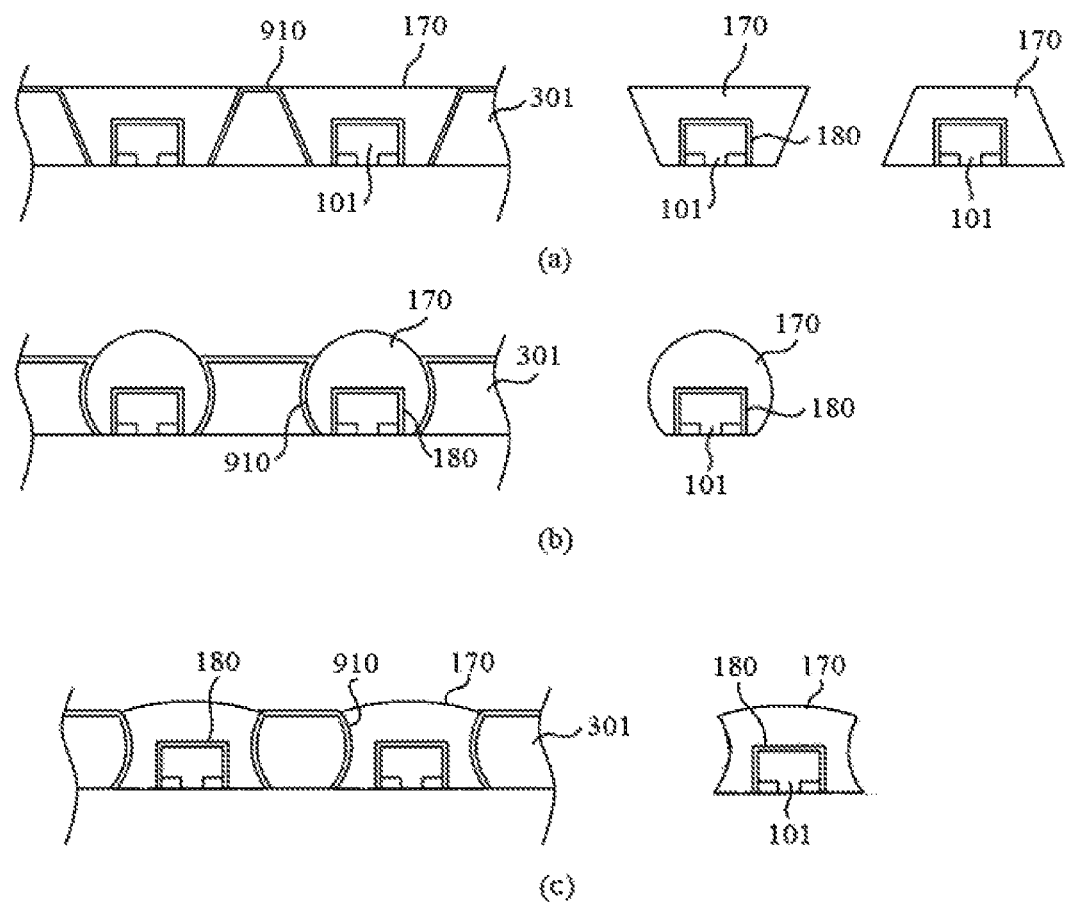
FIG. 23 is a schematic illustration for describing another exemplary embodiment of a method for manufacturing a semiconductor light emitting device according to the present disclosure.

FIG. 23 is a schematic illustration for describing another exemplary embodiment of a method for manufacturing a semiconductor light emitting device according to the present disclosure. Again, a semiconductor light emitting device obtained has a matching shape with an opening 305 formed in a mask 301. In this embodiment, the opening 305 in the mask 301, if seen in a sectional view, may have a shape with slanted sides or a trapezoid shape (see FIG. 23a), or may have a concave or convex curved side (see FIG. 23b and FIG. 23c). Accordingly, an encapsulant 170 may also have a section face in a trapezoid shape or in a concave or convex curved side. As such, to meet specification requirements, the encapsulant 170 may be formed in lens, and contribute to obtaining a desired spectral distribution. Referring to FIG. 23a, electrodes 80, 70 may be arranged on the long side or the short side of the trapezoid shape. Referring to FIG. 23b, the shape of the encapsulant 170 on the opposite side of the electrodes 80, 70 may have a convex or concave curved shape by controlling an encapsulant 170 dispensing process.

The encapsulant 170 in FIG. 23b and FIG. 23c are resilient such that it can be taken out from the mask 301 having a release coating layer 910.

Figure 24:
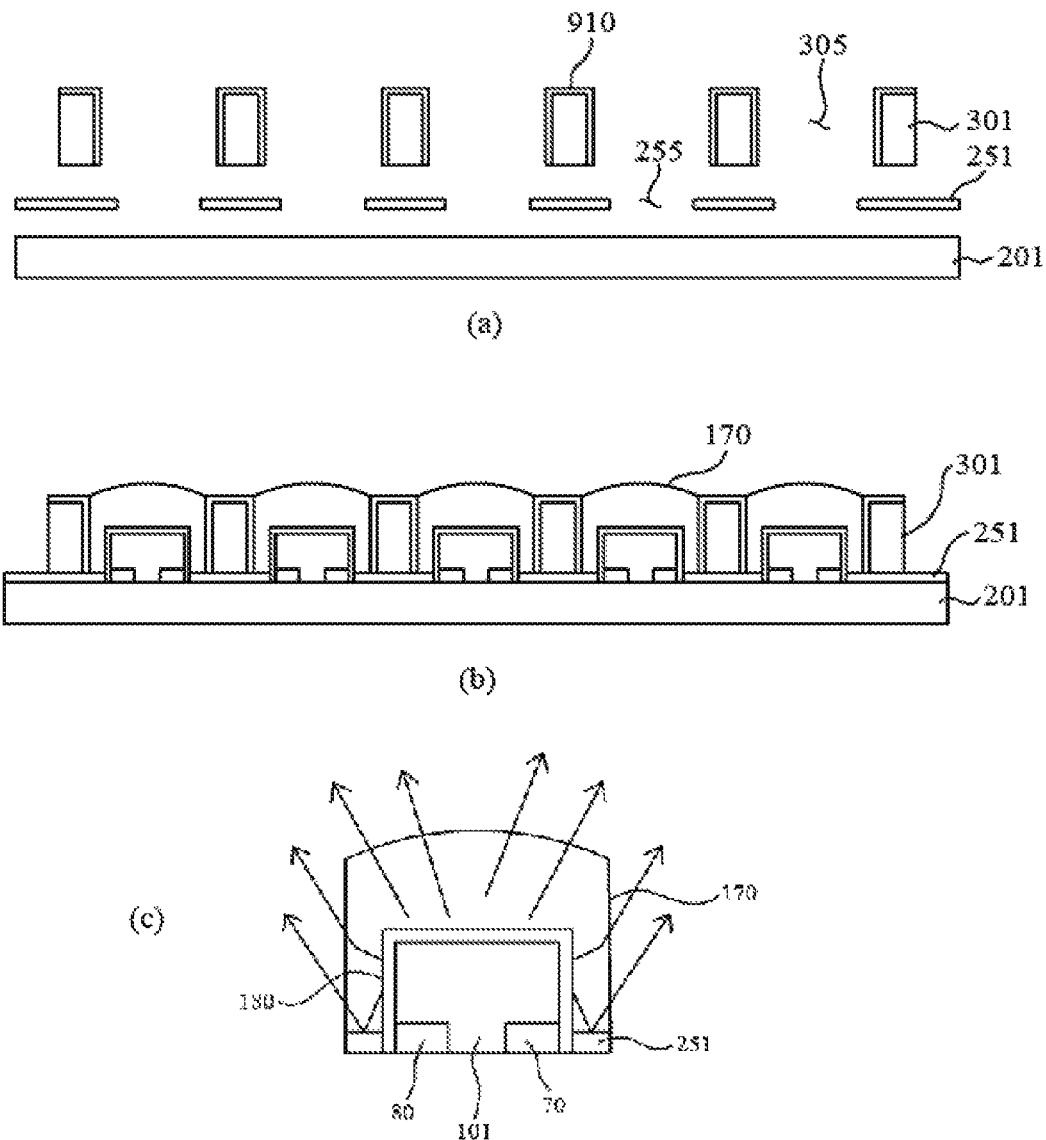
FIG. 24 is a schematic illustration for describing a semiconductor light emitting device and another exemplary embodiment of a method for manufacturing the same according to the present disclosure.

FIG. 24 is a schematic illustration for describing a semiconductor light emitting device and another exemplary embodiment of a method for manufacturing the same according to the present disclosure. Firstly, as shown in FIG. 24a, a mask 301 having a release coating layer 910 is prepared, and a reflective film 261 is arranged between the base 201 and the mask 301, in alignment with them. The reflective film 251 with a light reflective nature is provided with openings 255 that are located corresponding to the openings 305 of the mask 301 and have a smaller area. Next, a device carrier 501 places semiconductor light emitting chips 101 in exposed portions of the base 201 through the openings 255 of the reflective film 251, and an encapsulant 170 is formed over them. Here, the reflective film 251 is bonded to the encapsulant 170 (see FIG. 24b). After that, as shown in FIG. 24c, the base 201 is removed, a testing process is performed, and individual semiconductor light emitting devices are taken out from the mask 301. The reflective film 251 is formed on the side of the electrodes 80, 70 in such a manner that it does not cover the electrodes 80, 70, thereby exposing them, but covers the encapsulant 170 to reflect light. Optionally, a reflective film may be patterned on the surface of a base 201 especially when the base 201 is combined with an encapsulant 170 and a semiconductor light emitting chip 101 in one body.

Figure 25:
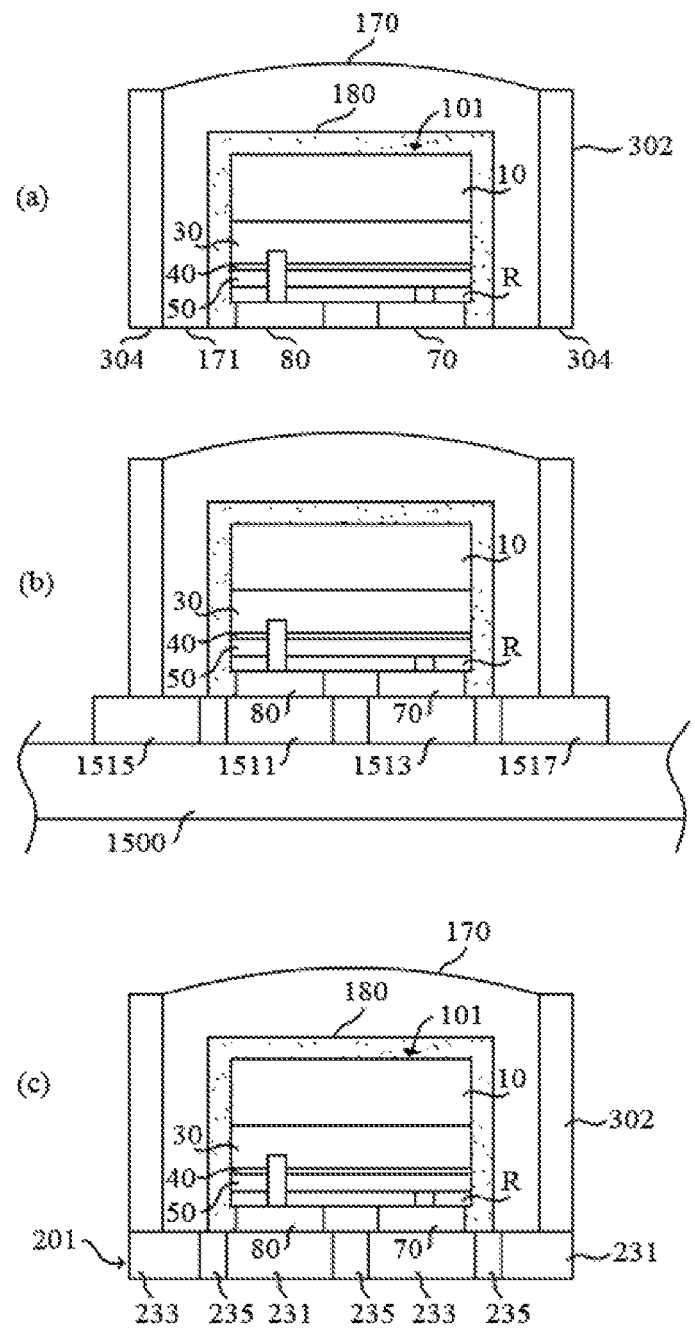
FIG. 25 is a schematic illustration for describing further exemplary embodiments of a semiconductor light emitting device according to the present disclosure.

FIG. 25 is a schematic illustration for describing further exemplary embodiments of a method for manufacturing the same according to the present disclosure. A semiconductor light emitting device includes a semiconductor light emitting chip 101, an encapsulant 170, and metal bonded parts 302. The semiconductor light emitting chip 101 includes a plurality of semiconductor layers 30, 40, 50 and electrodes 80, 70 for delivering a current to the plurality of semiconductor layers 30, 40, 50. The plurality of semiconductor layers 30, 40, 50 is composed of a first semiconductor layer 30 having a first conductivity type, a second semiconductor layer 50 having a second conductivity type different from the first conductivity type, and an active layer 40 interpositioned between the first and second semiconductor layers, for generating light by electron-hole recombination. The encapsulant 170 encompasses the semiconductor light emitting chip 101 in a manner that the electrodes 80, 70 of the chip are exposed. The metal bonded parts 302 are fixed to the encapsulant 170, at positions a certain distance away from the semiconductor light emitting chip 101. Also, each metal bonded part 302 has a bottom face 304 exposed in the direction where the electrodes 80, 70 are exposed. To make the exposed faces of the electrodes 80, 70 as well as the bottom faces 304 of the metal bonded parts 302 contact the outside, the exposed faces of the electrodes 80, 70, the bottom face 171 of the encapsulant 170 around the electrodes 80, 70, and the bottom faces 304 of the metal bonded parts 302 are all designed to form one surface together in line. Therefore, the presence of the metal bonded parts 302 improves the bonding strength, as compared with the case where the electrodes 80, 70 are the only ones bonded to the outside.

The semiconductor light emitting chip 101 is a flip chip as shown in FIG. 10, and its two electrodes 80, 70 are exposed, respectively, from the encapsulant 170. Optionally, the semiconductor light emitting chip 101 may be any chip, e.g., a vertical chip, where the electrodes can be exposed from the encapsulant 170, but still a flip chip is regarded as a more effective one. The semiconductor light emitting chip 101 may include a phosphor layer 180 designed to expose two electrodes 80, 70 of the chip and to surround the plurality of semiconductor layers 30, 40, 50. The phosphor layer 180 may be the one described in FIG. 14a. The phosphor layer 180 is also encompassed by the encapsulant 170 examples of which are illustrated in the foregoing embodiments. The encapsulant 170 includes a bottom face 171 through which the two electrodes 80, 70 are exposed, a top face opposite to the two electrodes 80, 70, and side faces for connecting the bottom and top faces.

As stated above in the preceding passage, the exposed faces of the electrodes 80, 70, the bottom face 171 of the encapsulant 170 around the electrodes 80, 70, and the bottom faces 304 of the metal bonded parts 302 are all designed to form one surface together in line. This means that the electrodes 80, 70 and the bottom faces of the metal bonded parts 302 are arranged alongside, preferably well enough to smoothly abut an outer surface or submount, without any uneven areas as shown in FIG. 25a. Needless to say, the present disclosure does not exclude other embodiments where the bottom face 171 of the encapsulant 170 and the bottom faces 304 of the metal bonded parts 302 have a minor height difference, but those embodiments shown in FIG. 25 where these bottom faces are bonded to an outer surface or submount without creating a height difference or unevenness are certainly preferred. In other words, it is preferable that the exposed faces of the electrodes 80, 70 and the bottom faces 304 of the metal bonded parts 302 be located substantially the same distances away from a vertex of the top face of the encapsulant 170, or the exposed faces of the electrodes 80, 70, the bottom face 171 of the encapsulant 170 and the bottom faces 304 of the metal bonded parts 302 all form a flat surface together. Still optionally, another layer such as a reflective layer may be arranged on the bottom face of the encapsulant 170. In such a case, the exposed faces of the electrodes 80, 70, the face of another layer (e.g., reflective layer) around the electrodes 80, 70, and the bottom faces 304 of the metal bonded parts 302 make up a flat surface together.

The semiconductor light emitting device shown in FIG. 25a can be mounted on a submount 1500 such as a PCB as shown in FIG. 25b. Here, two electrodes 80, 70 of a semiconductor light emitting chip 101 and metal bonded parts 302 can be respectively bonded onto metallic pads 1511, 1513, 1515, 1517 formed on the surface of the submount 1500. While the present disclosure does not exclude embodiments where non-metal bonded parts (e.g., plastic) are used instead of the metal bonded parts 302, it would be desirable to use metal bonded parts 302 for improving the bonding strength especially when there is a submount 1500 or metallic pads 1511, 1513, 1515, 1517 outside. In FIG. 25b, an adhesive may be applied or other bonding techniques without an adhesive may be used between the two electrodes 80, 70 of the semiconductor light emitting chip 101 and the metal bonded parts 302, and the metallic pads 1511, 1513, 1515, 1517 of the submount 1500.

Further optionally, as shown in FIG. 25c, a plate 201 may be bonded to the electrodes 80, 70. The plate 201 includes a first conductive part 231, a second conductive part 233, and an insulating part 235 interpositioned between the first conductive part 231 and the second conductive part 233. The first conductive part 231, the insulating part 235 and the second conductive part 233 are arranged in an alternating manner, and the first and second conductive parts 231, 233 having exposed top and bottom faces can serve as passages for electrical conduction as well as for heat protection. Those two electrodes 80, 70 of the semiconductor are bonded to the first conductive part 231 and the second conductive part 233, respectively, as shown in FIG. 25c, and electrode separating lines are preferably located, roughly corresponding to the insulating part 235. Meanwhile, the metal bonded parts 302 make metal-to-metal bonding with the first conductive part 231 and the second conductive part 233. Optionally, the metal bonded parts 302 may bonded to the insulating part 235. Accordingly, a semiconductor light emitting device can be an assembly of the semiconductor light emitting chip 101, the encapsulant 170, the metal bonded parts 302 and the plate 201.

The metal bonded part 302 may have a ring shape formed around the lateral sides of the encapsulant 170. When this is the case, the occurrence of a short in the two electrodes 80, 70 due to the metal bonded parts 302 should be avoided either by modifying lengths and/or widths of the first and second conducive parts 231, 233 bonded to the two electrodes 80, 70, respectively, such that the electrodes may not be in contact with the metal bonded parts 302, or by applying an insulating adhesive in order to bond the metal bonded parts 302 to the plate 201. In another embodiment, the metal bonded parts 302 may include a first metal part and a second metal part spaced apart from the first metal part, with the first metal part being fixed to one side of the encapsulant 170 and the second metal part being fixed to the other side of the encapsulant 170.

Figure 26:
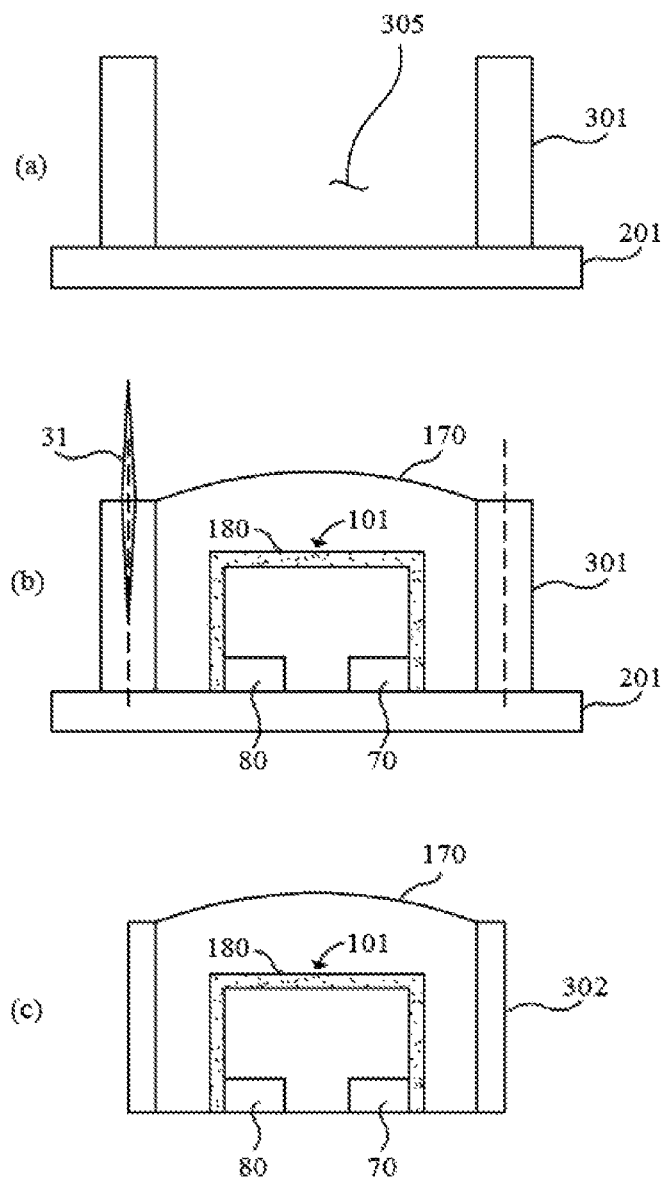
FIG. 26 is a schematic illustration for describing another exemplary embodiment of a method for manufacturing a semiconductor light emitting device according to the present disclosure.

FIG. 26 is a schematic illustration for describing another exemplary embodiment of a method for manufacturing a semiconductor light emitting device according to the present disclosure. This is an alternative option for the manufacturing method shown in FIG. 25a. Firstly, a dam 301 having an opening 305 is provided on either side of a base 201, and a semiconductor light emitting chip 101 is placed on an exposed portion of the base 201 through the opening 305. For instance, a dam 301 having an opening 305 is first provided on either side of a base 201 as shown in FIG. 26a, and then a semiconductor light emitting chip 101 is placed on an exposed portion of the base 201 through the opening 305 as shown in FIG. 26b. Optionally, the semiconductor light emitting chip 101 can be first placed on the base 201, and the dams 301 are provided later.

Further, as shown in FIG. 26b, an encapsulant 170 is supplied to the opening 305. This is followed by cutting the dams along their center lines. This cutting process can be accomplished using a cutter 31 by cutting the entire dam 301 from top to bottom. Optionally, the dam 301 may be cut or scribed to a certain depth using the cutter 31 or other scribing equipment (e.g., a laser scribing device), and the rest of the dam 301 is then subjected to a breaking process. This embodiment does not involve sawing the encapsulant 170, thereby preventing a decrease in the light extraction efficiency observed in the encapsulant 170 after it is cut with the cutter 31. Here, it is possible to cut the dam 301 as well as the base 201. Optionally, only a portion of the base 201 may be cut with the cutter 31, and the base 201 may be removed. In this manner, as shown in FIG. 26c, a semiconductor light emitting device including the semiconductor light emitting chip 101, the encapsulant 170 and those cut dams 302 is manufactured. Here, examples of a material for the dam 301 include metals, non-metals, or metal surface-plated materials. The metal bonded part 302 described above in FIG. 25 is obtained by making a dam 302 with a metal and cutting the dam 302 (i.e. a cut dam).

Figure 27:
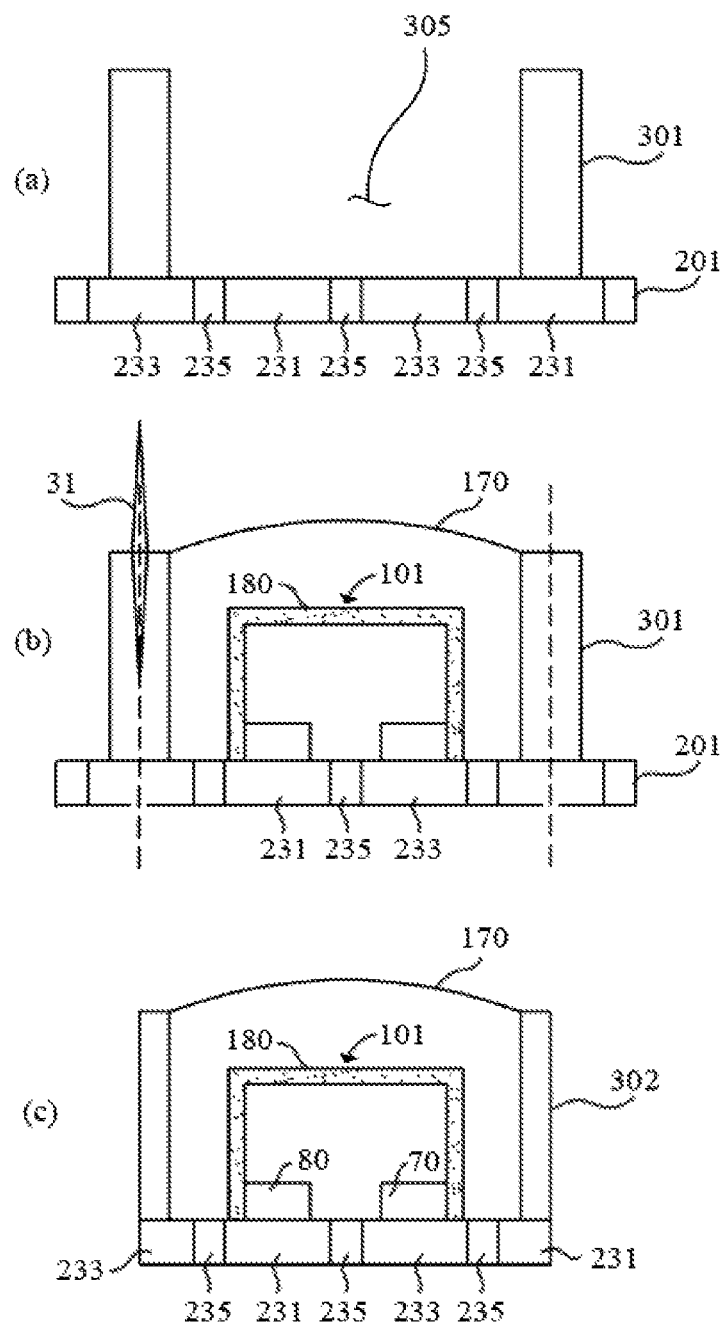
FIG. 27 is a schematic illustration for describing another exemplary embodiment of a method for manufacturing a semiconductor light emitting device according to the present disclosure.

FIG. 27 is a schematic illustration for describing another exemplary embodiment of a method for manufacturing a semiconductor light emitting device according to the present disclosure. This is an alternative option for the manufacturing method shown in FIG. 25c.

Firstly, a dam 301 having an opening 305 is provided on either side of a base 201, and a semiconductor light emitting chip 101 is placed on an exposed portion of the base 201 through the opening 305. For instance, a dam 301 having an opening 305 is first provided on either side of a base 201 as shown in FIG. 27a, and then a semiconductor light emitting chip 101 is placed on an exposed portion of the base 201 through the opening 305 as shown in FIG. 27b. Optionally, the semiconductor light emitting chip 101 can be first placed on the base 201, and the dams 301 are provided later.

The base 201 includes a first conductive part 231, a second conductive part 233, and an insulating part 235 interpositioned between them. Two electrodes 80, 70 of the semiconductor light emitting chip 101 are bonded to the first conductive part 231 and the second conductive part 233, respectively. If the dam 301 is made of a metal, it is preferable that lengths or widths of the first and second conductive parts 231, 233 to which those two electrodes 80, 70 are bonded, respectively, be modified such that the electrodes may not be in contact with the metallic dam 301, or that an insulating adhesive be applied between the metallic dam 301 and the first and second conductive parts 231, 233 to which those two electrodes 80, 70 are bonded, respectively. Meanwhile, if the dam 301 is made of a non-metal, it is safe that the first and second conductive parts 231 to which those two electrodes 80, 70 are bonded, respectively, be in contact with the dam 301.

Further, as shown in FIG. 27b, an encapsulant 170 is supplied to the opening 305. This is followed by cutting the dams 301. At this time, the dam 301 and the base 201 are cut together. This cutting process can be accomplished using a cutter 31 by cutting entirely, e.g., from the top face of the dam 301 down to the bottom face of the base 201. Optionally, the dam 301 may be cut or scribed to a certain depth using the cutter 31 or other scribing equipment, and the rest of the dam is then subjected to a breaking process. In this manner, as shown in FIG. 27c, a semiconductor light emitting device including the semiconductor light emitting chip 101, the encapsulant 170, the metal bonded parts 302 (e.g., cut dams) and the base 201 is manufactured.

Figure 28:
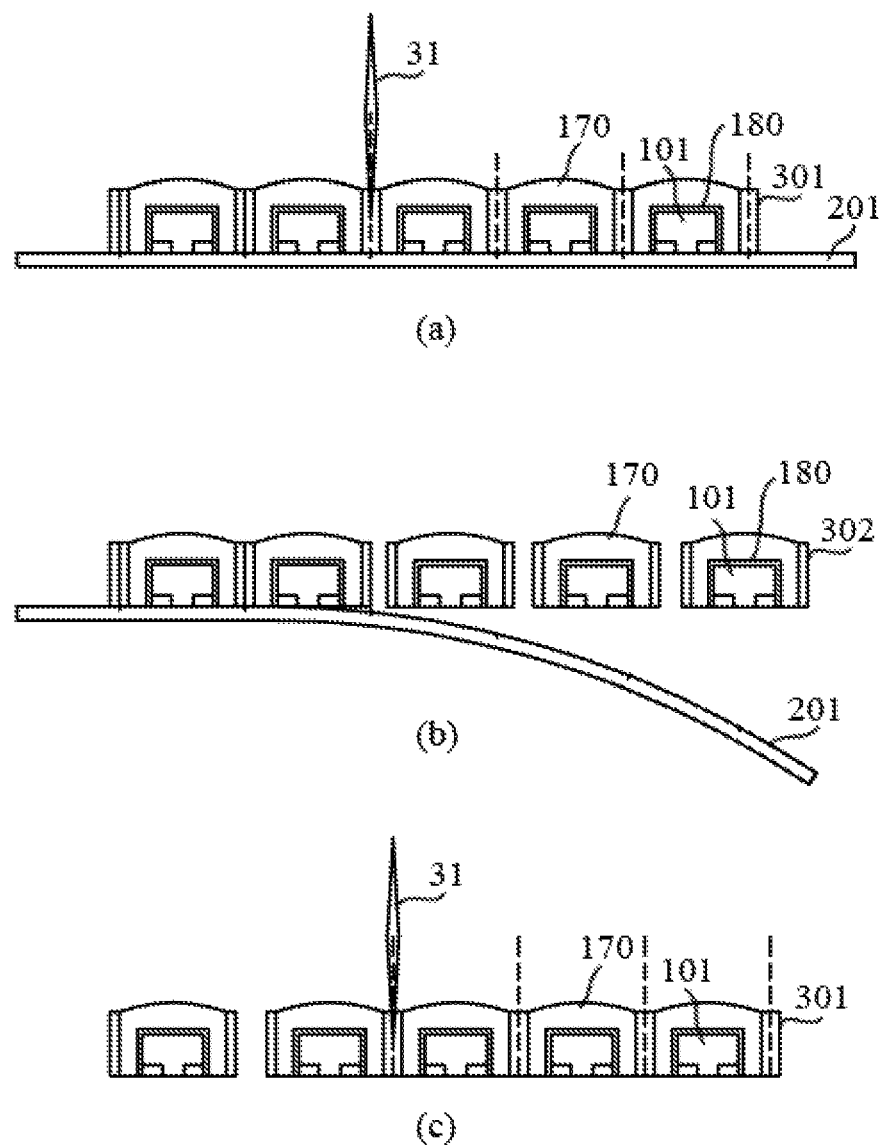
FIG. 28 is a schematic illustration for describing another exemplary embodiment of a method for manufacturing a semiconductor light emitting device according to the present disclosure.

FIG. 28 is a schematic illustration for describing another exemplary embodiment of a method for manufacturing a semiconductor light emitting device according to the present disclosure. For example, as shown in FIG. 28a, a mask (dam) 301 described in FIG. 7 to FIG. 17 is prepared on a base 201 that is formed of an adhesive or sticky tape (e.g., a blue tape), a plastic or metal plate, and the previously described device carrier 501 places semiconductor light emitting chips 101 respectively on exposed portions of the base 201 through a plurality of openings 305. While it is possible to place the semiconductor light emitting chips 101 on the base 201 first, prepare the mask 301, and then supply the encapsulant 170, it is preferable that the mask 301 be prepared first to have the benefits described in the embodiments of FIG. 7 to FIG. 17.

Next, the encapsulant 170 is supplied to each opening 305 by dispensing or pressing across the chips, and cured. The base 201 is then removed or separated to produce an assembly of the semiconductor light emitting chip 101, the encapsulant 170 and the mask 301. This assembly is subjected to a testing process as described in FIG. 16 and FIG. 17. Later, the base 201 is bonded back to the assembly, or a clamp may be used to make the base 201 and the assembly abut against each other. Optionally, the assembly may be attached to a component such as a dicing tape. Further, the mask 301 is cut as shown in FIG. 28a. This cutting process may be accomplished using the method described in FIG. 26. If the mask is made of a metal, those cut masks can become metal bonded parts 302. At this time, although the base 201 can also be cut together with the mask, the base 201 is not fully cut, but the mask is fully cut to get an individual, separated device. Once the base 201 is removed as shown in FIG. 28b, an individual, separated semiconductor light emitting device is obtained. Optionally, it is also possible to attach an additional tape on the opposite side of the base 201 to ensure that individual semiconductor light emitting devices are not scattered.

Unlike the example shown in FIG. 28a, FIG. 28c illustrates that the base 201 can be first removed from an assembly of the semiconductor light emitting chip 101, the encapsulant 170 and the mask 301, and then the mask 301 can be cut. After removing the base 201 and before cutting the mask 301, a component like a UV-tape can be applied to the assembly of the semiconductor light emitting chip 101, the encapsulant 170 and the mask 301. Even after the mask 301 is cut, individual semiconductor light emitting devices will be stuck on the UV-tape instead of being scattered. This makes it possible to avoid the burden of rank-sorting and packing. In addition, since the UV-tape loses its adhesion after UV-irradiation, the semiconductor light emitting devices can be easily separated from the UV-tape.

Figure 29:
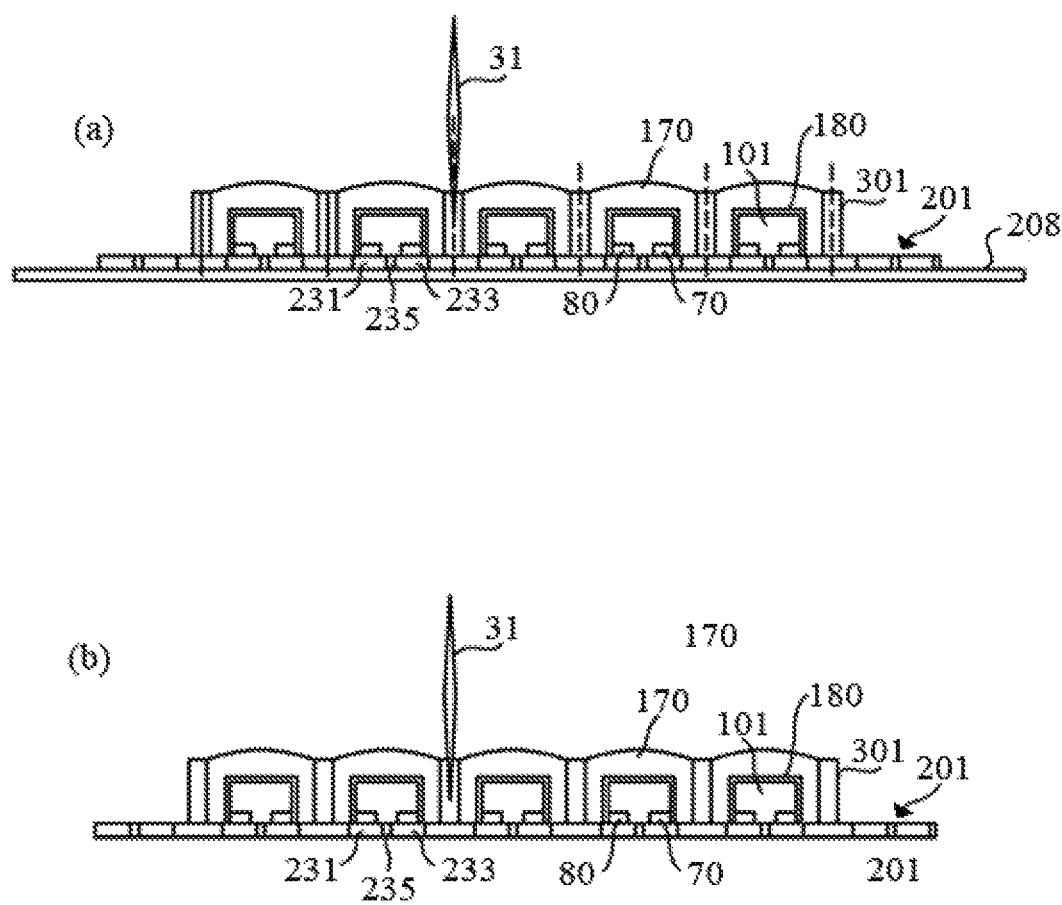
FIG. 29 is a schematic illustration for describing another exemplary embodiment of a method for manufacturing a semiconductor light emitting device according to the present disclosure.

FIG. 29 is a schematic illustration for describing another exemplary embodiment of a method for manufacturing a semiconductor light emitting device according to the present disclosure. For example, as shown in FIG. 29a, a mask (dam) 301 described in FIG. 7 to FIG. 17 is provided on either side of a base 201 that is formed of alternating first conductive part 231, insulating part 235 and second conductive part 233, and the previously described device carrier 501 places semiconductor light emitting chips 101 on exposed portions of the base 201 through a plurality of openings 305. Next, the encapsulant 170 is supplied to each opening 305 by dispensing or pressing across the chips, and cured. An assembly of the semiconductor light emitting chip 101, the encapsulant 170, the mask 301 and the base 201 is then subjected to the testing process described in FIG. 16 and FIG. 17. Further, a tape 208 may be attached beneath the base 201 as shown in FIG. 29a, or no tape is attached as shown in FIG. 29b. The mask 301 and the base 201 are cut around the opening 305. This cutting process can be accomplished using the method described in FIG. 27. If the mask 301 is made of a metal, those cut masks can become metal bonded parts 302. As a result, an individual semiconductor light emitting device obtained includes the semiconductor light emitting chip 101, the encapsulant 170, the metal bonded parts 302, and the cut base 201.

Figure 30:
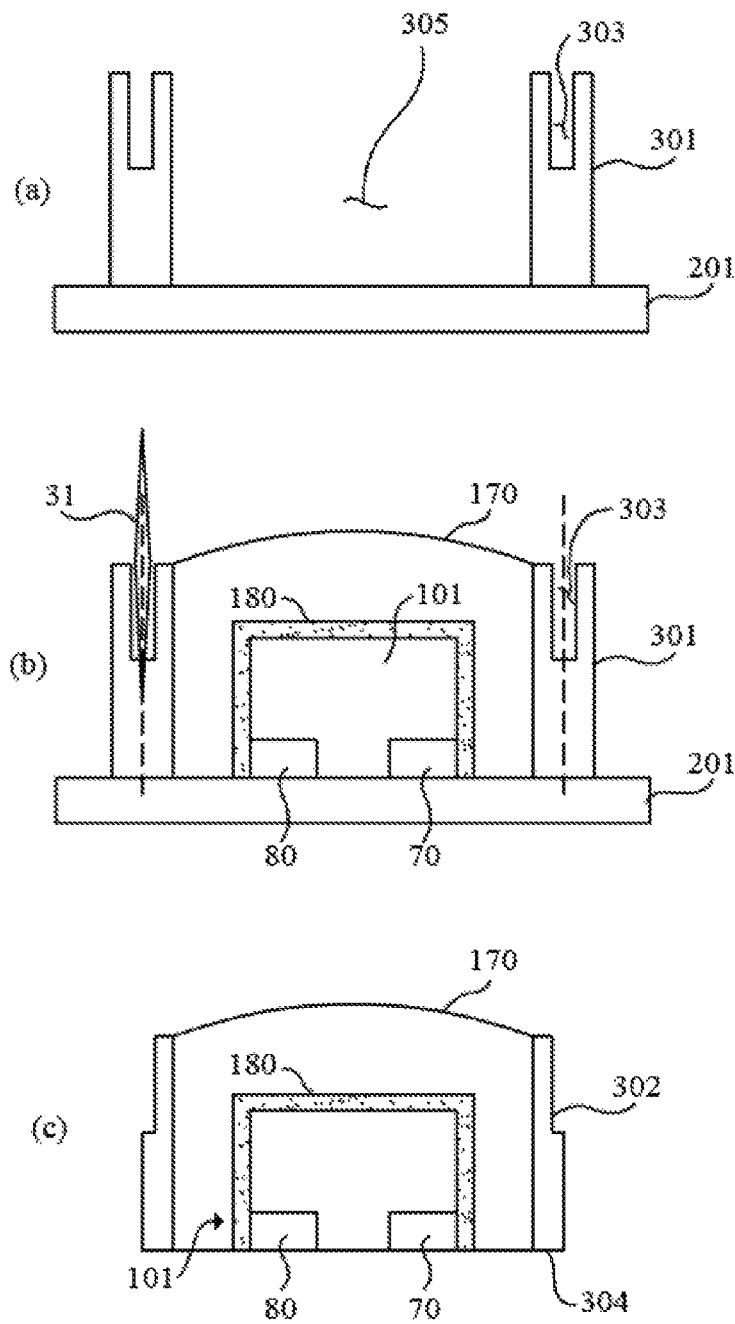
FIG. 30 is a schematic illustration for describing a semiconductor light emitting device and another exemplary embodiment of a method for manufacturing the same according to the present disclosure.

FIG. 30 is a schematic illustration for describing a semiconductor light emitting device and another exemplary embodiment of a method for manufacturing the same according to the present disclosure. Firstly, as shown in FIG. 30a, a dam 301 having an opening 305 is provided on either side of a base 201. Each dam 301 has a cutting groove 303 around the opening 305. Preferably, the cutting groove 303 is formed to a certain depth from the top face of the dam 301, and surround the opening 305. The cutting groove 303 in the dam 301 may be formed using a mold with a corresponding groove, or by extrusion molding. Further, an encapsulant 170 is supplied after a semiconductor light emitting device is placed on an exposed portion of the base 201 through the opening 305, as shown in FIG. 30b. Optionally, a semiconductor light emitting chip 101 can be first placed on the base 201, and this is followed by the preparation of a dam 301, and supplying an encapsulant 170.

Next, the dam 301 is cut along (the shape) of the cutting groove 303. This cutting process can be accomplished by various techniques, including: breaking the dam 301 along the cutting groove 303; putting a cutter 31 inside the cutting groove 303 and then cutting the dam 301 along the groove; or cutting a portion of the dam corresponding to the cutting groove 303 or scribing with a cutter 31 or other scribing equipment and then breaking the rest of the dam 301.

The breaking techniques, when used for cutting the dam 301 in this embodiment, provides a number of advantages over others in that cutting grooves 303 are formed beforehand at regular intervals, and that semiconductor light emitting devices of uniform size can be produced as the cutting process is performed along the cutting grooves 303. Moreover, in the case of cutting over full height or width of the dam 301 from bottom to top, the cutting process is often under stress by an external force such that there is a risk of producing a defective semiconductor light emitting device. However, the presence of cutting grooves as in this embodiment reduces stress and therefore, a resulting semiconductor light emitting device is substantially less damaged or destroyed. In addition, an amount of breaking time is shortened.

As a result, the efficiency of the cutting process is improved, and defects in a semiconductor light emitting device thus obtained are reduced.

For example, the height of a remaining part of the dam after the cutting groove 303 has been removed (cut away) can be approximately 200 μm or less. Needless to say, this height or the depth of the cutting groove 303 may vary, depending on a total height of the dam 301. These cutting grooves are not particularly limited to a certain size, and they can be modified in various sizes or shapes according to the size or shape of a semiconductor light emitting device or the dam 301. The dam can be cut while the base 201 is present, or the dam can be cut after the base 201 is first removed. Meanwhile, when the cutting process is performed using a cutter 31, an amount of cutting time is shortened as the cutting process is done on the cutting groove 303. The cutting groove 303 may serve as a reference for alignment of the cutter 31, or a guide for the cutter 31 during the cutting process. As a result, the efficiency of the cutting process is improved, and defects in a semiconductor light emitting device thus obtained are reduced.

Further, the base 201 is removed to produce an individual, separated semiconductor light emitting device including the semiconductor light emitting chip 101, the encapsulant 170 and cut dams 301, as shown in FIG. 30c. If the dam 301 used here is made of a metal (i.e. a metal dam), those cut dams 302 become metal bonded parts 302 as described in FIG. 25. Because of the cutting groove 303, the metal bonded part 302 is thicker on the side of the electrodes 80, 70 without the cutting groove than on the other side of the electrodes 80, 70. In other words, the metal bonded part 302 has a bottom face 304 with a suitable area for ensuring improved bonding strength.

Figure 31:
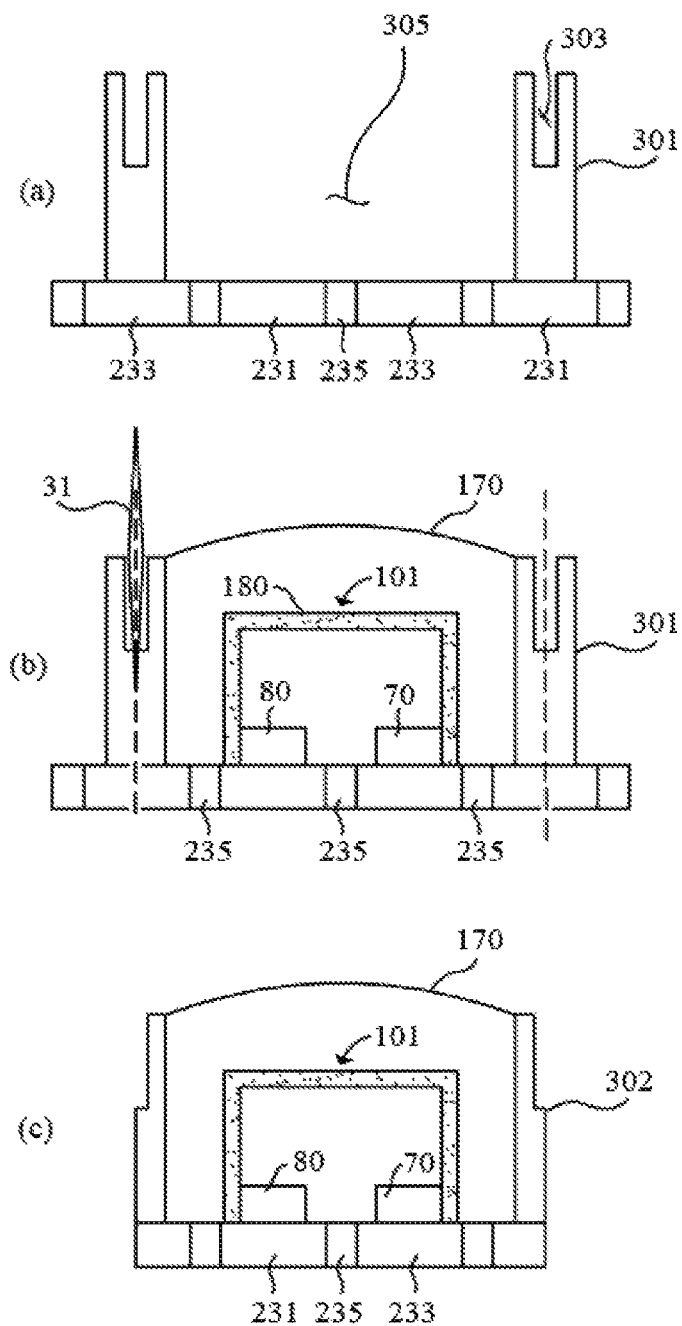
FIG. 31 is a schematic illustration for describing another exemplary embodiment of a method for manufacturing a semiconductor light emitting device according to the present disclosure.

FIG. 31 is a schematic illustration for describing another exemplary embodiment of a method for manufacturing a semiconductor light emitting device according to the present disclosure. Firstly, as shown in FIG. 31a, a dam 301 having an opening 305 is provided on either side of a base 201, and semiconductor light emitting chip 101 is placed on an exposed portion of the base 201 through the opening 305. The base 201 includes a first conductive part 231, a second conductive part 233, and an insulating part 235 interposi-tioned between them. The dam 301 has a cutting groove 303, preferably a ring-shaped cutting groove 303 around the opening 305. An encapsulant 170 is then supplied to the opening 305 in such a manner that it covers the semiconductor light emitting chip 101. Optionally, the semiconductor light emitting chip 101 may be first placed on the base 201, and this is followed by the preparation of the dam 301 and supplying the encapsulant 170.

Next, the dam 301 and the base 201 are cut together along the cutting groove 303 to obtain an individual, separated semiconductor light emitting device including the semiconductor light emitting chip 101, the encapsulant 170, the cut dams 302 and the cut base 201, as shown in FIG. 31c. This cutting process can be accomplished using the method described in FIG. 30. A cutter 31 may be used to cut the dam 301 and the base 201 together along the cutting groove 303. Optionally, a cutting or scribing process can be performed starting from the cutting groove 303 portion of the dam 301 down to a portion of the base 201 with the cutter 31 or other scribing equipment, and then the rest can be subjected to a breaking process. Still optionally, such breaking techniques can be applied along the cutting groove 303. If the dam 301 used here is made of a metal (i.e. a metal dam), those cut dams 302 become metal bonded parts 302 as described in FIG. 25. The metal bonded parts 302 may be bonded to the conductive parts 231, 233, or to the insulating part 235.

Figure 32:
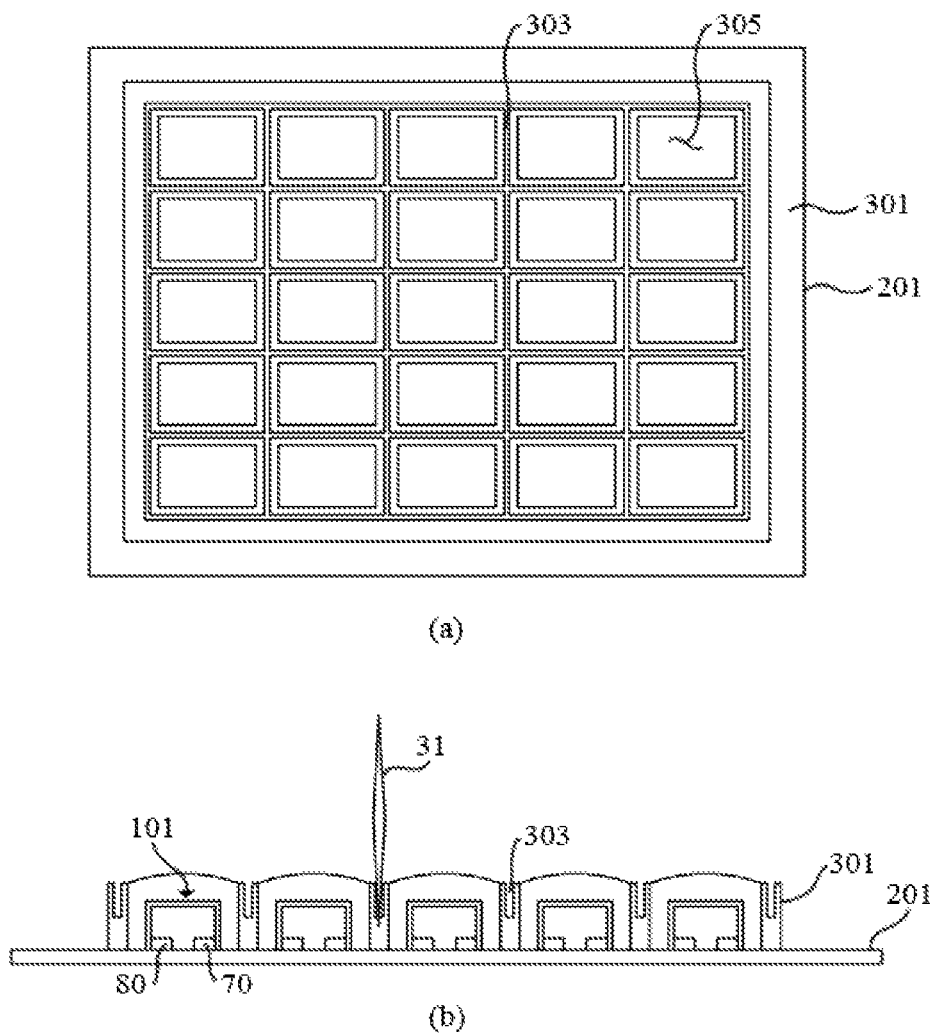
FIG. 32 is a schematic illustration for describing another exemplary embodiment of a method for manufacturing a semiconductor light emitting device according to the present disclosure.

FIG. 32 is a schematic illustration for describing another exemplary embodiment of a method for manufacturing a semiconductor light emitting device according to the present disclosure. Firstly, as shown in FIG. 32a, a mask (dam) 301 described in FIG. 7 to FIG. 17 is prepared on a base 201 that is formed of an adhesive or sticky tape (e.g., a blue tape), a plastic or metal plate. Cutting grooves 303 are formed on the mask 301 between openings 305. The cutting grooves 303 are preferably formed in such a manner to surround an opening 305.

The previously described device carrier 501 places semiconductor light emitting chips 101 respectively on exposed portions of the base 201 through a plurality of openings 305. While it is possible to place the semiconductor light emitting chips 101 on the base 201 first, prepare the mask 301, and then supply the encapsulant 170, it is preferable that the mask 301 be prepared first to have the benefits described in the embodiments of FIG. 7 to FIG. 17.

Next, the encapsulant 170 is supplied to each opening 305 by dispensing or pressing across the chips, and cured. Further, an assembly of the semiconductor light emitting chip 101, the encapsulant 170, the mask 301 and the base 201 is subjected to a testing process as described in FIG. 16 and FIG. 17.

Then the mask 301 is cut along the cutting groove 303 as shown in FIG. 32b. This cutting process may be accomplished using the method described in FIG. 30. Accordingly, a semiconductor light emitting device thus produced includes the semiconductor light emitting chip 101, the encapsulant 170 and the metal bonded parts 302 (cut masks). If the base 201 is a part of the semiconductor light emitting device, for example, if the base 201 is a plate where the first conductive part 231, the insulating part 235 and the second conductive part 233 are arranged on it in line with each other, the mask 301 and the base 201 are cut together. This cutting process may be accomplished using the method described in FIG. 31. As a result, a semiconductor light emitting device including the semiconductor light emitting chip 101, the encapsulant 170 the metal bonded part 302 (cut masks) and the cut base 201 is produced.

Figure 33:
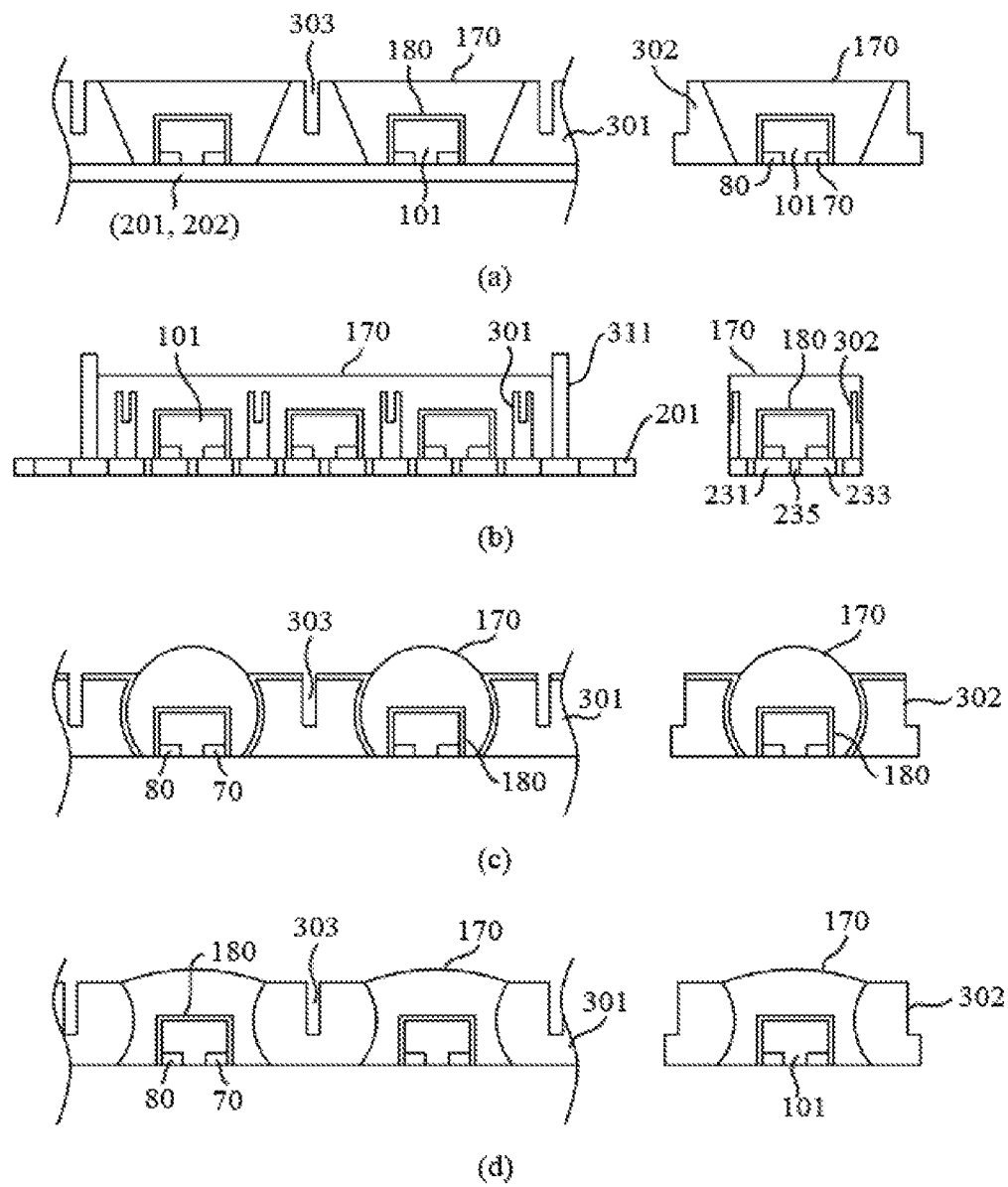
FIG. 33 is a schematic illustration for describing a semiconductor light emitting device and further exemplary embodiments of a method for manufacturing the same according to the present disclosure.

FIG. 33 is a schematic illustration for describing a semiconductor light emitting device and further exemplary embodiments of a method for manufacturing the same according to the present disclosure. The semiconductor light emitting device obtained has a matching shape with a dam 301 or an opening 305 formed in a mask 301. Here, the opening 305 in the mask 301, if seen in a sectional view, may have a shape with slanted sides or a trapezoid shape (see FIG. 33a), or may have a concave or convex curved side (see FIG. 33c and FIG. 33d). Accordingly, an encapsulant 170 and a metal bonded part 302 abutting against the encapsulant may also have slanted sides, or concave/convex curved sides. As such, to meet specification requirements, the encapsulant 170 may be formed in lens, and contribute to obtaining a desired spectral distribution. In the case of the embodiment shown in FIG. 33b, guide walls 311 are provided outside the masks 301, the encapsulant 170 is formed above the mask 301, and then the mask 301 and the base 201 are cut together along a cutting groove 303 formed in the mask 301

Figure 34:
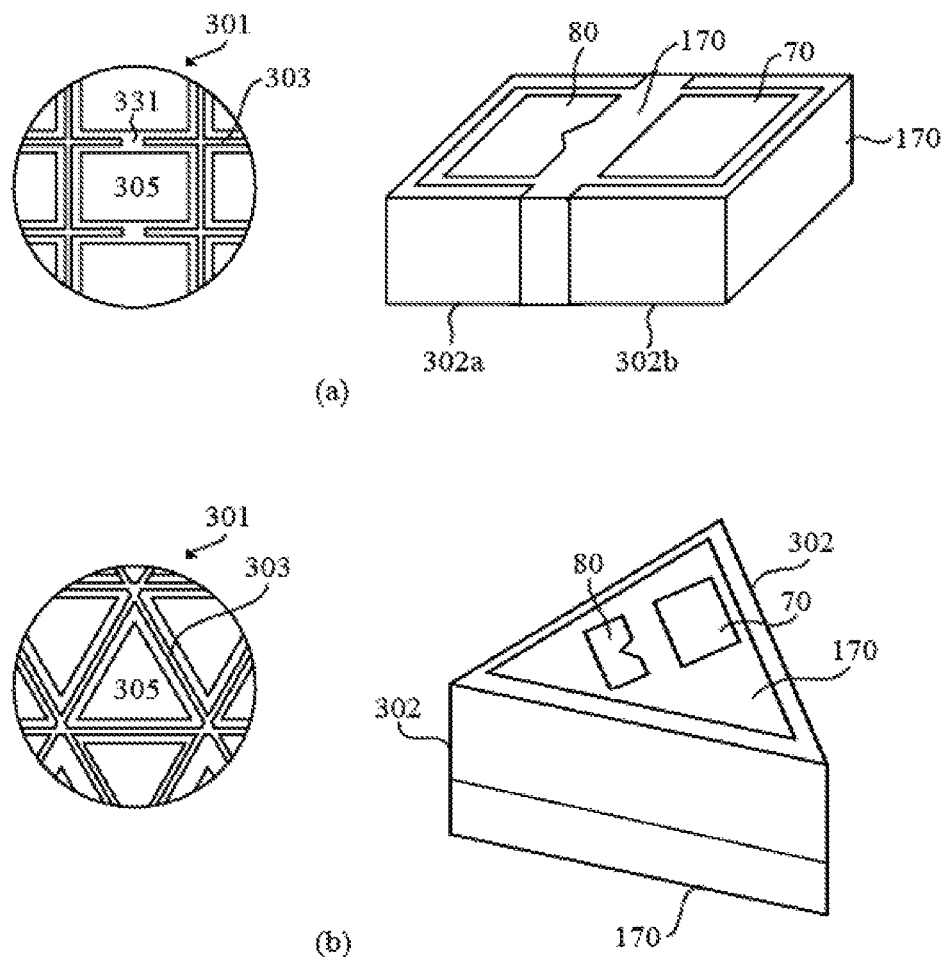
FIG. 34 is a schematic illustration for describing a semiconductor light emitting device and further exemplary embodiments of a method for manufacturing the same according to the present disclosure.

FIG. 34 is a schematic illustration for describing a semiconductor light emitting device and further exemplary embodiments of a method for manufacturing the same according to the present disclosure. Again, the semiconductor light emitting device obtained has a matching shape with an opening 305 formed in a mask 301. The opening 305 in the mask 301, if seen in a plan view, may have a polygonal shape, such as, a quadrangular shape (see FIG. 34a) or a triangular shape (see FIG. 34b), or may be transformed into a circular shape (not shown) or an oval shape (not shown).

Referring to an embodiment shown in FIG. 34a, passages 331 are formed between the openings 305 in the mask 301. Through these passages 331, the openings are interconnected. Both the openings 305 and the passages 331 are filled with an encapsulant 170. The mask 301 is then cut along a cutting groove 303 to produce metal bonded parts 302a, 302b that become a part of a semiconductor light emitting device obtained. Due to the presence of the passage 331, instead of taking a ring form, the metal bonded part 302 may include a first metal part 302a and a second metal part 302b fixed to the encapsulants 170, respectively, at a certain distance away from each other, as shown in FIG. 34a. These metal bonded parts 302a, 302b may abut different conductive parts 231, 233 of such a plate 201 shown in FIG. 25c, respectively, while the first and second metal parts 302a, 302b do not simultaneously abut the first and second conductive parts 231, 233 which two electrodes 80, 70 of the semiconductor light emitting chip 101 come in contact with, respectively, thereby preventing an electrical short in the electrodes. Optionally, as in an embodiment shown in FIG. 34b, the metal bonded parts 302 may be formed at a lower height level than the encapsulant 170, such that a lateral side of the encapsulant is partially exposed.

Figure 35:
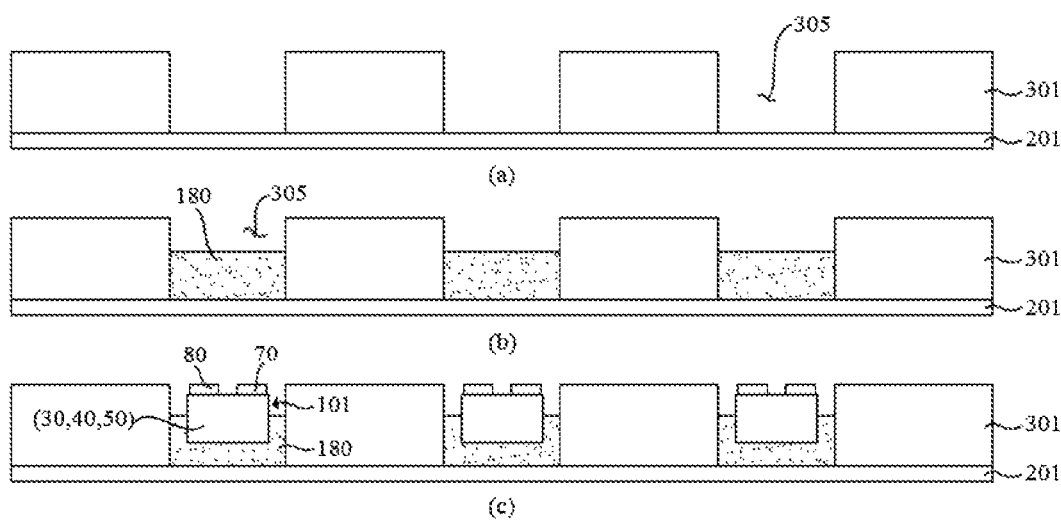
FIG. 35 is a schematic illustration for describing another exemplary embodiment of a method for manufacturing a semiconductor light emitting device according to the present disclosure.

FIG. 35 is a schematic illustration for describing another exemplary embodiment of a method for manufacturing a semiconductor light emitting device according to the present disclosure. Firstly, a dam 301 having openings 305 is provided on a base 201, and a first encapsulant 180 is provided over exposed portions of the base 201 through the openings 305. Next, semiconductor light emitting chips 101 are placed on the first encapsulant 180. Each semiconductor light emitting chip 101 includes a plurality of semiconductor layers 30, 40, 50 composed of a first semiconductor layer 30 having a first conductivity type, a second semiconductor layer 50 having a second conductivity type different from the first conductivity type, and an active layer 40 interpositioned between the first and second semiconductor layers, for generating light by electron-hole recombination; and at least one electrode 80, 70 for supplying a current to the plurality of semiconductor layers 30, 40, 50 (see FIG. 36). The semiconductor light emitting chip 101 is placed on the encapsulant 180 in such a manner that at least one of the electrodes 80, 70 is exposed upwards, and at least one of the plurality of semiconductor layers 30, 40, 50 on the opposite side of the electrodes 80, 70 comes in contact with the first encapsulant 180.

In this embodiment, the semiconductor light emitting chip 101 is a flip chip including at least one electrode 80, 70 arranged on one side of the plurality of semiconductor layers 30, 40, 50, namely, a first electrode 80 electrically communicating with the first semiconductor layer 30 and a second electrode 70 electrically communicating with the second semiconductor layer 50. In a process of placing the semiconductor light emitting chip 101 on the first encapsulant 180, the first and second electrodes 80, 70, being exposed upwards, are arranged on the opposite side of the first encapsulant 180 with respect to the plurality of semiconductor layers 30, 40, 50, such that the first encapsulant is the one in contact with the plurality of semiconductor layers 30, 40, 50 on the opposite side of the first and second electrodes 80, 70. The first encapsulant 180 may contain a phosphor. The first encapsulant 180 may further undergo a soft curing process before the semiconductor light emitting chip 101 is placed on the first encapsulant 180.

For example, a mask or dam 301 is provided on the base 201 as shown in FIG. 35a, and the first encapsulant 180 is supplied to the openings 305 formed in the dam 301 as shown in FIG. 35b. Although the base 201 and the dam 301 are provided as separate components (attachable/detachable) in this embodiment, the base 201 and the dam 301 may serve as the bottom and the wall, respectively, within one frame. Optionally, according to another embodiment, the first encapsulant 180 is formed first on the base 201, and the dam 301 is then placed on the first encapsulant 180, thereby allowing the first encapsulant 180 to enter the openings 305 in the dam 301. While this embodiment includes a dam 301 having a plurality of openings 305, a dam 301 having a single opening 305 can also be used. Moreover, while this embodiment uses a flip chip for the semiconductor light emitting chip 101, the present disclosure does not exclude other embodiments using a lateral chip or a vertical chip.

Forming or placing the first encapsulant 180 on exposed portions of the base 201 through the openings 305 is accomplished by dispensing or printing, so as to supply the first encapsulant 180 to each opening 305. The first encapsulant 180 may contain a phosphor. Height or thickness of the first encapsulant 180 may have a variable height or thickness according to needs. In this embodiment, the first encapsulant 180 is formed at a lower height level than the openings 305.

In a process of placing a semiconductor light emitting chip 101 on the first encapsulant 180, at least a part of the plurality of semiconductor layers 30, 40, 50 can be buried in the first encapsulant 180. The first encapsulant 180 covers the plurality of semiconductor layers 30, 40, 50 on the opposite side of the electrodes 80, 70. As shown in FIG. 35c, the first encapsulant 180 may partially cover the side faces of the plurality of semiconductor layers 30, 40, 50 such that the rest of the side faces of the plurality of semiconductor layers 30, 40, 50 are exposed. Optionally, the first encapsulant 180 may fully cover the side faces of the plurality of semiconductor layers 30, 40, 50. Still optionally, the first encapsulant 180 may be placed in such a manner that it only comes in contact with the plurality of semiconductor layers 30, 40, 50.

Later, the base 201 and the dam 301 are removed to produce a semiconductor light emitting device including the semiconductor light emitting chip 101 and the first encapsulant 180.

According to this embodiment, the first encapsulant 180, which preferably contains a phosphor, forms a thin layer on the surface of the semiconductor light emitting chip 101, such that a semiconductor light emitting device thus obtained is formed in a chip scale package. Further, it is possible to modify height of the first encapsulant 180 formed in the opening 305, meaning that only a required amount of the encapsulant may be used without unnecessary consumption. This feature is advantageous for forming the first encapsulant 180 of uniform thickness and height on the side of the substrate through which most of the light from the semiconductor light emitting chip 101 goes out, and for preventing the first encapsulant 180 from flowing into the first and second electrodes 80, 70. In addition, the first encapsulant 180 is adhesive, which makes it easier and more convenient to place a semiconductor light emitting chip 101 on the encapsulant 180.

Figure 36:
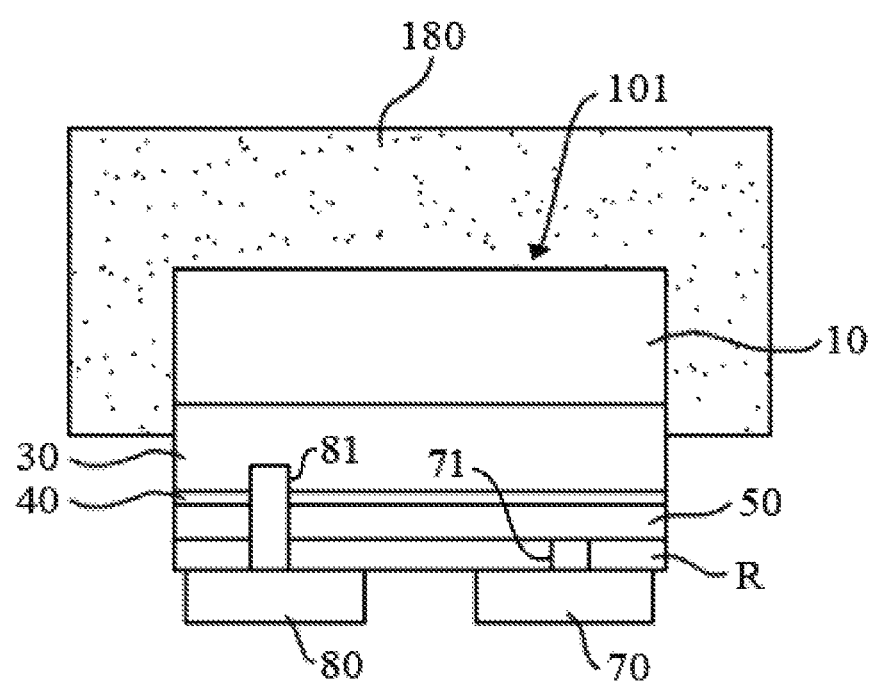
FIG. 36 is a schematic illustration for describing another exemplary embodiment of a method for manufacturing a semiconductor light emitting device according to the present disclosure.

FIG. 36 is a schematic illustration for describing another exemplary embodiment of a method for manufacturing a semiconductor light emitting device according to the present disclosure. The semiconductor light emitting includes a plurality of semiconductor layer 30, 40, 50; and at least one electrode 80, 70 arranged on one side of the plurality of semiconductor light emitting layers 30, 40, 50, for supplying a current thereto. A first encapsulant 180 covers the plurality of semiconductor layers 30, 40, 50 on the opposite side of the at least one electrode 80, 70 in such a manner that it would expose a part of the side faces of the plurality of semiconductor layers 30, 40, 50 between the side of the at least one electrode 80, 70 and the opposite side of the at least one electrode 80, 90, with respect to the plurality of semiconductor layers 30, 40, 50. As shown in 36, the first encapsulant 180 partially covers the side faces of the plurality of semiconductor layers 30, 40, 50, thereby leaving the rest of the side faces exposed.

In this embodiment, the semiconductor light emitting chip 101 is a flip chip, including a growth substrate 10, a plurality of semiconductor layers 30, 40, 50, a light reflective layer R, and two electrodes 80, 70. In the case of Group III-nitride semiconductor light emitting devices, for example, the growth substrate 10, which may be eventually removed, is made primarily of sapphire, SiC, Si, GaN or the like. The plurality of semiconductor layers 30, 40, 50 includes a buffer layer (not shown) formed on the growth substrate 10, a first semiconductor layer 30 (e.g., Si-doped GaN) having a first conductivity type, a second semiconductor layer 50 (e.g., Mg-doped GaN) having a second conductivity type different from the first conductivity type, and an active layer 40 (e.g., InGaN/(In)/GaN multiple quantum well structure) which is interpositioned between the first semiconductor layer 30 and the second semiconductor layer 50 and generates light by electron-hole recombination. Each of the semiconductor layers 30, 40, 50 may have a multilayered structure, and the buffer layer may be omitted. The positions of the first semiconductor layer 30 and second semiconductor layer 50 may be exchanged, and these semiconductor layers are made primarily of GaN in the case of Group III-nitride semiconductor light emitting devices. The first electrode 80 is in electrical communication with the first semiconductor layer 30 and supplies electrons thereto. The second electrode 70 is in electrical communication with the second semiconductor layer 50 and supplies holes thereto. The light reflective layer R may have a multilayered structure including an insulation layer such as a $SiO_2$ layer, a DBR (Distributed Bragg Reflector) or ODR (Omni-Directional Reflector).

The first encapsulant 180 may contain a phosphor. The type of a phosphor to be used is selected based on light from the semiconductor light emitting chip 101 and desired characteristics of the light from a semiconductor light emitting device obtained. For example, one of the most frequently used methods for obtaining white light is coating a phosphor layer over a single chip such as a blue LED chip (e.g., a GaN or InGaN chip) or a NUV (near ultraviolet) LED chip because its packaging process is very simple and power consumption can be reduced. In an example, a white LED emitting white is obtained using blue light emitted from a blue LED, and yellow light obtained from $Y_3Al_5O_{12}$:$Ce^{3+}$(YAG:Ce) phosphor materials excited using part of the blue light. In another example, pseudo-sunlight having a spectral distribution similar to that of sunlight can be configured by combining a NUV LED with phosphor materials that convert NUV light to blue, green and red.

Figure 37:
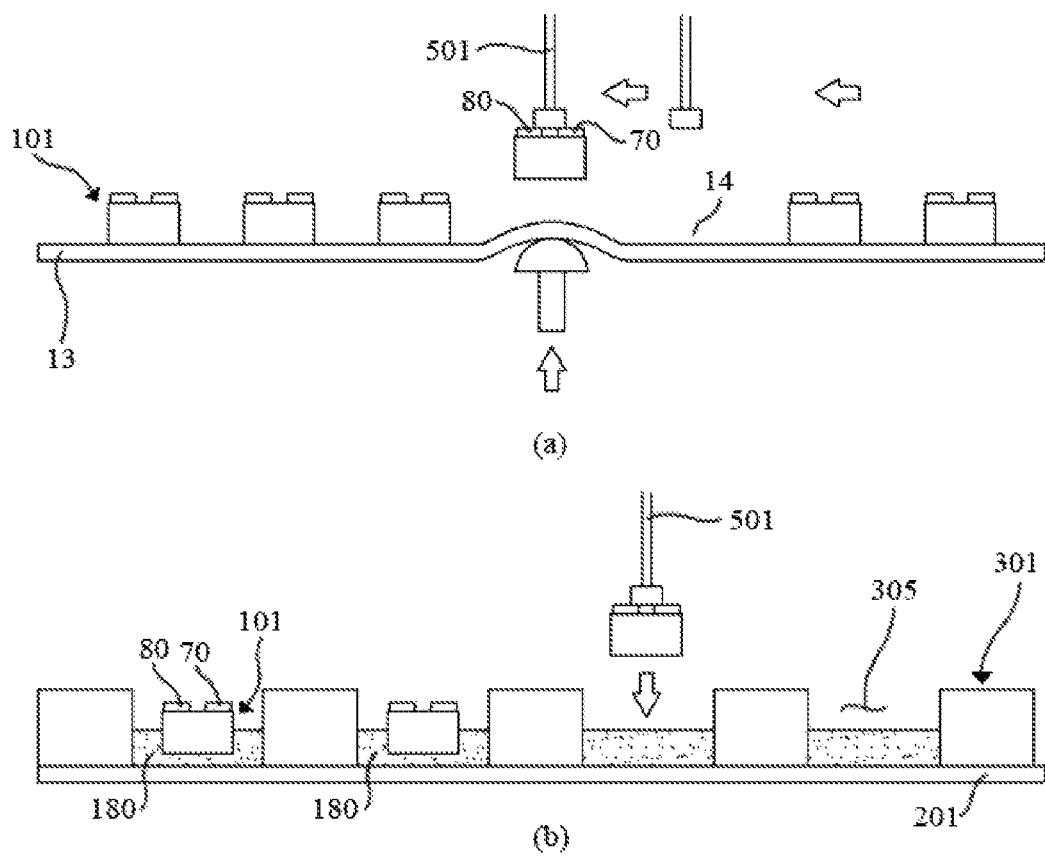
FIG. 37 is a schematic illustration for describing an exemplary process of placing semiconductor light emitting chips on a first encapsulant formed in corresponding openings.

FIG. 37 is a schematic illustration for describing an exemplary process of placing semiconductor light emitting chips on a first encapsulant formed in corresponding openings. A device carrier 501 picks up each semiconductor light emitting chip 101 on a fixing component 13 (e.g., a tape) and then places it on a first, preferably soft-cured encapsulant 180. Prior to this process, a device aligner (e.g., a sorter) may put a plurality of semiconductor light emitting chips 101 on the tape 13, as in the embodiment shown in FIG. 3. Referring to FIG. 37a, when a pin or rod (bar) strikes a semiconductor light emitting chip 101 from the bottom of the tape 13, the semiconductor light emitting chip 101 comes off the tape 13, and at this moment, the device carrier 501 can catch the semiconductor light emitting chip 101 by electric suction or vacuum suction.

Referring to FIG. 37b, the device carrier 501 hovers above the base 201 to place semiconductor light emitting chips 101 into their corresponding openings 305. The semiconductor light emitting chip 101 is placed in such a manner that its two electrodes 80, 70 face upwards, and a plurality of semiconductor layer 30, 40, 50 on the opposite side of the electrodes 80, 70 comes in contact with the first encapsulant 180 or is partially buried in the first encapsulant 180, thereby partially exposing the side faces of the plurality of semiconductor layers 30, 40, 50 from the first encapsulant 180. If the plurality of semiconductor layers 30, 40, 50 is to be buried in the first encapsulant 180, burial depth of the plurality of semiconductor layers 30, 40, 50 in the first encapsulant 180 can be modified by controlling a material of the first encapsulant 180 containing a phosphor dispersed therein, a degree of soft curing, or an operation of the device carrier 501. For example, the plurality of semiconductor layers 30, 40, 50 may be fully buried in the first encapsulant 180, or may be buried until reaching the surface of a substrate 10. The latter can be taken, in consideration of the color temperature uniformity.

Since a dam 301 and the openings 305 constitute a frame designed to be very accurate and exact in manner, they provide high-precision alignment of semiconductor light emitting chips 101, as compared with the case where devices are arranged on a dam 301—free base 201 or flat tape 13 (see FIG. 3) by means of a sorter (e.g., 5 in FIG. 2) according to a given instruction on each occasion. Therefore, defects due to inaccurate alignment are reduced. Moreover, when a semiconductor light emitting chip 101 being adhered to the tape 13 is provided to the device carrier 501 (see FIG. 37a), the semiconductor light emitting chip may not necessarily be made to perfectly fit in the required dimensions as the device carrier 501 itself can recognize a vacancy 14 (see FIG. 37a) without a semiconductor light emitting chip 101 to carry another semiconductor light emitting chip 101, and correct any skew angle of the semiconductor light emitting chip 101 before placing it on the base 201. Accordingly, this reduces the burden of providing semiconductor light emitting chips 101 to the device carrier 501 in a perfectly precise manner.

Similar to a die bonder for example, the device carrier 501 recognizes patterns or shapes. Regardless of the name of an instrument used, any instrument capable of calibrating a target position or angle of an object can be employed.

Figure 38:
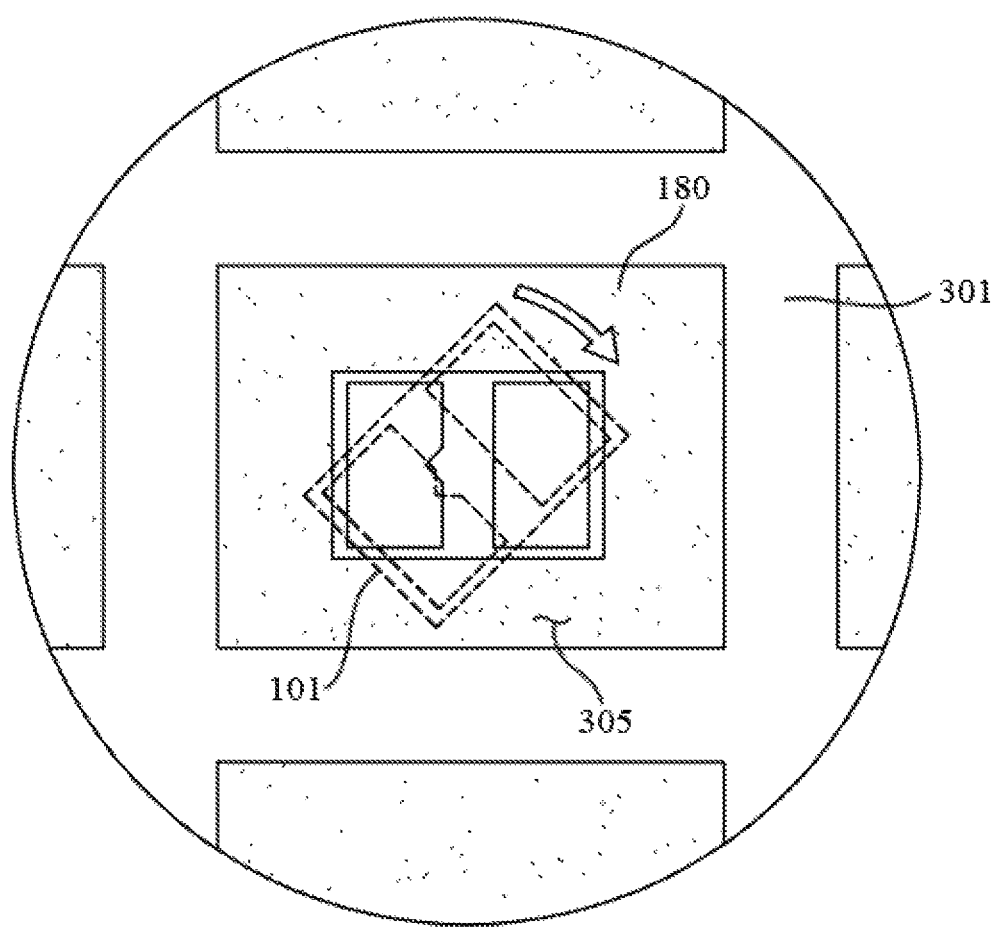
FIG. 38 is a schematic illustration of an example showing how a device carrier recognizes a shape or pattern of a dam to calibrate angle and position of a semiconductor light emitting chip to be placed.

FIG. 38 is a schematic illustration of an example showing how a device carrier recognizes a shape or pattern of a dam to calibrate angle and position of a semiconductor light emitting chip to be placed. When the sorter 5 (see FIG. 2) is running at a high speed, it might leave out a semiconductor light emitting chip 101 on the tape, thereby creating a vacancy (see 14 in FIG. 3), and it might also skew a semiconductor light emitting chip slightly (see 16 in FIG. 3). As shown in FIG. 37a, the device carrier 501 is capable of recognizing any vacancy 14 and picking up the semiconductor light emitting chip 101 at the next position. When the device carrier 501 picks up the semiconductor light emitting chip 101, it can recognize a pattern (e.g., electrode separating line) of the electrodes 80, 70 in the semiconductor light emitting chip 101 to calibrate an angle of the chip. In addition, as shown in FIG. 38, the device carrier 501 recognizes a shape of the dam 301 and calibrates position or angle of the semiconductor light emitting chip 101 such that the chip is placed with precision and accuracy on the first encapsulant 180 formed in a corresponding opening 305. To accomplish this, the device carrier 501 may use a camera or optical sensor. For example, the device carrier 501 can sense a difference in brightness, light reflectance or reflected light between the dam 301 and the first encapsulant 180, or recognize a shape or form of the opening 305 of interest. It does not necessarily have to recognize the entire shape or form opening 305, but may recognize only a part thereof. Thus, the device carrier 501 can place a semiconductor light emitting chip 101 at a position which corresponds to a designated distance away from or coordinates with respect to at least one of the face, edge and point of the dam 301, in an opening 305. Besides, other approaches may also be applied to recognize a pattern of the dam 301 or opening 305, and to obtain the coordinates of a target semiconductor light emitting chip 101 based on the pattern. In this embodiment, the base 201 does not have a specific pattern on it, and the dam 301 or opening 305 is used as a reference for obtaining the coordinates of a semiconductor light emitting chip 101 of interest.

In short, the positional and angular alignment of semiconductor light emitting chips 101 is done with higher precision and accuracy, as compared with the case where semiconductor light emitting chips are simply arranged on a flat base 201 by means of a sorter 5 at predetermined spaced intervals with respect to an initially placed semiconductor light emitting chip 101.

Figure 39:
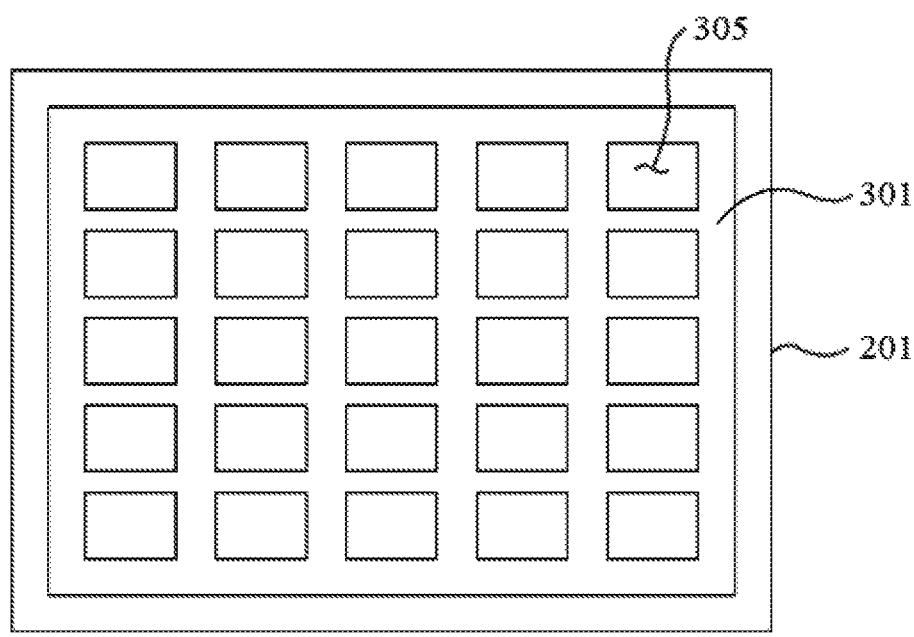
FIG. 39 is a schematic illustration for describing an example of a dam provided over a base in a method for manufacturing a semiconductor light emitting device according to the present disclosure.

FIG. 39 is a schematic illustration for describing an example of a dam provided over a base in a method for manufacturing a semiconductor light emitting device according to the present disclosure. A mask or dam 301 having openings 305 is provided on a base 201. The base 201 may be either a rigid metallic plate or non-metallic plate, or a flexible film or tape. The present disclosure is not particularly restricted to certain metallic plates, and Al, Cu, Ag, Cu—Al alloys, Cu—Ag alloys, Cu—Au alloys, SUS (stainless steel) or the like may be used as the metallic plate. A plated metallic plate can also be used. The non-metallic plate may be made of plastics in a wide range of colors or light reflectances. In addition, the present disclosure is not particularly restricted to certain films or tapes, and any sticky or adhesive film or tape having heat resistant properties is desired. For example, a heat-resistant tape or a blue tape in a wide range of colors or light reflectances may be used.

The dam 301 may be a plastic, metallic or surface-plated component, and has a plurality of openings 305. The plurality of openings 305 formed in the dam 301 is arrayed in columns and rows, for example. The number of openings 305 and their shape and array format can vary according to needs. The openings 305 may have a matching shape with the semiconductor light emitting chip 101 or a different shape from the semiconductor light emitting chips 101. While the dam 301 may be made of the same material as the base 201 selected from those mentioned above, it is preferentially made of a material that is sufficiently firm or hard to maintain the shape of the dam 301 or openings 305 and that is effective for avoiding cracks or splits.

Meanwhile, it is preferable that the previously described device carrier 501 place semiconductor light emitting chips 101 on the first encapsulant 180 formed in a corresponding opening 305 (see FIG. 37). The dam 301 may be seen as a pattern for the device carrier 501 to calibrate the position or angle of a semiconductor light emitting chip 101 to be placed, and it may also serve as a dam of the first encapsulant 180. In this embodiment, as the first encapsulant 180 is formed beforehand in a corresponding opening 305, the device carrier 501 can distinguish the dam 301 from the first encapsulant 180 even if the dam 301 is made of the same material as the base 201. Hence, the burden imposed on the device carrier 101 for placing semiconductor light emitting chips 101 at accurate positions is very low. Further, the base 201 does not need to go through an additional patterning process because the dam 301 serves as a guide for alignment of the semiconductor light emitting chips 101.

Figure 40:
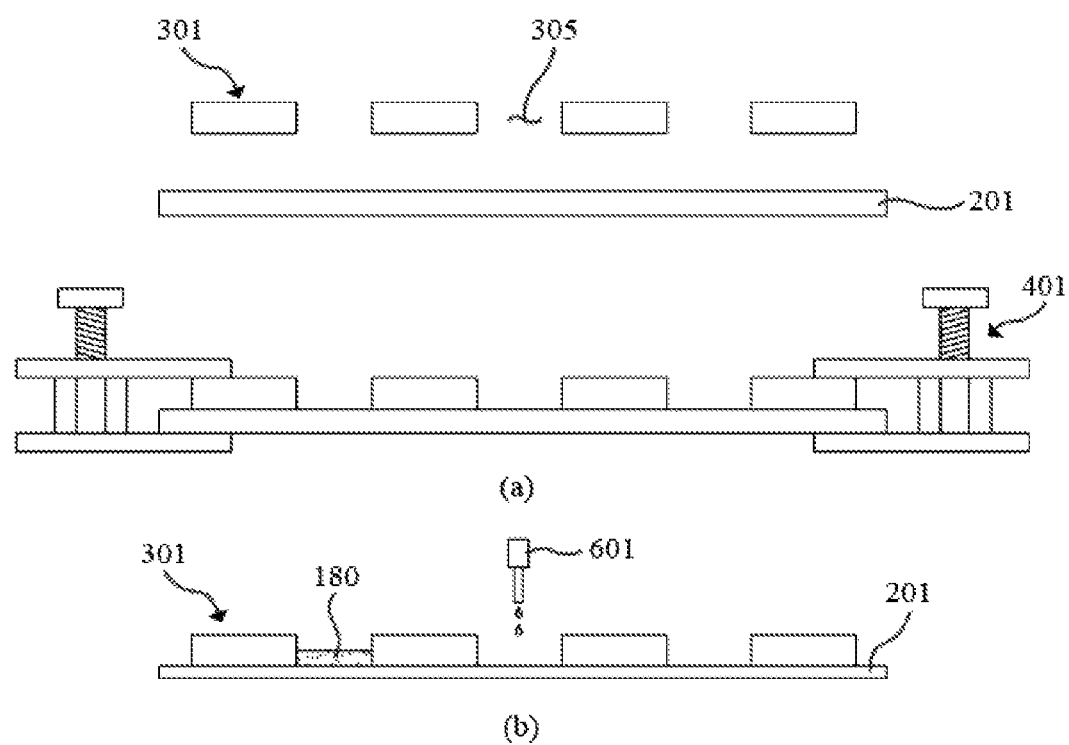
FIG. 40 is a schematic illustration for describing an exemplary method of providing the dam and the first encapsulant 180 on the base.

FIG. 40 is a schematic illustration for describing an exemplary method of providing the dam and the first encapsulant 180 on the base. For example, in this embodiment, the base 201 and the dam 301 abut each other by an externally applied force. For example, as shown in FIG. 40a, a clamp 401 may be used to make the base 201 and the dam 301 abut each other. As such, this embodiment presents a simple and convenient way of bringing the base 201 and the dam 301 into contact with each other and of separating the mask 301 from the dam 201 by tightening or loosening the clamp 401. Optionally, an adhesive material may be inserted between the base 201 and the dam 301. The adhesive material can be selected from a wide range of materials including a conductive paste, an insulating paste, a polymeric adhesive or the like, and is not particularly limited thereto. However, those materials which lose their adhesion at a certain temperature range are avoided because the base 201 and the dam 301 could be easily separated from each other at the temperature range. Optionally, a tape which loses its adhesion under UV irradiation may be used as the base 201. Referring to FIG. 40b, the first encapsulant 180 can be dispensed or printed the exposed portions of the base 201 through the openings 305, to a required height.

Further, the base 201 and the dam 301 are separated or removed to produce a semiconductor light emitting device including the semiconductor light emitting chip 101 and the first encapsulant 180.

Figure 41:
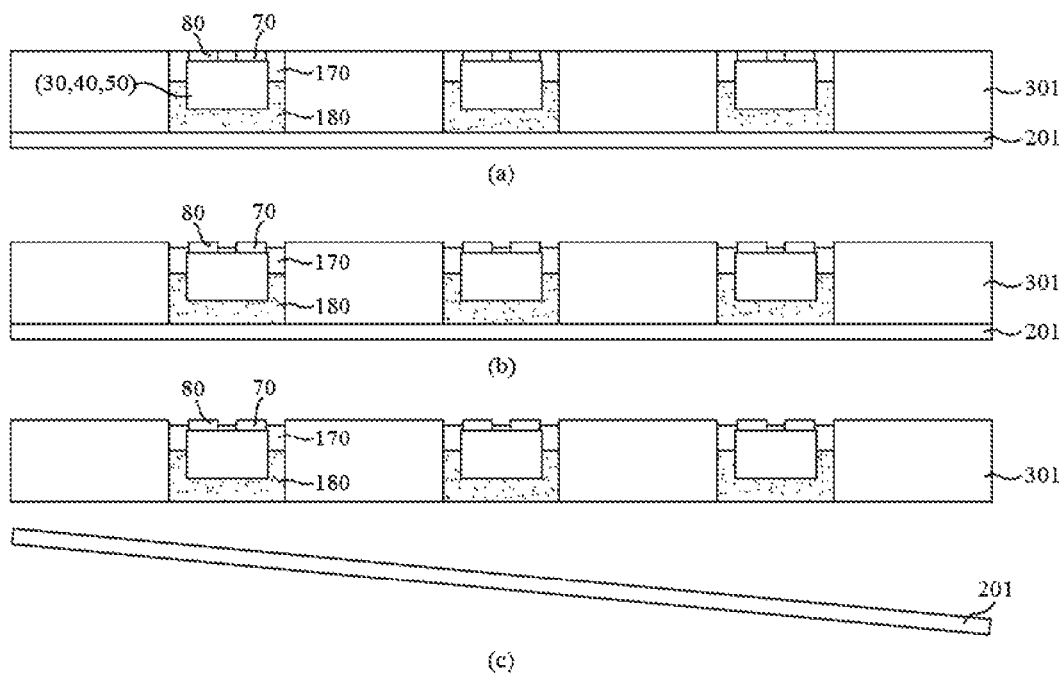
FIG. 41 is a schematic illustration for describing another exemplary embodiment of a method for manufacturing a semiconductor light emitting device according to the present disclosure.

FIG. 41 is a schematic illustration for describing another exemplary embodiment of a method for manufacturing a semiconductor light emitting device according to the present disclosure. In this method for manufacturing a semiconductor light emitting device, firstly, a dam having openings 305 is provided on a base 201, and a first encapsulant 180 containing a phosphor is provided on exposed portions of the base 201 through the openings 305. Semiconductor light emitting chips 101 are then placed on the first encapsulant 180. While placing the semiconductor light emitting chips 101 on the first encapsulant 180, part of the side faces of a plurality of semiconductor layers 30, 40, 50 may be exposed. This process follows the one described in the embodiments of FIG. 35 to FIG. 40.

Next, as shown in FIG. 41a, a second encapsulant 170 is formed between a dam 301 and exposed side faces of the plurality of semiconductor layers 30, 40, 50, thereby covering the exposed side faces of the plurality of semiconductor layers 30, 40, 50. The second encapsulant 170 may be made of a silicon-based material, an epoxy-based material, or a material with EMC (electro-magnetic compatibility) for avoiding electromagnetic interference. For example, when the second encapsulant 170 includes at least one of white silicon and high-reflectance epoxy, it can be opaque and reflect light towards the first encapsulant 180. Optionally, the second encapsulant 170 may be simply made of a material such as transparent silicon.

Although the second encapsulant 170 is provided between the dam 301 and the light emitting chip 101 by dispensing or printing, as shown in FIG. 41a, it can climb towards electrodes 80, 70, cover the plurality of semiconductor layers 30, 40, 50 around the electrodes 80, 70, or be contaminated even if a second electrode 70 is not covered. Hence, an additional process for exposing the electrodes 80, 70 by removing a part of the second encapsulant 170, or for removing contaminants may be added. For example, the electrodes 80, 70 facing upwards and the second encapsulant 170 are subjected to plasma etching, mechanical brushing, or polishing, so as to expose the electrodes 80, 70 and remove contaminants, as shown in FIG. 41b.

Figure 42:
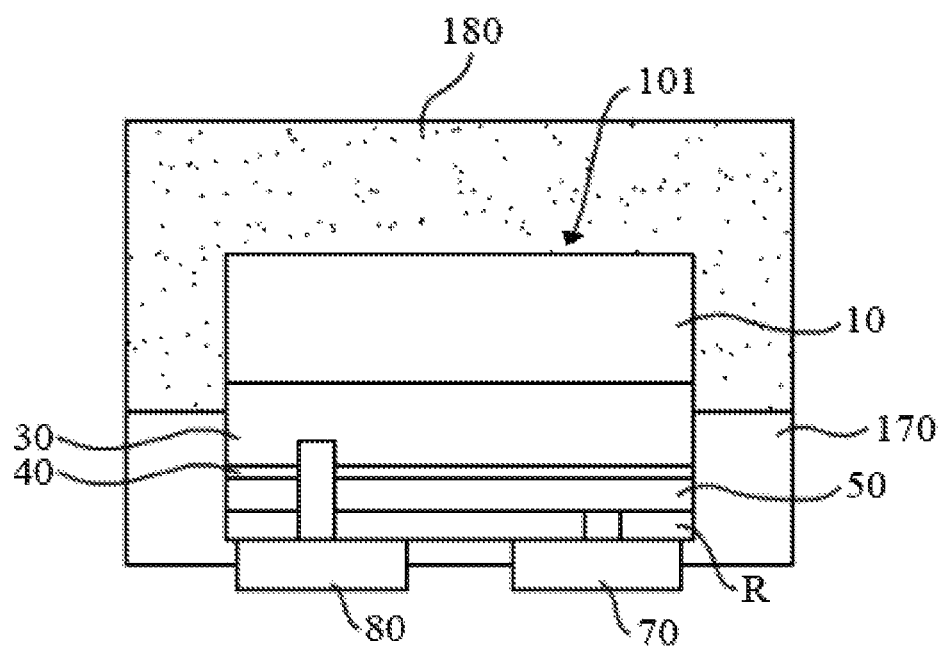
FIG. 42 is a schematic illustration for describing an exemplary embodiment of a semiconductor light emitting device according to the present disclosure.

Referring next to FIG. 41c, the base 201 and the dam 301 are separated, and a semiconductor light emitting device including the semiconductor light emitting chip 101, the first encapsulant 180 and the second encapsulant 170 as shown in FIG. 42 is therefore obtained. This separation process can be accomplished by removing the base 201 and then taking out semiconductor light emitting chips from the dam 301. Optionally, before forming the second encapsulant 170 described in FIG. 41a, semiconductor light emitting chips 101 are placed on the first encapsulant 180, and the first encapsulant 180 is cured. This is followed by removing the base 201. Next, the process described in FIG. 41 may be performed.

Figure 43:
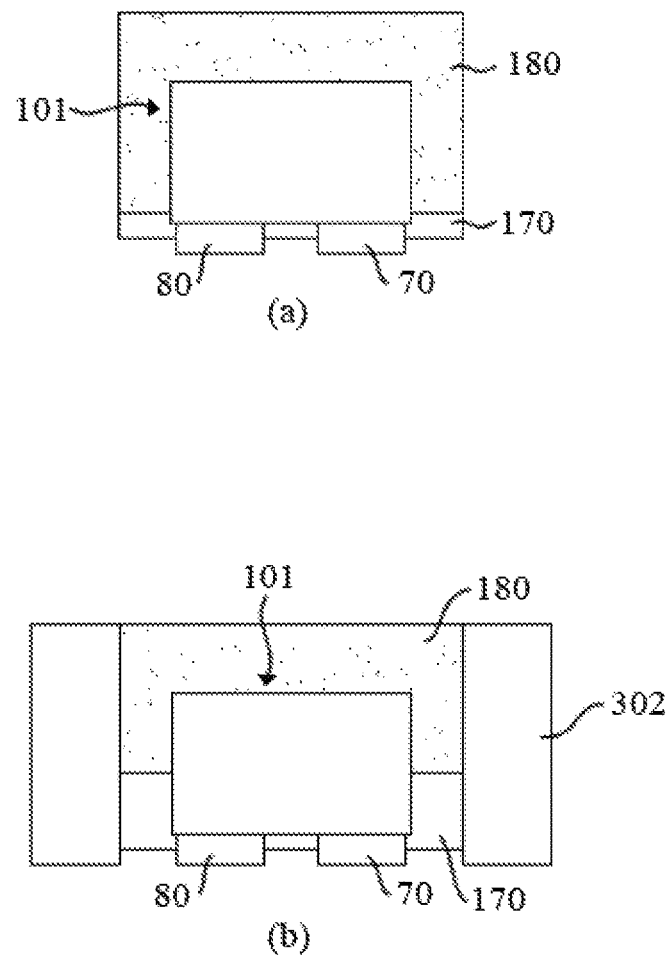
FIG. 43 is a schematic illustration for describing further exemplary embodiments of a semiconductor light emitting device according to the present disclosure.

FIG. 43 is a schematic illustration for describing further exemplary embodiments of a semiconductor light emitting device according to the present disclosure. Referring to an embodiment shown in FIG. 43a, a semiconductor light emitting device obtained includes a first encapsulant 180 fully covering the side faces of a plurality of semiconductor layers 30, 40, 50, and a second encapsulant 170 covering the plurality of semiconductor layers 30, 40, 50 on the side of electrodes 80, 70. Here, the second encapsulant 170 may be made of a high-refelctance or EMC material, or simply of transparent silicon. Referring to another embodiment shown in FIG. 43b, in order to obtain a semiconductor light emitting device, a dam 301 is subjected to sawing or cut by scribing and breaking, a base 201 is removed, and bonded parts 302 (cut dams) are provided on outer surfaces of the first and second encapsulants 180, 170. The bonded parts 302 may be made of a metal. When the electrodes 80, 70 are bonded to external electrodes, the bonded parts 302 also come in contact with the external electrodes, thereby improving bonding strength.

Figure 44:
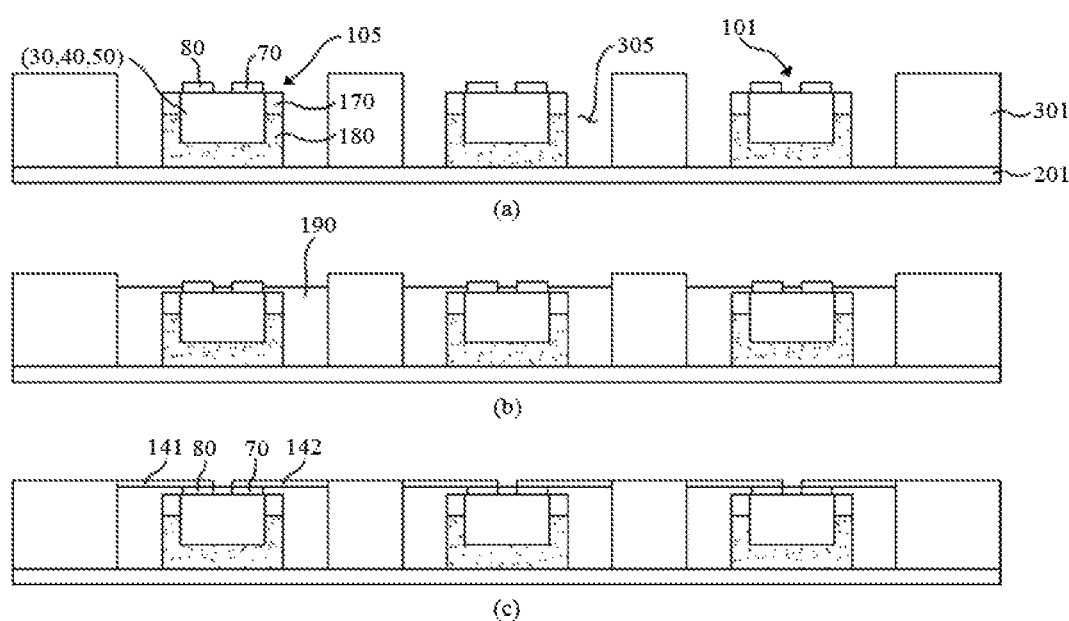
FIG. 44 is a schematic illustration for describing a semiconductor light emitting device and another exemplary embodiment of a method for manufacturing the same according to the present disclosure.

FIG. 44 is a schematic illustration for describing a semiconductor light emitting device and another exemplary embodiment of a method for manufacturing the same according to the present disclosure. In this method for manufacturing a semiconductor light emitting device, firstly, a dam 301 having openings 305 is provided on a base 201, and semiconductor light emitting parts 105 are placed on exposed portions of the base 201 through the openings 305, as shown in FIG. 44a. The embodiment described in FIG. 40 can also be applied here, e.g. providing the dam 301 on the base 201. The dam 301 used in this embodiment has larger openings 305 than the dam 301 shown in FIG. 39. Although the base 201 and the dam 301 are provided as separate components (attachable/detachable) in this embodiment, the base 201 and the dam 301 may serve as the bottom and the wall, respectively, within one frame. The semiconductor light emitting part 105 includes a semiconductor light emitting chip 101 and an encapsulant. Those semiconductor light emitting devices described in FIG. 35 to FIG. 43 can be used for the semiconductor light emitting parts 105 here. Again, the previously described device carrier 501 is used to place semiconductor light emitting parts 105 respectively on exposed portions of the base 201 through the openings 305. The base 201 abuts a first encapsulant 180 which covers a plurality of semiconductor layers 30, 40, 50 on the opposite side of the electrodes 80, 70, and these electrodes 80, 70 are arranged to face upwards.

Referring now to FIG. 44b, a third encapsulant 190 or a fixing part is formed between the dam 301 and the semiconductor light emitting layers. If the semiconductor light emitting part 105 is like the embodiment shown in FIG. 36, the third encapsulant 190 will come in contact with the exposed side faces of the plurality of semiconductor layers 30, 40, 50 and with the first encapsulant 180. If the semiconductor light emitting part 105 is like the embodiment shown in FIG. 42, the third encapsulant 190 will come in contact with the first and second encapsulants 180, 170. In this way, the third encapsulant 190 can be used for encompassing and protecting a light emitting part 105, or can be used as a fixing part for fixing the encapsulants 180, 170 as well as semiconductor light emitting chips. The third encapsulant 190 may be made of at least one of a silicon-based material and an epoxy-based material. In this case, the third encapsulant 190 serves as a reflector or a reflective wall. Optionally, the third encapsulant 190 may be simply made of a material such as transparent silicon. Still optionally, the third encapsulant 190 may be made of a material with EMC (electro-magnetic compatibility) for avoiding electromagnetic interference. Additionally, the second encapsulant 170 may also be made of a high-reflectance material, a transparent material, a material with EMC, or the like.

Although the third encapsulant 190 is provided between the dam 301 and the light emitting part 105 by dispensing or printing, it can climb towards electrodes 80, 70, cover the plurality of semiconductor layers around the electrodes 80, 70, or be contaminated even if the electrodes 80, 70 are not covered. Hence, an additional process for exposing the electrodes 80, 70 by removing a part of the third encapsulant 190, or for removing contaminants may be added. For example, the electrodes 80, 70 facing upwards and the second encapsulant 170 are subjected to plasma etching, mechanical brushing, or polishing, so as to expose the electrodes 80, 70 and remove contaminants, as shown in FIG. 44*b*.

Next, as shown in FIG. 44*c*, there are provided a first conductive part 141 covering the first, upward-exposed electrode 80 and a portion of the third encapsulant 190, and a second conductive part 142 covering the second electrode 70 and the other portion of the third encapsulant 190.

Figure 47:
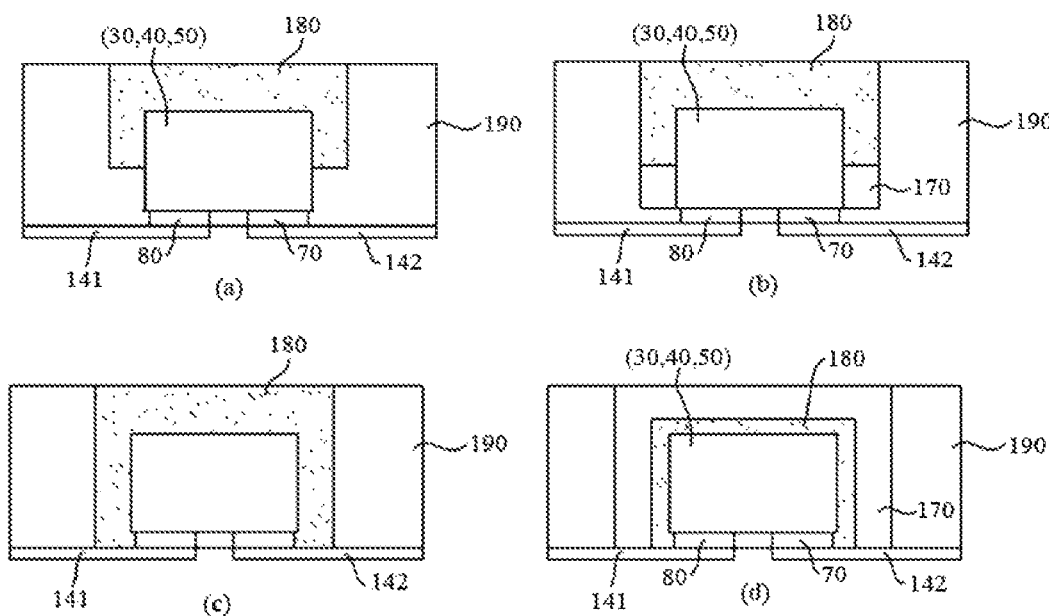
FIG. 47 is a schematic illustration for describing further exemplary embodiments of a semiconductor light emitting device according to the present disclosure.

Further, the base 201 and the dam 301 are separated to produce a semiconductor light emitting device as shown in FIG. 47, which includes the semiconductor chip 101 and the encapsulants 180, 170, 190. This separation process can be accomplished by removing the base 201, followed by taking out a semiconductor light emitting device from the dam 301 or cutting the dam 301.

The method for manufacturing a semiconductor light emitting device in this embodiment may include a process of preparing a semiconductor light emitting part 105. This process of preparing a semiconductor light emitting part 105 can follow the one described in the embodiments of FIG. 35 to FIG. 43.

Figure 45:
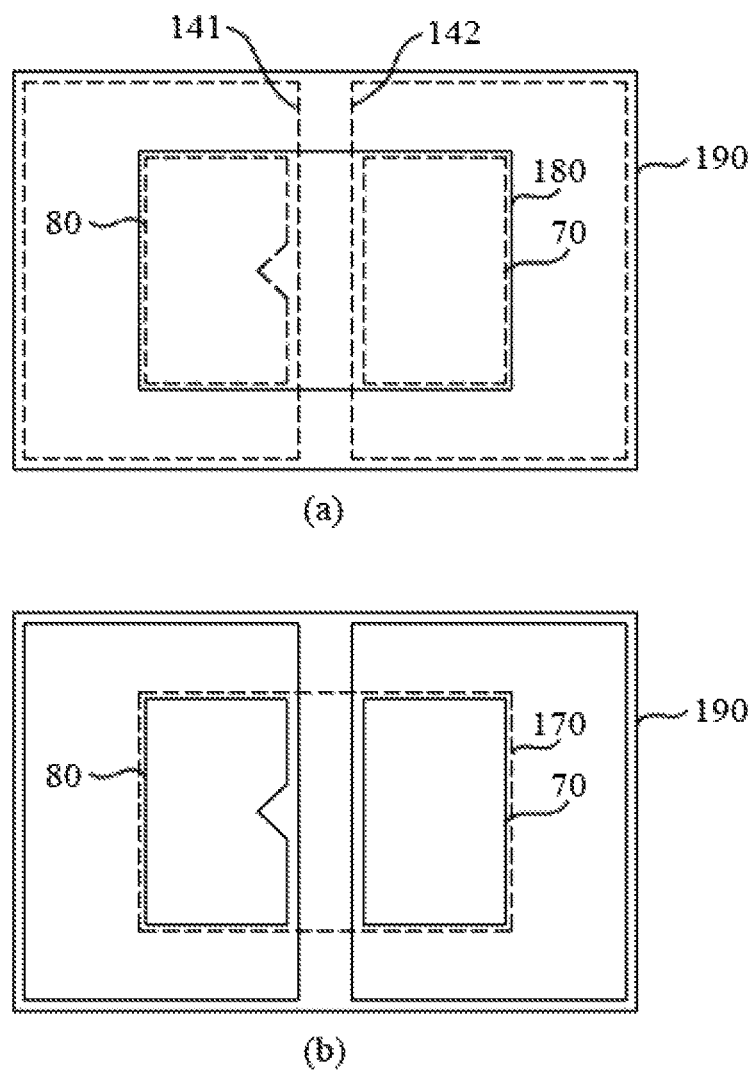
FIG. 45 is a schematic illustration for describing an exemplary process of forming the conductive parts shown in FIG. 44.

FIG. 45 is a schematic illustration for describing an exemplary process of forming the conductive parts shown in FIG. 44, in which FIG. 45*a* is a top view of a semiconductor light emitting device thus obtained, and FIG. 45*b* is a bottom view of a semiconductor light emitting device thus obtained. The semiconductor light emitting chip 101 is a flip chip, including a first electrode 80 and a second electrode 70 arranged facing each other and a certain distance apart and, preferably, include a first conductive part 141 and a second conductive part 141 which are also arranged facing each other and a certain distance apart, similar to the first electrode 80 and the second electrode 70. Here, the first conductive part 141 and the second conductive part 142 may be formed up to the edges of the third encapsulant 190, or there may be a gap between these conductive parts 141, 142 and the third encapsulant 190. A space between the first conductive part 141 and the second conductive part 142 may be filled with the third encapsulant 190. In such a case, the third encapsulant 190 serves to insulate the first conductive part 141 and the second conductive part 142 from each other. Here, a distance or gap between the first conductive part 141 and the second conductive part 142 may be suitably adjusted according to needs. While the gap between the first conductive part 141 and the second conductive part 142 may be equal to or smaller than the gap between the first electrode 80 and the second electrode 70 as in FIG. 45*a*, they can also be arranged further apart.

As the encapsulants 180, 170, 190 are formed in a compact manner within a semiconductor light emitting chip, a semiconductor light emitting device thus obtained will not be unnecessarily bulky overall, and can be formed in a chip scale package. Such a semiconductor light emitting device can be mounted on the submount, forming an SMD type device. During this mounting process, the semiconductor light emitting device can be bonded to an external electrode of the submount without an adhesive or bonding agent (e.g., eutectic bonding), or using an adhesive such as a solder or conductive paste. Advantageously, the conductive parts 141, 142 not only increase a bonding area, thereby facilitating the bonding process, but they also increase the bonding strength and the heat protection area.

Figure 46:
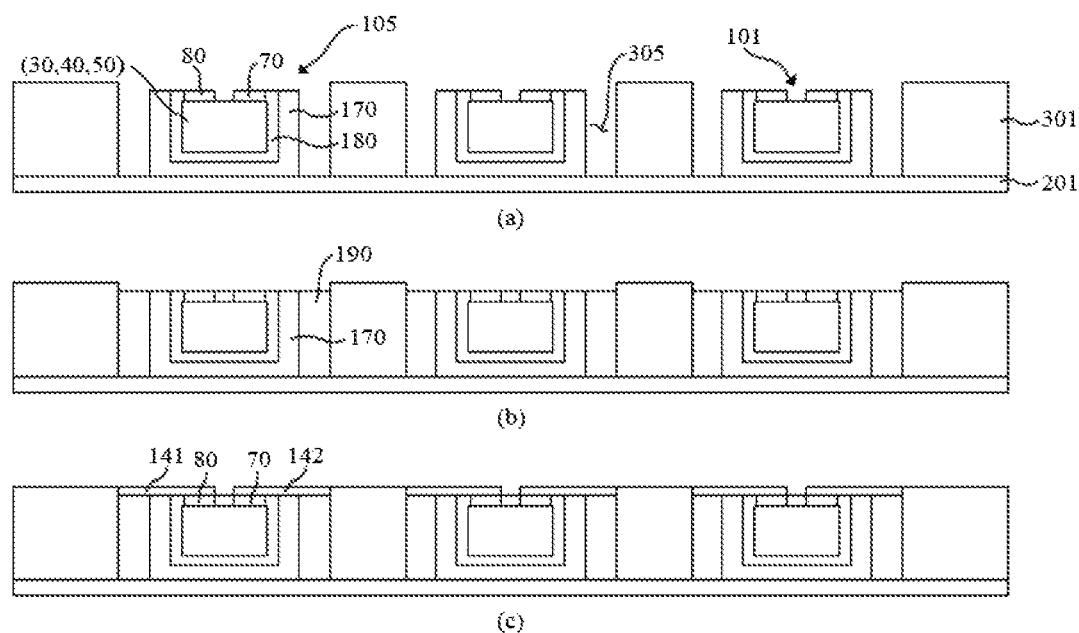
FIG. 46 is a schematic illustration for describing another exemplary embodiment of a method for manufacturing a semiconductor light emitting device according to the present disclosure.

FIG. 46 is a schematic illustration for describing another exemplary embodiment of a method for manufacturing a semiconductor light emitting device according to the present disclosure. Here, each semiconductor light emitting part 105 includes a semiconductor light emitting chip 105, a first encapsulant 180 and a second encapsulant 170. The first encapsulant 180 contains a phosphor, and surrounds the semiconductor light emitting chip in such a manner to expose electrodes 80, 70 thereof. The second encapsulant 170 may be made of a transparent silicon, and surrounds the first encapsulant 180 in such a manner to expose the electrodes 80, 70. After placing this semiconductor light emitting part 105 on an exposed portion of a base 201 through an opening 305, a third encapsulant 190, the first conductive part 141 and the second conductive part 142 are then formed. These processes can be done following the ones described in the embodiments of FIG. 44 and FIG. 45.

FIG. 47 is a schematic illustration for describing further exemplary embodiments of a semiconductor light emitting device according to the present disclosure. Here, semiconductor light emitting devices can be obtained by those methods for manufacturing a semiconductor light emitting device described in FIG. 44 to FIG. 46. FIG. 47*a* shows an embodiment where the device illustrated in FIG. 36 has been used for a semiconductor light emitting part 105; FIG. 47*b* shows an embodiment where the device illustrated in FIG. 42 has been used for a semiconductor light emitting part 105; FIG. 47*c* shows an embodiment where a second encapsulant 170 has been eliminated, and a first encapsulant 180 surrounds a semiconductor light emitting chip 101; and FIG. 47*d* shows an embodiment where, after the conductive parts 141, 142 illustrated in FIG. 46*c* are formed, a base 201 and a dam 301 are separated to produce a semiconductor light emitting device.

Figure 48:
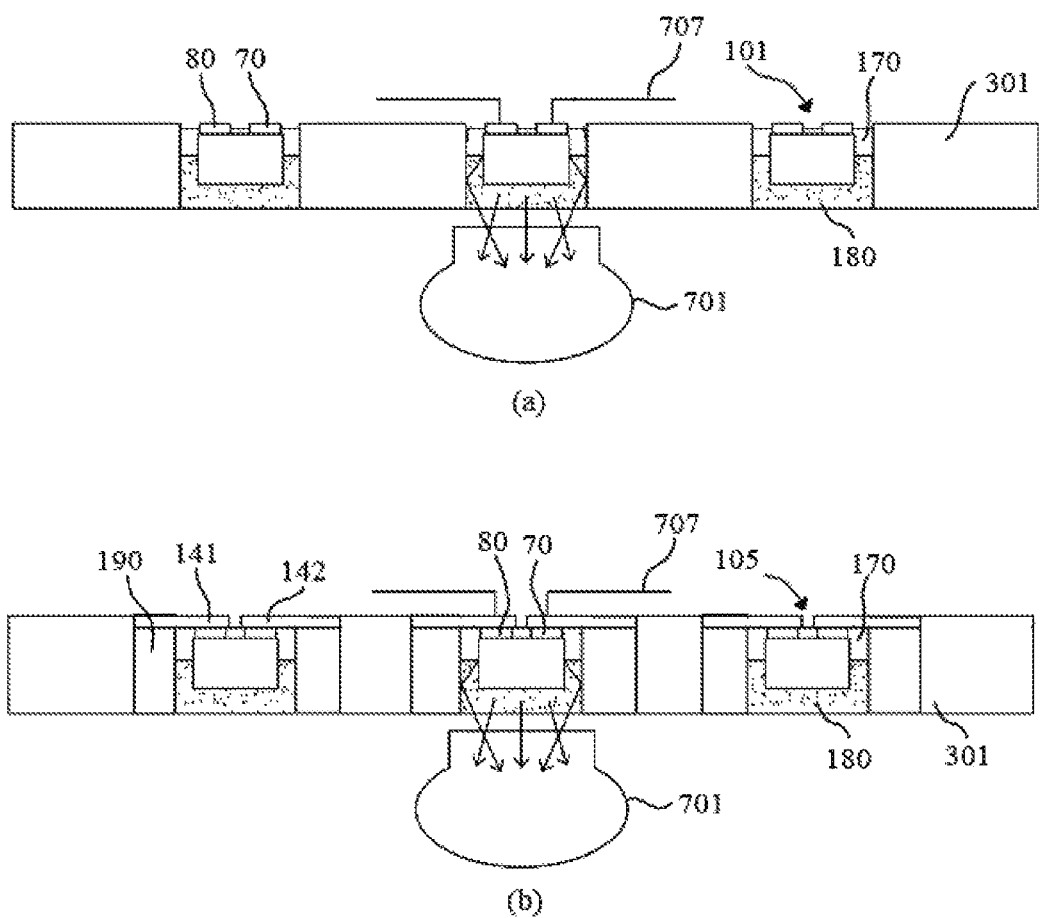
FIG. 48 and FIG. 49 are schematic illustrations showing exemplary embodiments of a method for testing a semiconductor light emitting device according to the present disclosure.
Figure 49:
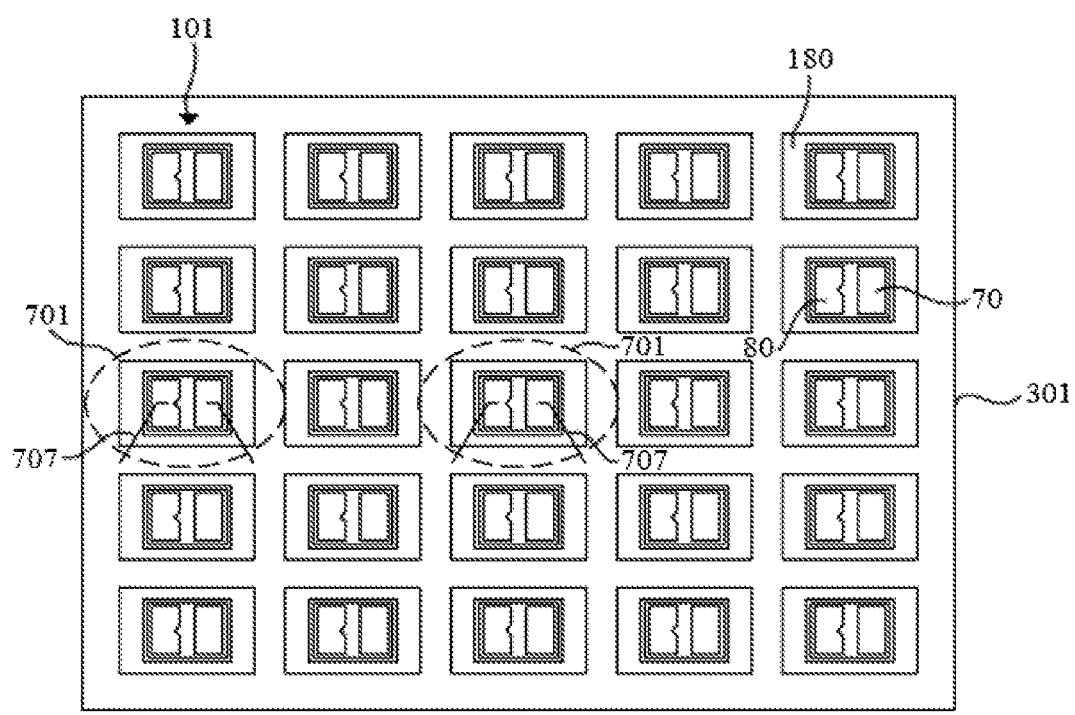

FIG. 48 and FIG. 49 are schematic illustrations showing exemplary embodiments of a method for testing a semiconductor light emitting device according to the present disclosure. In this semiconductor light emitting device testing method, an assembly of a mask 301 having a plurality of openings 305, a semiconductor light emitting chip 101 with electrodes 80, 70 and being placed in each of the openings 305, and an encapsulant 170 which is formed over each opening 305 and encompasses a semiconductor light emitting chip 101 in such a manner to expose the electrodes 80, 70 is prepared, as shown in FIG. 16*a*. Next, optical measuring equipment 701 is placed on the opposite side of the electrodes 80, 70, where the optical measuring equipment receives light from the semiconductor light emitting chip 101. A current is then applied, through a probe 707, to the electrodes 80, 70 of a selected semiconductor light emitting chip 101 and properties of light from the semiconductor light emitting chip 101 are measured by the optical measuring equipment 701. Any of those semiconductor light emitting devices described in FIG. 35 to FIG. 43 can be taken as a semiconductor light emitting device for testing. Upon removal of the base 201 as in FIG. 35*c* and FIG. 41*c*, an assembly of the dam 301 and the semiconductor light emitting device thus obtained undergoes measurement of light by optical measuring equipment 701 disposed around the assembly.

FIG. 48*b* shows another embodiment of testing, where a dam 301, a first encapsulant 180, a third encapsulant 190, a semiconductor light emitting chip 101 and conductive parts 141, 142 form an assembly together, and for testing, a current is applied to the conductive parts 141, 142 which are electrically conductive with electrodes 80, 70 of the semiconductor light emitting chip 101. Any of those semiconductor light emitting devices described in FIG. 44 to FIG. 47 can be taken as a semiconductor light emitting device for testing. Upon removal of the base 201 as in FIG. 44c and FIG. 46c, an assembly of the dam 301 and the semiconductor light emitting device thus obtained undergoes measurement of light by optical measuring equipment 701 disposed around the assembly.

For highly accurate optical measurement of a semiconductor light emitting device, it is desirable to receive as much light as possible from the semiconductor light emitting device, and measure properties of the received light in absence of interference from the surroundings thereof. In the embodiments shown in FIG. 48, when the optical measurement is carried out, the dam 301 around the first encapsulant 180 reflects a portion of light from the semiconductor light emitting chip 101 towards the optical measuring equipment 701, and the dam 301 blocks the light from entering the encapsulant 170 (a second encapsulant) adjacent to it. Further, when the second encapsulant 170 provided is made of a high-reflectance material, it keeps light from leaking towards the electrodes 80, 70, meaning that no additional optical measuring equipment 705 is required on the side of the electrodes 80, 70. Therefore, it is not even necessary to put a semiconductor light emitting device to the test inside the optical measuring equipment 701, to confirm a substantially reduced light leakage. Moreover, the optical measuring equipment is capable of making optical measurements not only in absence of phosphorus interference from the surroundings thereof, but also with high precision nearly comparable to that of the optical measuring equipment 701 performing optical measurement on an individual semiconductor light emitting device that is put completely within the optical measuring equipment. In addition, to facilitate faster testing, either the optical measuring equipment 701 or the assembly may be shifted.

An example of the optical measuring equipment 701 may include an integrating sphere. For instance, the integrating sphere is a spherical device having a hollow space inside, which measures properties of light having entered the hollow space. In one example, an optical property measuring equipment may be installed in the integrating sphere. The optical property measuring equipment is capable of measuring the luminance, wavelength, intensity, illuminance, spectral distribution, color temperature, color coordinates and so on of light from a semiconductor light emitting device, and the measurement(s) of at least one of these can be used as a basis for obtaining optical properties of the semiconductor light emitting device. Examples of the optical property measuring equipment include a spectrometer and a photo detector.

Although FIG. 48 shows an embodiment of making measurements with the base 201 being removed, if the base 201 is transparent or made of a material having superior light transmission properties, optical measurements can be made while keeping the base 201 as is.

Referring now to FIG. 49, according to a method for testing a semiconductor light emitting device of this embodiment, an optical measurement test can resolve conventional errors that are generally made while testing a semiconductor light emitting device inside the dam 301 and a semiconductor light emitting device on the corner thereof. For example, a test may be performed on each of a plurality of semiconductor light emitting devices being attached to a tape without a dam 301 and collectively enclosed by an encapsulant. Here, in an array of a plurality of semiconductor light emitting devices, lightly is generally uniformly scattered around those semiconductor light emitting devices located at the inner side of the tape. Meanwhile, light is scattered differently around those semiconductor light emitting devices on the corners of the tape, depending on whether there is a neighboring semiconductor light emitting device, and therefore, light measurements obtained from the inner side of the tape are different from light measurements obtained from the corners of the tape. However, if the semiconductor light emitting devices from the inner side of the tape as well as the semiconductor light emitting devices from the corners of the tape are placed individually in an integrating sphere and tested, substantially equal light measurements are obtained.

According to the semiconductor light emitting device testing method in this embodiment, a dam 301 surrounding each semiconductor light emitting device can serve as a reflector. As such, conditions stay the same at the inner side and on the corners, thereby allowing the optical measurements to be performed with higher accuracy and precision. Optionally, the dam 301 may be made of a metallic material or coated with a high-reflectance material, so as to get a reflector with better performance.

Figure 50:
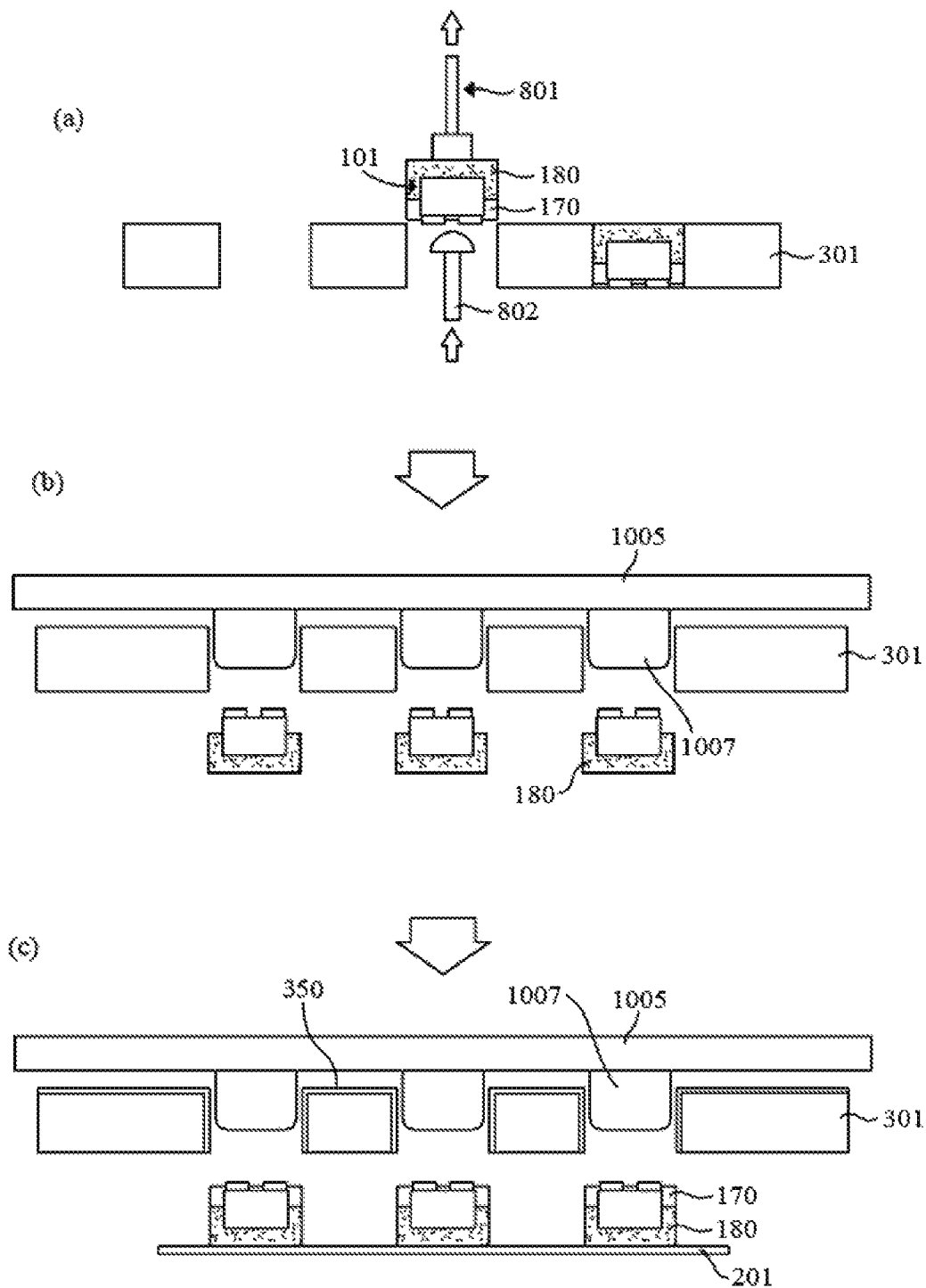
FIG. 50 is a schematic illustration for describing exemplary methods for separating semiconductor light emitting devices from the base and dam.

FIG. 50 is a schematic illustration for describing exemplary methods for separating semiconductor light emitting devices from the base and dam. This can be applied to any of the semiconductor light emitting devices and their manufacturing methods described in FIG. 35 to FIG. 47.

For example, referring to FIG. 50a, once encapsulants 180, 170 are cured, a semiconductor light emitting device including the encapsulants 180, 170 and a semiconductor light emitting chip 101 is separated from a base 201. Later, using a sorter or other similar equipment, the bottom of a semiconductor light emitting device of interest is hit by a pin 802 or rod (bar), and the semiconductor light emitting device is pushed off a dam 301. This semiconductor light emitting device is then picked up using vacuum suction techniques or by electric clamping means 801, and carried. If a testing process is performed first as described in FIG. 44 and FIG. 45, semiconductor light emitting devices can be taken out and then sorted at the same time, based on the testing results.

Referring to FIG. 50b, each semiconductor light emitting device can be taken out from the dam 301 using an embossed plate 1005. The embossed plate 1005 has bumps 1007 in positions corresponding to the openings 305, respectively. A plurality of semiconductor light emitting devices can be pushed out at once by these bumps 1007, or a tape may be applied to the opposite side of the embossed plate 1005 beforehand to do the same. The bump 1007 has suitable faces adapted to protect a semiconductor light emitting device from damage.

Referring to FIG. 50c, due to a certain level of adhesion present between the dam 301 and the encapsulant 170, if an excessively strong force is applied for taking out the device, a semiconductor light emitting device thus obtained would have been damaged. Therefore, a dam 301 having a bonding strength control film and the previously described embossed plate 1005 are used to allow a semiconductor light emitting chip to be taken out from the dam 301 without damage. Examples of the bonding strength control film includes a layer formed across the surface of the dam 301, layers formed on the surface at (ir)regular intervals, or simply bonding strength control material particles adhered on the surface of the dam 301. For example, the bonding strength control film 350 is a release coating layer 350 formed on the surface of the dam 301. The release coating layer 350 can be obtained by spraying or by painting. This release coating layer may be applied onto the dam 301 before the dam is placed on the base 201. Optionally, the dam 301 is first placed on the base 201 and then a release coating layer can be formed on the dam 301. In this case, the release coating layer is applied onto the top face of the dam 301 as well as the top face of the base 201. The dam 301 can be made of a material such as plastic, a metal or the like, and the encapsulant 170 can be made of a material such as those mentioned above. Therefore, the release coating layer is preferably made of a material which exhibits releasing or lubricant properties as a resin or silicon is bonded to a metal or plastic, and which has heat resistance and electrical insulating properties. A suitable releasing material can be selected from commercially available products. The releasing material is applied by spraying for example, and may be available in aerosol form. As shown in FIG. 49a, a semiconductor light emitting device and the base 201 are taken out in an assembled state.

Referring again to FIG. 6, in the case of sawing the encapsulant 17, those cut faces of the encapsulant 170 cut with a cutter 31 have a lower light extraction efficiency as they were cut and sectioned with the cutter 31. Moreover, if semiconductor light emitting chips 101 are out of alignment even slightly on a tape (see 13 in FIG. 3), the cutting process using the cutter 31 may cause a number of defects in a semiconductor light emitting device obtained.

In the embodiment shown in FIG. 50c, however, the presence of the bonding strength control film or release coating layer 350 allows the encapsulant 170 to be easily taken out from the dam 301 without damage. This is because the surface of the encapsulant 170 is not cut or sectioned with a cutter during the sawing process, and therefore, it does not experience a decrease in the light extraction efficiency. In addition, with the dam 301 serving as a guide for aligning semiconductor light emitting chips 101, the alignment accuracy is increased, which is led to reduced detects caused by inaccurate alignment.

Figure 51:
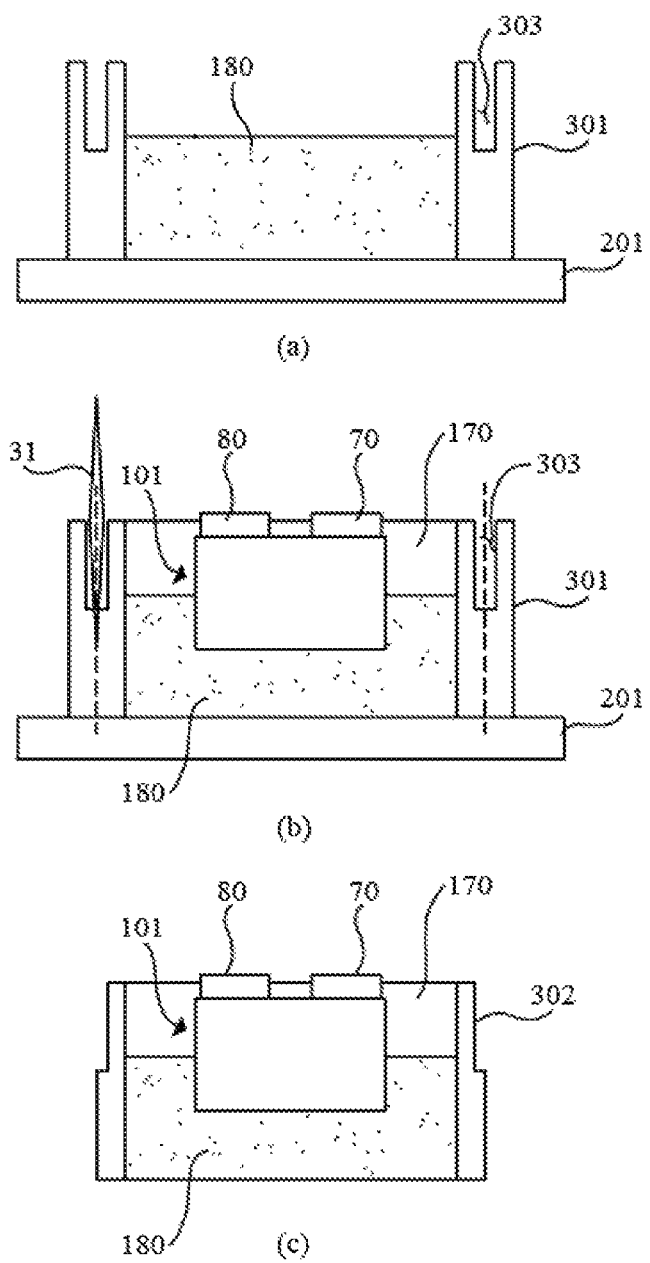
FIG. 51 is a schematic illustration for describing a semiconductor light emitting device and another exemplary embodiment of a method for manufacturing the same according to the present disclosure.

FIG. 51 is a schematic illustration for describing a semiconductor light emitting device and another exemplary embodiment of a method for manufacturing the same according to the present disclosure. Firstly, as shown in FIG. 51a, a dam 301 having an opening 305 is provided on either side of a base 201. Each dam 301 has a cutting groove 303 around the opening 305. Preferably, the cutting groove 303 is formed to a certain depth from the top face of the dam 301, and surround the opening 305. The cutting groove 303 in the dam 301 may be formed using a mold with a corresponding groove, or by extrusion molding. Further, as shown in FIG. 51b, a first encapsulant 180 is supplied to an exposed portion of the base 201 through the opening 305, and soft cured. After that, a semiconductor light emitting chip 101 is placed on the first encapsulant 180 in such a manner that electrodes 80, 70 of the chip face upwards. A second encapsulant 170 is formed between the dam 301 and the semiconductor light emitting chip 101.

Next, the dam 301 is cut along (the shape) of the cutting groove 303. This cutting process can be accomplished by various techniques, including: breaking the dam 301 along the cutting groove 303; putting a cutter 31 inside the cutting groove 303 and then cutting the dam 301 along the groove; or cutting a portion of the dam corresponding to the cutting groove 303 or scribing with a cutter 31 or other scribing equipment and then breaking the rest of the dam 301. In the case of cutting over full height or width of the dam 301 from bottom to top, the cutting process is often under stress by an external force such that there is a risk of producing a defective semiconductor light emitting device. However, the presence of cutting grooves as in this embodiment reduces stress and therefore, a resulting semiconductor light emitting device is substantially less damaged or destroyed. In addition, an amount of breaking time is shortened. As a result, the efficiency of the cutting process is improved, and defects in a semiconductor light emitting device thus obtained are reduced.

Further, the base 201 is removed to produce an individual, separated semiconductor light emitting device including the semiconductor light emitting chip 101, the encapsulants 180, 170 and bonded parts 302 (cut dams), as shown in FIG. 51c.

Figure 52:
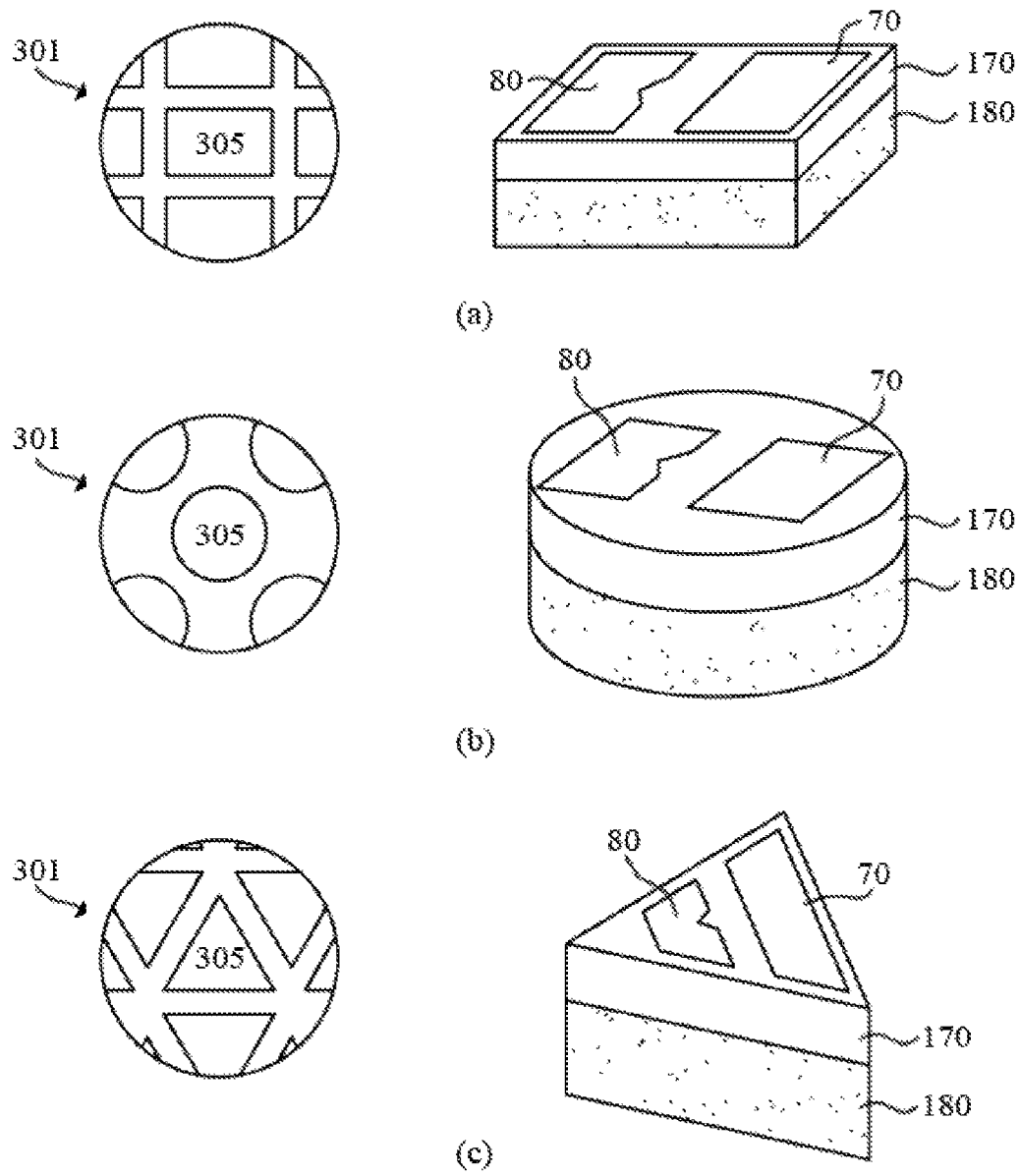
FIG. 52 is a schematic illustration for describing a semiconductor light emitting device and further exemplary embodiments of a method for manufacturing the same according to the present disclosure.

FIG. 52 is a schematic illustration for describing a semiconductor light emitting device and further exemplary embodiments of a method for manufacturing the same according to the present disclosure. A semiconductor light emitting device obtained has a matching shape with an opening 305 formed in a dam 301. The opening 305 in the dam 301, if seen in a plan view, may have a polygonal shape, such as, a quadrangular shape (see FIG. 52a) or a triangular shape (see FIG. 52c), or may be transformed into a circular shape (see FIG. 52b) or an oval shape. Also, the encapsulant 180, 170 if seen in a plan view may have a polygonal shape, such as, a quadrangular shape or a triangular shape, or may have a non-polygonal shape, such as, a circular shape or an oval shape. The shape of the encapsulant 180, 170 can affect an amount and direction of light emitted from a semiconductor light emitting device.

Figure 53:
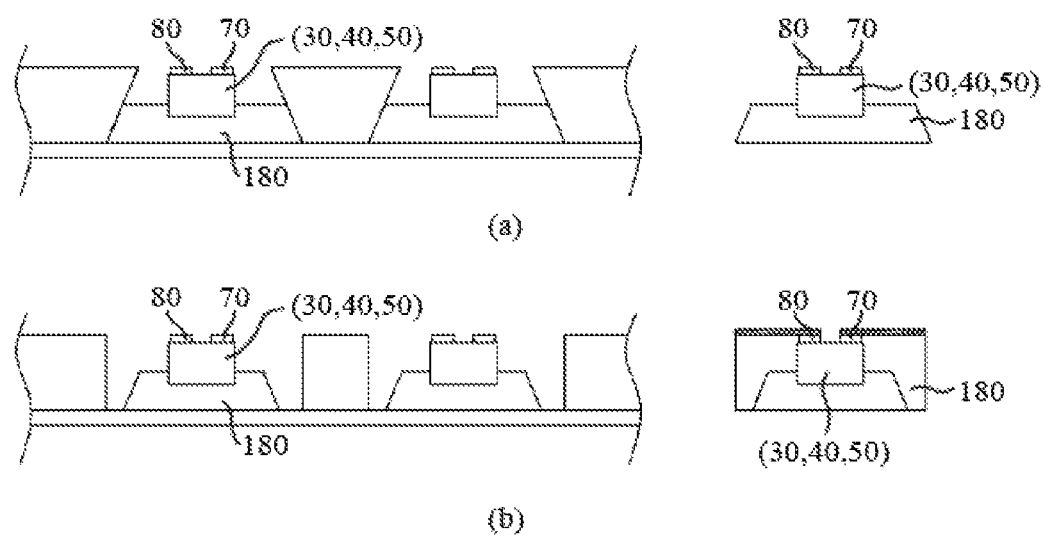
FIG. 53 is a schematic illustration for describing a semiconductor light emitting device and another exemplary embodiment of a method for manufacturing the same according to the present disclosure.

FIG. 53 is a schematic illustration for describing a semiconductor light emitting device and another exemplary embodiment of a method for manufacturing the same according to the present disclosure. Here, an opening 305 in a dam 301, if seen in a sectional view, may have a shape with slanted sides or a trapezoid shape, or may have a concave or convex curved side. Accordingly, an encapsulant 180 may also have a trapezoidal cross section, or a concave or convex curved side.

The following will now describe various embodiments of the present disclosure.

(1) A method for manufacturing a semiconductor light emitting device, characterized by including the steps of: providing a mask having a plurality of openings on a base; placing semiconductor light emitting chips on exposed portions of the base through the openings, respectively, by a device carrier which recognizes a shape of the mask and calibrates position for a semiconductor light emitting chip to be seated; and supplying an encapsulant to each of the openings, with the mask serving as a dam.

As an alternative to the previous embodiments, the mask can be formed (plated) on the base. In this case, the base is not a frame, but may include a plurality of rings having an opening, respectively, spaced apart from each other in form of islands.

(2) The method for manufacturing a semiconductor light emitting device of (1), characterized by including a step of arranging a plurality of semiconductor light emitting chips on a fixing layer using sorting equipment, wherein picking up each semiconductor light emitting chip on the fixing layer and placing a semiconductor light emitting chip of interest on the base is accomplished by recognizing a vacant position of a semiconductor light emitting chip on the fixing layer, picking up a next semiconductor light emitting chip, and calibrating an angle of a semiconductor light emitting chip turned at an angle based on the shape of the mask recognized by the device carrier and then placing the semiconductor light emitting chip on the base.

(3) The method for manufacturing a semiconductor light emitting device of (1), characterized in that, in the step of placing semiconductor light emitting chips, the device carrier distinguishes light reflected from the mask from light reflected from the base, and places a semiconductor light emitting chip at a position on the base corresponding to a designated distance away from at least one of the face, edge and point of the mask through an opening recognized.

(4) The method for manufacturing a semiconductor light emitting device of (1), characterized in that, in the step of placing semiconductor light emitting chips on the base, each of the semiconductor light emitting chips is a flip chip having two electrodes and placed in such a manner that the two electrodes would face the base.

(5) The method for manufacturing a semiconductor light emitting device of (1), characterized in that the semiconductor light emitting chip includes: a plurality of semiconductor layers composed of a first semiconductor layer having a first conductivity type, a second semiconductor layer having a second conductivity type different from the first conductivity type, and an active layer interpositioned between the first semiconductor layer and the second semiconductor layer, for generating light by electron-hole recombination; a first electrode being in electrical communication with the first semiconductor layer and supplying electrons or holes to the first semiconductor layer; and a second electrode being in electrical communication with the second semiconductor layer and supplying electrons or holes, whichever are not supplied to the first semiconductor layer, to the second semiconductor layer, wherein the method includes a step of: prior to the step of placing semiconductor light emitting chips on the base, coating a phosphor layer on the surface of each semiconductor light emitting layer to expose the first and second electrodes.

(6) The method for manufacturing a semiconductor light emitting device of (1), characterized in that the step of providing a mask on a base includes a process of pressing the base and the mask by pressing equipment to bring them into contact with each other, without applying an adhesive between the base and the mask.

(7) The method for manufacturing a semiconductor light emitting device of (1), characterized by including the steps of: after the step of supplying an encapsulant, separating an assembly of the mask, the encapsulant and the semiconductor light emitting chip from the base; and taking out an assembly of the semiconductor light emitting chip and the encapsulant from the mask.

(8) The method for manufacturing a semiconductor light emitting device of (1), characterized in that the base includes a plurality of conductive parts, and an insulating part interpositioned between the plurality of conductive parts, the plurality of conductive parts having a plate shape with exposed top and bottom faces, wherein, in the step of placing semiconductor light emitting chips, the device carrier places a semiconductor light emitting chip at a position on the base corresponding to a designated distance away from an edge of the mask through an opening recognized, given that two electrodes of a light emitting chip are respectively placed on different conductive parts from each other.

(9) The method for manufacturing a semiconductor light emitting device of (1), characterized by including a step of: testing each semiconductor light emitting chip in an assembled state with the mask and the encapsulant, using optical measuring equipment, wherein the testing step includes a process of reflecting, in the mask, light from each semiconductor light emitting chip towards the optical measuring equipment.

(10) The method for manufacturing a semiconductor light emitting device of (1), characterized by including a step of: prior to the step of supplying an encapsulant, forming a release coating layer on the surface of the mask.

(11) A method for manufacturing a semiconductor light emitting device, characterized by including the steps of: providing a mask having a plurality of openings on a base, and placing semiconductor light emitting chips on exposed portions of the base through the openings, respectively, wherein the mask has a bonding strength control film on the surface to allow a semiconductor light emitting chip to be taken out from the mask without damage; supplying an encapsulant to each of the openings in such a manner that the semiconductor light emitting chips are covered and the encapsulant abuts the bonding strength control film; and taking out an assembly of the encapsulant and the semiconductor light emitting chip from the mask.

As an alternative to the previous embodiments, the mask can be formed (plated) on the base. In this case, the base is not a frame, but may include a plurality of rings having an opening, respectively, spaced apart from each other in form of islands.

(12) The method for manufacturing a semiconductor light emitting device of (11), characterized in that the bonding strength control film is a release coating layer formed on the surface of the mask.

(13) The method for manufacturing a semiconductor light emitting device of (11), characterized by including a step of: after the step of supplying an encapsulant and prior to the step of taking out, separating an assembly of the mask, the encapsulant and the semiconductor light emitting chip from the base.

(14) The method for manufacturing a semiconductor light emitting device of (11), characterized in that the base includes a plurality of conductive parts, and an insulating part interpositioned between the plurality of conductive parts, each of the conductive parts having exposed top and bottom faces, the plurality of conductive parts and the insulating part having a plate shape, wherein each of the semiconductor light emitting chips is a flip chip having two electrodes bonded to different conductive parts, respectively, and wherein in the step of taking out, an assembly of the base, the encapsulant and the semiconductor light emitting chip is taken out from the mask.

(15) The method for manufacturing a semiconductor light emitting device of (11), characterized in that in the step of providing a mask and semiconductor light emitting chips on a base, each of the semiconductor light emitting chips is a flip chip and placed in such a manner that the two electrodes are arranged to face the base and thus, not covered with the encapsulant.

(16) The method for manufacturing a semiconductor light emitting device of (11), characterized by including a step of: prior to the step of providing a mask and semiconductor light emitting chips on a base, forming a phosphor layer on the surface of the semiconductor light emitting chip.

(17) The method for manufacturing a semiconductor light emitting device of (11), characterized in that each opening, if seen on a top plan view of the mask, has a shape selected from a polygon, a circle and an oval, and a cross section of the mask seen through a corresponding opening has a shape selected from a vertical side, a slanted side and curved side.

(18) The method for manufacturing a semiconductor light emitting device of (11), characterized in that the step of providing a mask and semiconductor light emitting chips on a base includes the processes of: providing a mask on a base; and placing semiconductor light emitting chips on exposed portions of the base through the openings, respectively, by a device carrier which recognizes a shape of the mask and calibrates position and angle for a semiconductor light emitting chip to be seated.

(19) The method for manufacturing a semiconductor light emitting device of (11), characterized by including a step of: prior to the step of providing a mask and semiconductor light emitting chips on a base, forming a release coating layer on the surface of the mask as a bonding strength control film, wherein in the process of providing a mask on the base, the base and the mask are pressed by pressing equipment and come in contact with each other, instead of applying an adhesive between the base and the mask, and wherein the step of taking out semiconductor light emitting chips from the mask includes the processes of: separating an assembly of the mask, the encapsulant and the semiconductor light emitting chip from the base; and applying an external force to the encapsulant and the semiconductor light emitting chip to be taken out, by a plate having an embossing pattern corresponding to each opening in the mask.

(20) The method for manufacturing a semiconductor light emitting device of (11), characterized by including a step of: prior to the step of providing a mask and semiconductor light emitting chips on a base, forming a release coating layer on the surface of the mask as a bonding strength control film, wherein the step of taking out the semiconductor light emitting chip from the mask includes the processes of: applying an external force to a semiconductor light emitting device by a pin to separate the device from the mask; and on the moment of separation, picking up the semiconductor light emitting device and sorting.

(21) A method for testing a semiconductor light emitting device, characterized by including the steps of: preparing an assembly of a mask having a plurality of openings, semiconductor light emitting chips, each chip having an electrode and being placed in a corresponding opening, and an encapsulant supplied to each of the openings and arranged to encompass the semiconductor light emitting chip in such a manner to expose the electrode; placing optical measuring equipment on the opposite side of the electrode, where the optical measuring equipment receives light from the semiconductor light emitting chip; and measuring the light from a semiconductor light emitting chip using the optical measuring equipment, wherein the mask around the semiconductor light emitting chip reflects a portion of the light from a semiconductor light emitting chip towards the optical measuring equipment, and blocks the light from entering a neighboring encapsulant, thereby measuring the light from a semiconductor light emitting chip.

(22) The method for testing a semiconductor light emitting device of (21), characterized in that the optical measuring equipment includes an integrating sphere, and a semiconductor light emitting chip is subjected to measurements, without getting entered the integrating sphere.

(23) The method for testing a semiconductor light emitting device of (21), characterized in that in the measuring step, additional optical measuring equipment is placed on the electrode side for measurements.

(24) The method for testing a semiconductor light emitting device of (21), characterized in that each of the semiconductor light emitting chips is a flip chip having two electrodes, and positioned in such a manner that the two electrodes are located on the opposite side of the optical measuring equipment.

(25) The method for testing a semiconductor light emitting device of (21), characterized in that mask includes one of a metal layer and a light reflective layer.

(26) The method for testing a semiconductor light emitting device of (21), characterized in that the mask has a height equal to or higher than height of the encapsulant.

(27) The method for testing a semiconductor light emitting device of (21), characterized in that the step of preparing an assembly includes the processes of: providing a mask having a plurality of openings on a base, in which the mask has a release coating layer on the surface to allow an encapsulant and a semiconductor light emitting chip to be taken out from the mask without damage; placing semiconductor light emitting chips on exposed portions of the base through the openings, respectively; and supplying an encapsulant to each of the openings to cover the semiconductor light emitting chips.

(28) The method for testing a semiconductor light emitting device of (21), characterized in that the base includes a plurality of conductive parts, and an insulating part interpositioned between the plurality of conductive parts, each of the conductive parts having exposed top and bottom faces, the plurality of conductive parts and the insulating part having a plate shape, wherein in the step of measuring the light from a semiconductor light emitting chip, a current is applied to the conductive parts while the base, the mask, the encapsulant and the semiconductor light emitting chip are in an assembled state so as to measure the light from each semiconductor light emitting chip, and the base reflects the light towards the optical measuring equipment.

(29) The method for testing a semiconductor light emitting device of (21), characterized by including a step of: after the step of measuring the light from a semiconductor light emitting chip, taking out a semiconductor light emitting chip and an encapsulant in an assembled state from the mask.

(30) The method for testing a semiconductor light emitting device of (21), characterized in that in the process of placing semiconductor light emitting chips on a base, the semiconductor light emitting chips are placed on exposed portions of the base through the openings, respectively, by a device carrier which recognizes a shape of the mask and calibrates position and angle for a semiconductor light emitting chip to be seated.

(31) A semiconductor light emitting device, characterized by including: a plurality of semiconductor layers; an encapsulant encompassing a semiconductor light emitting chip in such a manner that electrodes of the semiconductor light emitting chip are exposed, the electrodes being adapted to supply a current to the plurality of semiconductor layers; and a metal bonded part fixed to the encapsulant, at a certain distance from the semiconductor light emitting chip, the metal bonded part having a bottom face exposed in a direction where the electrode is exposed, wherein the exposed faces of the electrodes, the faces of the encapsulant around the electrodes, and the bottom faces of the metal bonded parts are all designed to form one surface together in line.

The present disclosure includes an embodiment using plastic bonded parts or non-metal bonded parts, instead of the metal bonded parts. If the submount or bonded face outside is made of a non-metal, a plastic bonded part or non-metal bonded part is preferably used for obtaining improved adhesion between the same kinds of materials.

(32) The semiconductor light emitting device of (31), characterized in that the semiconductor light emitting chip is a flip chip having two electrodes that are arranged on one side of the plurality of semiconductor layers and respectively exposed from the encapsulant.

(33) The semiconductor light emitting device of (31), characterized in that a distance to the exposed faces of the electrodes and a distance to the bottom face of the metal bonded parts, from the face of the encapsulant on the opposite side of the electrodes, are the same.

(34) The semiconductor light emitting device of (31), characterized in that the encapsulant includes a bottom face through which the electrodes are exposed; a top face opposite to the electrodes; and side faces for connecting the bottom and top faces, and the metal bonded part has a ring shape formed around the side face.

(35) The semiconductor light emitting device of (31), characterized in that the encapsulant includes a bottom face through which the electrodes are exposed; a top face opposite to the electrodes; and side faces for connecting the bottom and top faces, and the metal bonded parts include: a first metal part fixed to the side face of the encapsulant; and a second metal part fixed to the side face of the encapsulant, being spaced apart from the first metal part.

(36) The semiconductor light emitting device of (31), characterized in that the metal bonded part is thicker on the side of the electrodes than on the opposite side of the electrodes.

(37) The semiconductor light emitting device of (31), characterized in that the metal bonded part has a height lower than a height of the side face of the encapsulant, thereby exposing a portion of the side face of the encapsulant.

(38) The semiconductor light emitting device of (31), characterized by including: a plate bonded to the two electrodes and the bottom faces of the metal bonded parts, wherein the plate includes: a first conductive part bonded to one of the two electrodes of a semiconductor light emitting chip; a second conductive part bonded to the other of the two electrodes; and an insulating part interpositioned between the first conductive part and the second conductive part.

(39) The semiconductor light emitting device of (31), characterized in that the metal bonded part is bonded to a metal in the plate.

(40) The semiconductor light emitting device of (31), characterized in that the metal bonded part is bonded to the plate with an adhesive.

(41) A method for manufacturing a semiconductor light emitting chip, characterized by including the steps of: providing a dam having openings on a base and placing a semiconductor light emitting chip on an exposed portion of the base through the opening, the dam around the opening having a cutting groove; supplying an encapsulant to the opening, thereby covering the semiconductor light emitting chip; and cutting the dam along the cutting groove to obtain a separated semiconductor light emitting device including the semiconductor light emitting chip, the encapsulant and the cut dams.

(42) The method for manufacturing a semiconductor light emitting chip of (41), characterized in that in the step of providing a dam and a semiconductor light emitting chip on a base, the semiconductor light emitting chip is a flip chip having two electrodes, wherein the two electrodes of the semiconductor light emitting chip are arranged facing the base such that the two electrodes are not covered with the encapsulant.

(43) The method for manufacturing a semiconductor light emitting chip (41), characterized in that in the step of providing a dam and a semiconductor light emitting chip on a base, the dam has a plurality of openings, and a cutting groove is formed on the top face of the dam between openings.

(44) The method for manufacturing a semiconductor light emitting chip (41), characterized in that in the step of obtaining an individual, separated semiconductor light emitting device, a cutting operation performed along the cutting groove includes at least one of a process of sawing or scribing the dam and a process of breaking along the cutting groove.

(45) The method for manufacturing a semiconductor light emitting chip (41), characterized in that the step of obtaining an individual, separated semiconductor light emitting device includes the processes of: cutting the dam around the opening along the cutting groove; and separating a semiconductor light emitting device from the base.

(46) The method for manufacturing a semiconductor light emitting chip (41), characterized in that in the step of obtaining an individual, separated semiconductor light emitting device, when the dam around the opening is cut along the cutting groove, the base is cut together such that a semiconductor light emitting device thus obtained includes the semiconductor light emitting chip, the encapsulant, the cut dams and the cut base.

(47) The method for manufacturing a semiconductor light emitting chip (41), characterized in that the step of obtaining an individual, separated semiconductor light emitting device includes the processes of: separating an assembly of the semiconductor light emitting chip, the encapsulant and the dam; and for the assembly, cutting the dam around the opening along the cutting groove.

(48) The method for manufacturing a semiconductor light emitting chip (41), characterized by including a step of: prior to the step of providing a dam and a semiconductor light emitting chip on a base, forming a phosphor layer on the surface of the semiconductor light emitting chip.

(49) The method for manufacturing a semiconductor light emitting chip (41), characterized in that at least the surface of the dam is a metal.

(50) The method for manufacturing a semiconductor light emitting chip (41), characterized in that in the step of obtaining an individual, separated semiconductor light emitting device including the semiconductor light emitting chip, the encapsulant and the cut dams, bottom faces of the cut dams are exposed in a direction where two electrodes are exposed; and the exposed faces of the two electrodes, the faces of the encapsulant around the two electrodes, and the bottom faces of the cut dams are all designed to form one surface together in line such that the exposed faces of the two electrodes and the bottom faces of the cut dams abut outside together.

The present disclosure includes an embodiment using plastic bonded parts or non-metal bonded parts, instead of the metal bonded parts. If the submount or bonded face outside is made of a non-metal, a plastic bonded part or non-metal bonded part is preferably used for obtaining improved adhesion between the same kinds of materials.

(51) The method for manufacturing a semiconductor light emitting chip (41), characterized in that in the step of providing a dam and a semiconductor light emitting chip on a base, the semiconductor light emitting chip is a flip chip having two electrodes, wherein the two electrodes of the semiconductor light emitting chip are arranged facing the base such that the two electrodes are not covered with the encapsulant, and the base includes: a first conductive part bonded to one of the two electrodes of a semiconductor light emitting chip; a second conductive part bonded to the other of the two electrodes; and an insulating part interpositioned between the first conductive part and the second conductive part.

(52) The method for manufacturing a semiconductor light emitting chip (41), characterized in that the step of providing a dam and a semiconductor light emitting chip on a base includes the processes of: providing a dam on a base; and placing semiconductor light emitting chips on exposed portions of the base through the openings, respectively, by a device carrier which recognizes a shape of the dam and calibrates position and angle for a semiconductor light emitting chip to be seated.

(53) A method for manufacturing a semiconductor light emitting device, characterized by including the steps of: providing a dam having openings on a base and placing a first encapsulant on an exposed portion of the base through the opening; and placing a semiconductor light emitting chip on the first encapsulant in such a manner that at least one electrode of the semiconductor light emitting chip faces upwards, and a plurality of semiconductor layers of the semiconductor light emitting chip on the opposite side of the at least one electrode comes in contact with the first encapsulant, with the semiconductor light emitting chip including: a plurality of semiconductor layers composed of a first semiconductor layer having a first conductivity type, a second semiconductor layer having a second conductivity type different from the first conductivity type, and an active layer interpositioned between the first semiconductor layer and the second semiconductor layer, for generating light by electron-hole recombination; and at least one electrode supplying a current to the plurality of semiconductor layers.

(54) The method for manufacturing a semiconductor light emitting device of (53), characterized in that the semiconductor light emitting chip is a flip chip; the at least one electrode includes a first electrode arranged on one side of the plurality of semiconductor layers, the first electrode being in electrical communication with the first semiconductor layer, and a second electrode in electrical communication with the second semiconductor layer; and in the step of placing a semiconductor light emitting chip on the first encapsulant, the first electrode and the second electrode are exposed upwards on the opposite side of the first encapsulant with respect to the plurality of semiconductor layers.

(55) The method for manufacturing a semiconductor light emitting device of (53), characterized in that the first encapsulant contains a phosphor.

(56) The method for manufacturing a semiconductor light emitting device of (53), characterized by including a step of: between the step of forming a first encapsulant in an opening and the step of placing a semiconductor light emitting chip on the first encapsulant, soft curing the first encapsulant.

(57) The method for manufacturing a semiconductor light emitting device of (53), characterized in that in the step of placing a semiconductor light emitting chip on the first encapsulant, a part of the plurality of semiconductor layers is buried in the first encapsulant, and a part of the side faces of the plurality of the semiconductor layers is exposed.

(58) The method for manufacturing a semiconductor light emitting device of (53), characterized by including a step of: forming a second encapsulant between the dam and the exposed side faces of the plurality of semiconductor layers.

(59) The method for manufacturing a semiconductor light emitting device of (53), characterized in that the first encapsulant contains a phosphor, and the second encapsulant is made of at least one of opaque materials for reflecting light and materials with EMC (electro-magnetic compatibility).

(60) The method for manufacturing a semiconductor light emitting device of (53), characterized in that the step of forming a second encapsulant includes exposing the electrodes by removing a part of the second encapsulant.

(61) The method for manufacturing a semiconductor light emitting device of (53), characterized by including a step of separating a semiconductor light emitting device including a semiconductor light emitting chip and the first encapsulant from the base and dam.

(62) The method for manufacturing a semiconductor light emitting device of (53), characterized in that in the step of providing a dam having openings on a base, the dam has a plurality of openings for exposing the base, and the step of placing a semiconductor light emitting chip involves placing a semiconductor light emitting chip on the first encapsulant formed in each of the openings by a device carrier which recognizes a shape of the dam and calibrates position and angle for a semiconductor light emitting chip to be seated.

(63) A semiconductor light emitting device, characterized by including: a plurality of semiconductor layers composed of a first semiconductor layer having a first conductivity type, a second semiconductor layer having a second conductivity type different from the first conductivity type, and an active layer interpositioned between the first semiconductor layer and the second semiconductor layer, for generating light by electron-hole recombination; at least one electrode arranged on one side of the plurality of semiconductor layers, for supplying a current to the plurality of semiconductor layers; and a first encapsulant covering the plurality of semiconductor layers on the opposite side of the at least one electrode, so as to partially expose the side faces of the plurality of semiconductor layers between the side of the at least one electrode and the opposite side of the at least one electrode with respect to the plurality of semiconductor layers.

(64) The semiconductor light emitting device of (63), characterized in that the semiconductor light emitting chip is a flip chip which includes: the at least one electrode having a first electrode arranged on one side of the plurality of semiconductor layers, the first electrode being in electrical communication with the first semiconductor layer, and a second electrode in electrical communication with the second semiconductor layer; an insulating reflective layer formed between the plurality of semiconductor layers and the first and second electrodes, for reflecting light from the active layer; a first electrical connection passing through the insulating reflective layer to electrically connect the first semiconductor layer and the first electrode; and a second electrical connection passing through the insulating reflective layer to electrically connect the second semiconductor layer and the second electrode.

(65) The semiconductor light emitting device of (63), characterized by including a second encapsulant covering the exposed side faces of the plurality of semiconductor layers from the first encapsulant, the second encapsulant being different from the first encapsulant.

(66) The semiconductor light emitting device of (63), characterized in that the first encapsulant contains a phosphor, and the second encapsulant is made of at least one of opaque materials for reflecting light and materials with EMC (electro-magnetic compatibility).

(67) The semiconductor light emitting device of (63), characterized in that the second encapsulant covers the plurality of semiconductor layers on the side of the electrodes, and the first and second electrodes are exposed from the second encapsulant.

(68) A method for manufacturing a semiconductor light emitting device, characterized by including the steps of: providing a first dam having an opening on a first base; placing a semiconductor light emitting part on an exposed portion of the first base through the opening, the semiconductor light emitting part including a plurality of semiconductor layers composed of: a first semiconductor layer having a first conductivity type, a second semiconductor layer having a second conductivity type different from the first conductivity type, and an active layer interpositioned between the first semiconductor layer and the second semiconductor layer, for generating light by electron-hole recombination; at least one electrode arranged on one side of the plurality of semiconductor layers, for supplying a current to the plurality of semiconductor layers; and a first encapsulant covering the plurality of semiconductor layers on the opposite side of the at least one electrode, in such a manner that the first encapsulant and the first base face each other, and the at least one electrode faces upwards; forming a second encapsulant between the first dam and the semiconductor light emitting part; and forming at least one conductive part covering the at least one electrode and a part of the second encapsulant.

(69) The method for manufacturing a semiconductor light emitting device of (68), characterized in that the semiconductor light emitting part is a flip chip including a first electrode arranged on one side of the plurality of semiconductor layers, being in electrical communication with the first semiconductor layer, and a second electrode in electrical communication with the second semiconductor layer, wherein in the step of forming at least one conductive part includes forming a first conductive part covering the first electrode and a part of the second encapsulant, and forming a second conductive part covering the second electrode and another part of the second encapsulant.

(70) The method for manufacturing a semiconductor light emitting device of (68), characterized in that the first encapsulant contains a phosphor, and the second encapsulant is made of at least one of opaque materials for reflecting light and materials with EMC (electro-magnetic compatibility).

(71) The method for manufacturing a semiconductor light emitting device of (68), characterized by including a step of: prior to the step of forming at least one conductive part, removing a part of the second encapsulant to expose the first and second electrodes.

(72) The method for manufacturing a semiconductor light emitting device of (68), characterized by including a step of: after the step of forming at least one conductive part, separating a semiconductor light emitting device including the semiconductor light emitting part, the first encapsulant, the second encapsulant and the conductive part from the first base and the first dam.

(73) The method for manufacturing a semiconductor light emitting device of (68), characterized by including a step of: prior to the step of placing the semiconductor light emitting part on a first base, preparing a semiconductor light emitting part, wherein the step of preparing a semiconductor light emitting part includes the processes of: providing a second dam having an opening on a second base; placing the first encapsulant on an exposed portion of the second base through the opening; placing a semiconductor light emitting chip on the first encapsulant, the semiconductor light emitting chip including a plurality of semiconductor layers composed of: a first semiconductor layer having a first conductivity type, a second semiconductor layer having a second conductivity type different from the first conductivity type, and an active layer interpositioned between the first semiconductor layer and the second semiconductor layer, for generating light by electron-hole recombination; and an electrode for supplying a current to the plurality of semiconductor layers, in such a manner that the electrode faces upwards, and a part of the plurality of semiconductor layers is buried in the first encapsulant; and separating a light emitting part including the semiconductor light emitting chip and the first encapsulant from the second base and the second dam.

(74) The method for manufacturing a semiconductor light emitting device of (68), characterized in that in the step of placing a semiconductor light emitting chip on the first encapsulant, the side faces of the plurality of semiconductor layers are partially exposed; and in the step of forming a second encapsulant between the first dam and a semiconductor light emitting part, the second encapsulant comes in contact with the first encapsulant and with the exposed side faces of the plurality of semiconductor layers.

(75) The method for manufacturing a semiconductor light emitting device of (68), characterized in that in the process of placing a semiconductor light emitting chip on the first encapsulant, the first encapsulant covers the plurality of semiconductor layers on the opposite of the electrode as well as the side faces of the plurality of semiconductor layers; and in the step of forming a second encapsulant between the first dam and a semiconductor light emitting part, the second encapsulant comes in contact with the first encapsulant.

(76) The method for manufacturing a semiconductor light emitting device of (68), characterized in that in the process of placing a semiconductor light emitting chip on the first encapsulant, the side faces of the plurality of semiconductor layers are partially exposed; and in the step of preparing a semiconductor light emitting part includes a process of forming a third encapsulant between the second dam and the exposed side faces of the plurality of semiconductor layers.

(77) The method for manufacturing a semiconductor light emitting device of (68), characterized in that the first encapsulant contains a phosphor, and the second and third encapsulants are made of at least one of opaque materials for reflecting light and materials with EMC (electro-magnetic compatibility).

(78) The method for manufacturing a semiconductor light emitting device of (68), characterized by including a step of: prior to the step of placing the semiconductor light emitting part on the first base, preparing a semiconductor light emitting part, wherein the step of preparing a semiconductor light emitting chip includes the processes of: providing a second dam having an opening on a second base; placing a semiconductor light emitting chip on an exposed portion of the second base through the opening, the semiconductor light emitting chip including a plurality of semiconductor layers composed of: a first semiconductor layer having a first conductivity type, a second semiconductor layer having a second conductivity type different from the first conductivity type, and an active layer interpositioned between the first semiconductor layer and the second semiconductor layer, for generating light by electron-hole recombination; and an electrode for supplying a current to the plurality of semiconductor layers, in such a manner that the electrode comes in contact with the second base; and separating a light emitting part including the semiconductor light emitting chip and the first encapsulant from the second base and the second dam.

(79) A semiconductor light emitting device, characterized by including: a plurality of semiconductor layers composed of: a first semiconductor layer having a first conductivity type, a second semiconductor layer having a second conductivity type different from the first conductivity type, and an active layer interpositioned between the first semiconductor layer and the second semiconductor layer, for generating light by electron-hole recombination; and at least one electrode arranged on one side of the plurality of semiconductor layers, for supplying a current to the plurality of semiconductor layers; a first encapsulant encompassing the plurality of semiconductor layers in such a manner that the at least one electrode is exposed; a second encapsulant encompassing the first encapsulant in such a manner that the at least one electrode is exposed, and the first encapsulant is exposed towards the opposite side of the at least one electrode; and at least one conductive part formed on the at least one electrode, and on a part of the second encapsulant exposed towards the at least one electrode.

(80) The semiconductor light emitting device of (79), characterized in that the first encapsulant contains a phosphor, and the second encapsulant is made of at least one of opaque materials for reflecting light and materials with EMC (electro-magnetic compatibility).

(81) The semiconductor light emitting device of (79), characterized in that the semiconductor light emitting part is a flip chip including: a first electrode arranged on one side of the plurality of semiconductor layers, being in electrical communication with the first semiconductor layer; a second electrode in electrical communication with the second semiconductor layer; an insulating reflective layer formed between the plurality of semiconductor layers and the first and second electrodes, for reflecting light from the active layer; a first electrical connection passing through the insulating reflective layer to electrically connect the first semiconductor layer and the first electrode; and a second electrical connection passing through the insulating reflective layer to electrically connect the second semiconductor layer and the second electrode, wherein the conductive part includes: a first conductive part integrated with the first electrode and the second encapsulant; and a second conductive part integrated with the second electrode and the second encapsulant.

(82) The semiconductor light emitting device of (79), characterized in that the first encapsulant encompasses the plurality of semiconductor layers on the opposite side of the electrode as well as a part of the side faces of the plurality of semiconductor layers; and the semiconductor light emitting part further includes a third encapsulant covering the exposed side faces of the plurality of semiconductor layers from the first encapsulant, the third encapsulant being covered with the second encapsulant.

In a semiconductor light emitting device according to the present disclosure, a mask is used not only as a guide pattern of a device carrier for alignment of semiconductor light emitting chips, but also as a dam of an encapsulant, thereby improving the alignment accuracy of semiconductor light emitting chips.

Moreover, the occurrence of possible defects due to misalignment of the semiconductor light emitting chips is reduced during a division process (e.g., sawing or the like) into individual devices.

Unlike conventional approaches of filling in any vacancy on a tape where semiconductor light emitting chips are arrayed or compensating a skew angle of a semiconductor light emitting chip before arranging the mask 301 on the tape and supplying an encapsulant, the method according to this embodiment is efficient because the aforementioned additional process is not required.

Thanks to a release coating layer formed on the mask, the encapsulant is more easily taken out, thereby preventing a decrease in the optical extraction efficiency caused by cracks on the encapsulant.

A test of a semiconductor light emitting device can be done more accurately and faster since the mask serves to reflect light towards the optical measuring equipment.

In another semiconductor light emitting device and a manufacturing method thereof according to the present disclosure, metal bonded parts together with electrodes are bonded to outside, e.g., a submount, thereby improving adhesion between them. Hence, a reliable device is obtained.

A cutting groove formed in the dam or mask facilitates a breaking process or a cutting process suing a cutter and reduces time consumption. Moreover, during a breaking process, a crack follows the cutting groove, thereby aligning or guiding the cutter along with it. This contributes to a more precise cutting process, leading to an increased yield.

Still in another semiconductor light emitting device and a manufacturing method thereof according to the present disclosure, the first encapsulant containing a phosphor forms a thin layer on the surface of a semiconductor light emitting chip such that a semiconductor light emitting device thus obtained has a size substantially matching the outline of the encapsulant. Hence, it is possible to obtain a chip scale semiconductor light emitting device and/or light emitting package.

Further, it is possible to modify height of the first encapsulant formed in an opening, meaning that only a required amount of the encapsulant may be used without unnecessary consumption. Also, the first encapsulant is kept from entering the electrode(s). In addition, since the first encapsulant has a bonding strength, it is convenient to place a semiconductor light emitting chip on it.

A semiconductor light emitting device obtained by these manufacturing methods can provide a substantially chip sized semiconductor light emitting device and/or light emitting package because electrodes thereof are not protruded sideways and a semiconductor light emitting device thus obtained has a size substantially matching the outline of the metal bonded part or encapsulant.

What is claimed is:

1. A method for manufacturing a semiconductor light emitting device, the method comprising:
providing onto a base a dam with openings, and semiconductor light emitting chips lying on exposed portions of the base through the openings, with cutting grooves formed on the dam around the openings;
supplying an encapsulant to each of the openings to cover the semiconductor light emitting chip; and
obtaining an individual separated semiconductor light emitting device by cutting the dam around the openings, along the cutting grooves, and separating the semiconductor light emitting device from the base, with the separate semiconductor light emitting device comprising the semiconductor light emitting chip, the encapsulant and a cut dam portion.

2. The method according to claim 1, wherein providing onto a base a dam and semiconductor light emitting chips includes providing onto a base a dam with a plurality of openings formed therein and cutting grooves formed on a top face of the dam between the openings.

3. The method according to claim 1, wherein obtaining an individual separated semiconductor light emitting device comprises at least one of:
sawing or scribing the dam along the cutting grooves; and
breaking the dam along the cutting grooves.

4. The method according to claim 1, further comprising:
prior to providing onto a base a dam and semiconductor light emitting chips, forming a phosphor layer on a surface of the semiconductor light emitting chips.

5. The method according to claim 1, wherein at least the dam has a metal surface.

6. The method according to claim 1, wherein providing onto a base a dam and semiconductor light emitting chips comprises
placing the semiconductor light emitting chips on exposed portions of the base through the openings using a device carrier configured to recognize a shape of a mask and calibrate positions and angles of the semiconductor light emitting chips to be placed.

7. The method according to claim 1, wherein providing onto a base a dam and semiconductor light emitting chips includes arranging flip chips with two electrodes as the semiconductor light emitting chips in such a manner that the two electrodes face the base without being covered with the encapsulant.

8. The method according to claim 7, wherein obtaining an individual separated semiconductor light emitting device comprised of the semiconductor light emitting chip, the encapsulant and the cut dam portion includes arranging a bottom face of the cut dam portion in a direction where the two electrodes are exposed, and bonding exposed sides of the two electrodes as well as the bottom face of the cut dam portion, resulting in one surface connecting the exposed sides of the two electrodes, faces of the encapsulant around the two electrodes, and the bottom face of the cut dam portion together in a line.

9. A method for manufacturing a semiconductor light emitting device, the method comprising:
providing onto a base a dam with openings, and semiconductor light emitting chips lying on exposed portions of the base through the openings, with cutting grooves formed on the dam around the openings;
supplying an encapsulant to each of the openings to cover the semiconductor light emitting chip; and
obtaining an individual separated semiconductor light emitting device by separating from the base an assembly of the semiconductor light emitting chip, the encapsulant and the dam, and cutting, for the assembly, the dam around the openings, along the cutting grooves, with the separate semiconductor light emitting device comprising the semiconductor light emitting chip, the encapsulant and a cut dam portion.

* * * * *